United States Patent
Pichler et al.

(10) Patent No.: US 12,165,004 B2
(45) Date of Patent: Dec. 10, 2024

(54) QUANTUM COMPUTING FOR COMBINATORIAL OPTIMIZATION PROBLEMS USING PROGRAMMABLE ATOM ARRAYS

(71) Applicant: President and Fellows of Harvard College, Cambridge, MA (US)

(72) Inventors: Hannes Pichler, Cambridge, MA (US); Shengtao Wang, Somerville, MA (US); Leo Xiangyu Zhou, Somerville, MA (US); Soonwon Choi, El Cerrito, CA (US); Mikhail D. Lukin, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 770 days.

(21) Appl. No.: 17/270,741

(22) PCT Filed: Aug. 30, 2019

(86) PCT No.: PCT/US2019/049115
§ 371 (c)(1),
(2) Date: Feb. 23, 2021

(87) PCT Pub. No.: WO2020/047444
PCT Pub. Date: Mar. 5, 2020

(65) Prior Publication Data
US 2021/0279631 A1    Sep. 9, 2021

Related U.S. Application Data

(60) Provisional application No. 62/725,874, filed on Aug. 31, 2018.

(51) Int. Cl.
*G06N 10/00* (2022.01)
*G06E 1/00* (2006.01)
*G06N 10/40* (2022.01)

(52) U.S. Cl.
CPC ............... *G06N 10/00* (2019.01); *G06E 1/00* (2013.01); *G06N 10/40* (2022.01)

(58) Field of Classification Search
CPC ........ G06N 10/00; G06N 10/20; G06N 10/40; G06E 1/00; G06E 1/02; G06E 3/00; G06E 3/001
See application file for complete search history.

(56) References Cited

U.S. PATENT DOCUMENTS 3,872,470 A    3/1975 Hoerz et al.
4,479,199 A    10/1984 Friedlander et al.
(Continued)

FOREIGN PATENT DOCUMENTS

CN    106980178 A    7/2017
EP    1171968 B1    11/2002
(Continued)

OTHER PUBLICATIONS

C. Monroe and M. Lukin, Remapping the quantum frontier, Physics World 21 (08) 32, 2008 (Year: 2008).*
(Continued)

*Primary Examiner* — Emily E Larocque
(74) *Attorney, Agent, or Firm* — Alexander Akhiezer; Erik A. Huestis; Foley Hoag LLP

(57) ABSTRACT

Systems and methods relate to selectively arranging a plurality of qubits into a spatial structure to encode a quantum computing problem. Exemplary arrangement techniques can be applied to encode various quantum computing problems. The plurality of qubits can be driven according to various driving techniques into a final state. The final state can be measured to identify an exact or approximate solution to the quantum computing problem.

24 Claims, 39 Drawing Sheets

(56) References Cited

U.S. PATENT DOCUMENTS

| | | |
|---|---|---|
| 5,684,621 A | 11/1997 | Downing |
| 6,988,058 B1 | 1/2006 | Sherwin et al. |
| 11,380,455 B2 | 7/2022 | Keesling Contreras et al. |
| 11,710,579 B2 | 7/2023 | Keesling Contreras et al. |
| 12,051,520 B2 | 7/2024 | Keesling Contreras et al. |
| 2002/0089718 A1 | 7/2002 | Penninckx et al. |
| 2004/0000666 A1 | 1/2004 | Lidar et al. |
| 2004/0017833 A1 | 1/2004 | Cundiff et al. |
| 2004/0126114 A1 | 7/2004 | Liu et al. |
| 2006/0225165 A1 | 10/2006 | Maassen van den Brink et al. |
| 2007/0113012 A1 | 5/2007 | Cable et al. |
| 2008/0116449 A1 | 5/2008 | Macready et al. |
| 2008/0185576 A1 | 8/2008 | Hollenberg et al. |
| 2008/0237579 A1 | 10/2008 | Barker et al. |
| 2008/0313430 A1 | 12/2008 | Bunyk |
| 2009/0204877 A1 | 8/2009 | Betts |
| 2009/0299947 A1* | 12/2009 | Amin ............... B82Y 10/00 706/13 |
| 2011/0238607 A1 | 9/2011 | Coury et al. |
| 2014/0025926 A1 | 1/2014 | Yao et al. |
| 2014/0200689 A1 | 7/2014 | Utsunomiya et al. |
| 2014/0253987 A1 | 9/2014 | Christmas |
| 2015/0317558 A1 | 11/2015 | Adachi et al. |
| 2016/0064108 A1 | 3/2016 | Saffman et al. |
| 2016/0125311 A1 | 5/2016 | Fuechsle et al. |
| 2016/0328253 A1 | 11/2016 | Majumdar |
| 2017/0300817 A1 | 10/2017 | King et al. |
| 2018/0217629 A1 | 8/2018 | MacFaden |
| 2018/0218279 A1 | 8/2018 | Lechner et al. |
| 2018/0260731 A1* | 9/2018 | Zeng ............... G06F 15/76 |
| 2019/0266508 A1* | 8/2019 | Bunyk ............... G06F 11/0751 |
| 2020/0185120 A1 | 6/2020 | Keesling Contreras et al. |
| 2021/0279631 A1 | 9/2021 | Pichler et al. |
| 2021/0365827 A1 | 11/2021 | Monroe et al. |
| 2021/0383189 A1 | 12/2021 | Cong et al. |
| 2022/0060668 A1 | 2/2022 | Kim et al. |
| 2022/0197102 A1 | 6/2022 | Christen et al. |
| 2022/0293293 A1 | 9/2022 | Contreras et al. |
| 2022/0391743 A1 | 12/2022 | Wild et al. |
| 2023/0326623 A1 | 10/2023 | Keesling Contreras et al. |
| 2023/0400492 A1 | 12/2023 | Xu et al. |
| 2024/0029911 A1 | 1/2024 | Lukin et al. |
| 2024/0185113 A1 | 6/2024 | Cong et al. |

FOREIGN PATENT DOCUMENTS

| | | |
|---|---|---|
| EP | 3113084 A1 | 1/2017 |
| EP | 3438726 A1 | 2/2019 |
| GB | 0205011 A | 10/1923 |
| JP | 2007/233041 A | 9/2007 |
| JP | 2008/134450 A | 6/2008 |
| JP | 2008/158325 A | 7/2008 |
| JP | 2014-197733 A | 10/2014 |
| JP | 2017/078832 A | 4/2017 |
| WO | WO-2014/051886 A1 | 4/2014 |
| WO | WO-2019/014589 A1 | 1/2019 |
| WO | WO-2020/072981 A1 | 4/2020 |
| WO | WO-2020/172588 A1 | 8/2020 |
| WO | WO-2020/236574 A1 | 11/2020 |
| WO | WO-2021/007560 A1 | 1/2021 |
| WO | WO-2021/141918 A1 | 7/2021 |
| WO | WO-2022/132388 A2 | 6/2022 |
| WO | WO-2022/132389 A2 | 6/2022 |
| WO | WO-2022/174072 A1 | 8/2022 |
| WO | WO-2022/132388 A3 | 9/2022 |
| WO | WO-2022/132389 A3 | 9/2022 |
| WO | WO-2023/287503 A2 | 1/2023 |
| WO | WO-2023/287503 A3 | 1/2023 |
| WO | WO-2023/287503 A9 | 1/2023 |
| WO | WO-2023/080936 A2 | 5/2023 |
| WO | WO-2023/080936 A3 | 7/2023 |
| WO | WO-2023/132865 | 7/2023 |
| WO | WO-2023/132865 A2 | 7/2023 |
| WO | WO-2024/155291 A2 | 7/2024 |

OTHER PUBLICATIONS

Adachi et al., "Application of Quantum Annealing to Training of Deep Neural Networks," arXiv.org: 18 pages (2015).
Barredo et al., "An atom-by-atom assembler of defect-free arbitrary 2d atomic arrays," arXiv:1607.03042, Jul. 11, 2016, pp. 1-7.
Barredo et al., "An atom-by-atom assembler of defect-free arbitrary two-dimensional atomic arrays," Science, 354(6315): 1021-1023 (2016).
Barredo et al., "Synthetic three-dimensional atomic structures assembled atom by atom," Nature, 561: 79-82 (2018).
Baur et al., "Single-Photon Switch Based on Rydberg Blockade," Phys. Rev. Lett., 112: 073901 (2014).
Brion et al., "Quantum Computing with Collective Ensembles of Multilevel Systems," Phys. Rev. Lett., 99: 260501 (2007).
Browaeys et al., "Many-body physics with individually controlled Rydberg atoms," Nature Physics, 16: 132-142 (2020).
Bruzewicz et al., "Trapped-Ion Quantum Computing: Progress and Challenges," Applied Physics Reviews, 6(2): 021314 (2019).
Debnath et al., "Demonstration of a small programmable quantum computer with atomic qubits," Nature, 536(7614): 63-66 (2016).
Ebert et al., "Coherence and Rydberg Blockade of Atomic Ensemble Qubits," Phys. Rev. Lett., 115: 093601 (2015).
Endres et al., "Atom-by-atom assembly of defect-free one-dimensional cold atom arrays," Science, 354 (6315): 1024-1027 (2016).
Endres et al., "Cold Matter Assembled Atom-by-Atom," arXiv:1607.03044, Jul. 11, 2016, pp. 1-12.
Engstrom et al., "Calibration of spatial light modulators suffering from spatially varying phase response," Optics Express, 21(13): 16086-16103 (2013).
Extended European Search Report for EP Application No. EP 18831504 mailed Mar. 30, 2021.
Farhi et al., "Classification with Quantum Neural Networks on Near Term Processors," arXiv:1802.06002, 1-21 (2018).
Fienup., "Phase retrieval algorithms: a comparison," Applied Optics 21(15): 2758-2769 (1982).
Fowler et al., "Surface codes: Towards practical large-scale quantum computation," Phys. Rev. A, 86: 032324 (2012).
Gerchberg et al., "A Practical Algorithm for the Determination of Phase from Image and Diffraction Plane Pictures," Optik, 35(2): 237-246 (1972).
Gorniaczyk et al., "Single-Photon Transistor Mediated by Interstate Rydberg Interactions," Phys. Rev. Lett., 113: 053601 (2014).
Gunter et al., "Interaction Enhanced Imaging of Individual Rydberg Atoms in Dense Gases," Phys. Rev. Lett., 108: 013002 (2012).
Gunter et al., "Observing the Dynamics of Dipole-Mediated Energy Transport by Interaction-Enhanced Imaging," Science, 342(6161): 954-956 (2013).
Haegeman et al., "Order Parameter for Symmetry-Protected Phases in One Dimension," Phys. Rev. Lett., 109(5): 050402-1-5 (2012).
Haldane, "Nonlinear Field Theory of Large-Spin Heisenberg Antiferromagnets: Semiclassically Quantized Solitons of the One-Dimensional Easy-Axis Neel State," Phys. Rev. Lett., 50(15): 1153-1156 (1983).
International Search Report and Written Opinion for International Application No. PCT/US18/42080 dated Oct. 22, 2018.
International Search Report and Written Opinion for International Application No. PCT/US2019/054831 dated Feb. 6, 2020.
International Search Report and Written Opinion for International Application No. PCT/US2020/019309 dated Jul. 14, 2020.
International Search Report and Written Opinion for International Application No. PCT/US2020/033100 dated Sep. 2, 2020.
International Search Report and Written Opinion for International Application No. PCT/US2020/041709 dated Oct. 28, 2020.
International Search Report and Written Opinion for International Application No. PCT/US2021/012209 mailed May 3, 2021.
Isenhower et al., "Demonstration of a neutral atom controlled-NOT quantum gate," arXiv:0907.5552, Nov. 24, 2009, pp. 1-5.
Jahromi et al., "Topological spin liquids in the ruby lattice with anisotropic Kitaev interactions," Physical Review B, 94(12): (10 pages) (2016).

(56) References Cited

OTHER PUBLICATIONS

Jahromi et al., "Topological $Z_2$ RVB quantum spin liquid on the ruby lattice," Physical Review B, 101(11): (10 pages) (2020).
Jaksch et al., "The cold atom Hubbard toolbox," Arxiv, (30 pages) (2004).
Johnson et al., "Rabi Oscillations between Ground and Rydberg States with Dipole-Dipole Atomic Interactions," Physical Review Letters, 110(11): 113003-1-4 (2008).
Kaufman et al., "Hong-Ou-Mandel atom interferometry in tunnel-coupled optical tweezers," arXiv:1312.7182, Jun. 17, 2014, pp. 1-17.
Labuhn et al., "Tunable two-demensional arrays of single Rydberg atoms for realizing quantum Ising models," Nature, 534(7609): 667-670 (2016).
Leonardo et al., "Computer generation of optimal holograms for optical trap arrays," Optics Express, 15(4): 1913-1922 (2007).
Lester et al., "Rapid production of uniformly-filled arrays of neutral atoms," arXiv:1506.04419, Jun. 14, 2015, pp. 1-5.
Lu et al., "Aluminum nitride integrated photonics platform for the ultraviolet to visible spectrum," Optics Express, 26(9): 11147 (2018).
Ma et al., "Generation of three-dimensional optical structures by dynamic holograms displayed on a twisted nematic liquid crystal display," Applied Physics B Lasers and Optics, 110(4): 531-537 (2013).
Matsumoto et al., "High-quality generation of a multispot pattern using a spatial light modulator with adaptive feedback," Optics Letters, 37(15): 3135-3137 (2012).
Mazurenko, "Optical Imaging of Rydberg Atoms," Thesis (S.B.)—Massachusetts Institute of Technology, Dept. of Physics (2012).
Mehta et al., "Towards fast and scalable trapped-ion quantum logic with integrated photonics," Proc. SPIE 10933, Advances in Photonics of Quantum Computing, Memory, and Communication XII, 109330B (2019).
Murmann et al., "Two Fermions in a Double Well: Exploring a Fundamental Building Block of the Hubbard Model," arXiv:1410.8784, Feb. 17, 2015, pp. 1-12.
Negretti et al., "Quantum computing implementation with neutral particles," Arxiv, (19 pages) (2011).
Nogrette et al., "Single-Atom Trapping in Holographic 2D Arrays of Microtraps with Arbitrary Geometries," Physical Review X, 4: Article 021034 pp. 1-9 (2014).
Perez-Garcia et al., "PEPS as unique ground states of local Hamiltonians," Quant. Inf. Comp., 8: 0650 (2008).
Persson et al., "An algorithm for improved control of trap intensities in holographic optical tweezers," Proceedings of SPIE, 8458: 8 pages (2012).
Persson et al., "Minimizing intensity fluctuations in dynamic holographic optical tweezers by restricted phase change," Optics Express, 18(11): 11250-11263 (2010).
Persson et al., "Real-time generation of fully optimized holograms for optical trapping applications," Proceedings of SPIE, 8097: 10 pages (2011).
Persson et al., "Reducing the effect of pixel crosstalk in phase only spatial light modulators," Optics Express, 20(20): 22334-22343 (2012).
Persson., "Thesis for the Degree of Doctor of Philosophy: Advances in Holographic Optical Trapping," Department of Physics University o Gothenburg: 82 pages (2013).
Pichler et al., "Computational complexity of the Rydberg blockade in two dimensions," arXiv: 1809.04954 (2018).
Poland et al., "Development of a doubly weighted Gerchberg-Saxton algorithm for use in multibeam imaging applications," Optics Letters, 39(8): 2431-2434 (2014).
Pollmann et al., "Detection of symmetry-protected topological phases in one dimension," Phys. Rev. B, 86(12): 125441-1-13 (2012).
Prongue et al., "Optimized kinoform structures for highly efficient fan-out elements," Applied Optics, 31(26): 5706-5711 (1992).

Saffman et al., "Quantum information with Rydberg atoms," Rev. Mod. Phys., 82(3): 2313-2363 (2010).
Saffman et al., "Scaling the neutral-atom Rydberg gate quantum computer by collective encoding in holmium atoms," Phys. Rev. A, 78: 012336 (2008).
Shi, "Deutsch, Toffoli, and CNOT Gates via Rydberg Blockade of Neutral Atoms," arxiv.org, Cornell University Library, 201 Olin Library Cornell University Ithaca, NY (2018).
Shi, "Fast, Accurate, and Realizable Two-Qubit Entangling Gates by Quantum Interference in Detuned Rabi Cycles of Rydberg Atoms," arxiv.org, Cornell University Library, 201 Olin Library Cornell University Ithaca, NY (2019).
Sorace-Agaskar et al., "Multi-layer integrated photonics from the ultraviolet to the infrared," Proc. SPIE 10510, Frontiers in Biological Detection: From Nanosensors to Systems X, 105100D (2018).
Tamura et al., "Highly uniform holographic microtrap arrays for single atom trapping using a feedback optimization of in-trap fluorescence measurements," Optics Express, 24(8): 8132-8141 (2016).
Thimons et al., "Investigating the Gerchberg-Saxton Phase Retrieval Algorithm," SIAM: 11 pages (2018).
Torlai et al., "Integrating Neural Networks with a Quantum Simulator for State Reconstruction," Cornell University Library, (15 pages) (2019).
Urban et al., "Observation of Rydberg blockade between two atoms," Nature Physics, 5: 110-114 (2009).
Verresen et al., "One-dimensional symmetry protected topological phases and their transitions," Phys. Rev. B, 96(16): 165124-1-23 (2017).
Verstraete et al., "Criticality, the Area Law, and the Computational Power of Projected Entangled Pair States," Phys. Rev. Lett., 96: 220601 (2006).
Vidal, "Class of Quantum Many-Body States That Can Be Efficiently Simulated," Phys. Rev. Lett., 101(11): 110501-1-4 (2008).
Wang et al., "Coherent Addressing of Individual Neutral Atoms in a 3D Optical Lattice," Physical Review Letters, 115(4): 043003-1-5 (2015).
Yavuz et al., "Fast Ground State Manipulation of Neutral Atoms in Microscopic Optical Traps," Physical Review Letters, 96(6): 063001-1-4 (2006).
Zimmermann et al., "High-resolution imaging of ultracold fermions in microscopically tailored optical potentials," arXiv: 1011.1004, Apr. 8, 2011, pp. 1-15.
Auger et al., "Blueprint for fault-tolerant quantum computation with Rydberg atoms." Physical Review A 96(5): 052320 (2017).
Beugnon et al., "Two-dimensional transport and transfer of a single atomic qubit in optical tweezers" Nature Physics, vol. 3, p. 1-4 (2007).
Chao et al., "Fault-tolerant quantum computation with few qubits." npj Quantum Information 4.1 (2018): 42.
Cong et al., "Hardware-efficient, fault-tolerant quantum computation with Rydberg atoms", Physical Review X 12(2): 021049 (2022).
Couvert et al., "Optimal transport of ultracold atoms in the non-adiabatic regime" Europhysics Letters, 83: 5 pages (2008).
Dordevic et al., "Entanglement transport and a nanophotonic interface for atoms in optical tweezers" arXiv: 16 pages (2021).
Fowler et al., "Surface code quantum communication" arXiv, pp. 1-4 (2010).
Fowler et al., "Surface Codes: Towards practical large-scale quantum computation" Physical Review, vol. 86 (3), p. 1-54 (2012).
Graham et al., "Demonstration of multi-qubit entanglement and algorithms on a programmable neutral atom quantum computer" arXiv, p. 1-25 (2022).
Hashizume et al., "Deterministic Fast Scrambling with Neutral Atom Arrays" Physical Review Letters, vol. 126: 14 pages (2021).
International Search Report and Written Opinion for Application No. PCT/US2021/060136 dated Aug. 11, 2022.
International Search Report and Written Opinion for International Application No. PCT/US2022/031297 dated Feb. 21, 2023.
International Search Report and Written Opinion of Application No. PCT/US2021/060138 dated Aug. 19, 2022.

(56) References Cited

OTHER PUBLICATIONS

Kaufman et al., "Quantum thermalization through entanglement in an isolated many-body system" arXiv: 19 pages (2016).
Labuhn et al., "Realizing quantum Ising models in tunable two-dimensional arrays of single Rydberg atoms" arXiv: 1-12 (2016).
Lengwenus et al., "Coherent Transport of Atomic Quantum in a Scalable Shift Register" Physical Review Letters, 105: 4 pages (2010).
Low et al., "Practical trapped-ion protocols for universal qudit-based quantum computing", Physical Review Research 2(3): 033128 (2020).
Rehn et al., "A fractionalised "Z2" classical Heisenberg spin liquid" arXiv: 5 pages (2016).
Reichle et al., "Transport Dynamics of single ions in segmented microstructed Paul trap arrays" Forschritte der Physik Progress of Physics, 54 (8-10): 666-685 (2006).
Satzinger et al. "Realizing topologically ordered states on a quantum processor," 27 pages, (2021).
Savary et al., "Quantum Spin Liquids" arXiv: 60 pages (2016).
Yang et al., "Coherence Preservation of a Single Neutral Atom Qubit Transferred between Magic-Intensity Optical Traps" Physical Review Letter, 117: 6 pages (2016).
Yoder et al., "Universal fault-tolerant gates on concatenated stabilizer codes", Physical Review X 6(3): 031039 (2016).
International Search Report and Written Opinion for International Application No. PCT/US2019/049115 dated Jan. 7, 2020.
Ying, "Entangled Many-Body States as Resources of Quantum Information Processing," Center for Quantum Technologies National University of Singapore (2013).
Aliferis et al., "Computation by measurements: A unifying picture," Arxiv: 13 pages (2004).
Anonymous., "Magneto-optical trap," Wikipedia, retrieved online <https://web.archive.org/web/20210125084412/https://en.wikipedia.org/wiki/Magneto-optical_trap>: 7 pages (2022).
Cong et al., "Quantum convolutional neural networks" Nature Physics, vol. 15, p. 1273-78 (2019).
Extended European Search Report for EP Application No. 19854402.5 dated May 9, 2022.
Extended European Search Report for EP Application No. 19868908.5 dated Jun. 13, 2022.
Grant et al., "Hierarchical quantum classifiers" ARXIV, p. 1-16 (2018).
International Search Report and Written Opinion for International Application No. PCT/US2022/016173 dated May 24, 2022.
Killoran et al., "Continuous-variable quantum neural networks" ARXIV, p. 1-21 (2018).
Kim and Swingle., "Robust entanglement renormalization on a noisy quantum computer" ARXIV, p. 1-17 (2017).
Morgado et al., "Quantum simulation and computing with Rydberg-interacting qubits," Arxiv, Cornell University Library: 36 pages (2020).
Tanasittikosol et al., "Microwave dressing of Rydberg dark states," Arxiv, Cornell University Library: 12 pages (2011).
Verdon et al., "A Universal Training Algorithm for Quantum Deep Learning" ARXIV, p. 1-83, (2018).
Wu et al., "Erasure conversion for fault-tolerant quantum computing in alkaline earth Rydberg atom arrays," arXiv.org: 16 pages (2022).
Du et al., "Superconducting circuit probe for analog quantum simulators", *Physical Review A* 92(1): 012330 (2015).
International Search Report and Written Opinion for Application No. PCT/US2022/039189 dated Aug. 4, 2023.
International Search Report and Written Opinion for International Application No. PCT/US22/37325 dated Jun. 16, 2023.
Keating et al., "Adiabatic quantum computation with Rydberg-dressed atoms", Physical Review A 87, 052314, May 2013.
Levine, "Quantum Information Processing and Quantum Simulation with Programmable Rydberg Atom Arrays" The Department of Physics at Harvard University, PHD Thesis (2021).
Meschede, "Quantum engineering with neutral atoms one by one", *Conference on Lasers and Electro-Optics/Pacific Rim*. Optica Publishing Group, 2007.
Wang et al., "Quantum state manipulation of single-Cesium-atom qubit in a micro-optical trap", *Frontiers of Physics* 9: 634-639 (2014).
Willner et al., "Optics and photonics: Key enabling technologies", *Proceedings of the IEEE* 100.Special Centennial Issue: 1604-1643 (2012).
Levine, "Quantum Information Processing and Quantum Simulation with Programmable Rydberg Atom Arrays" The Department of Physics at Harvard University, PHD Thesis, published Jan. 12, 2022.

\* cited by examiner

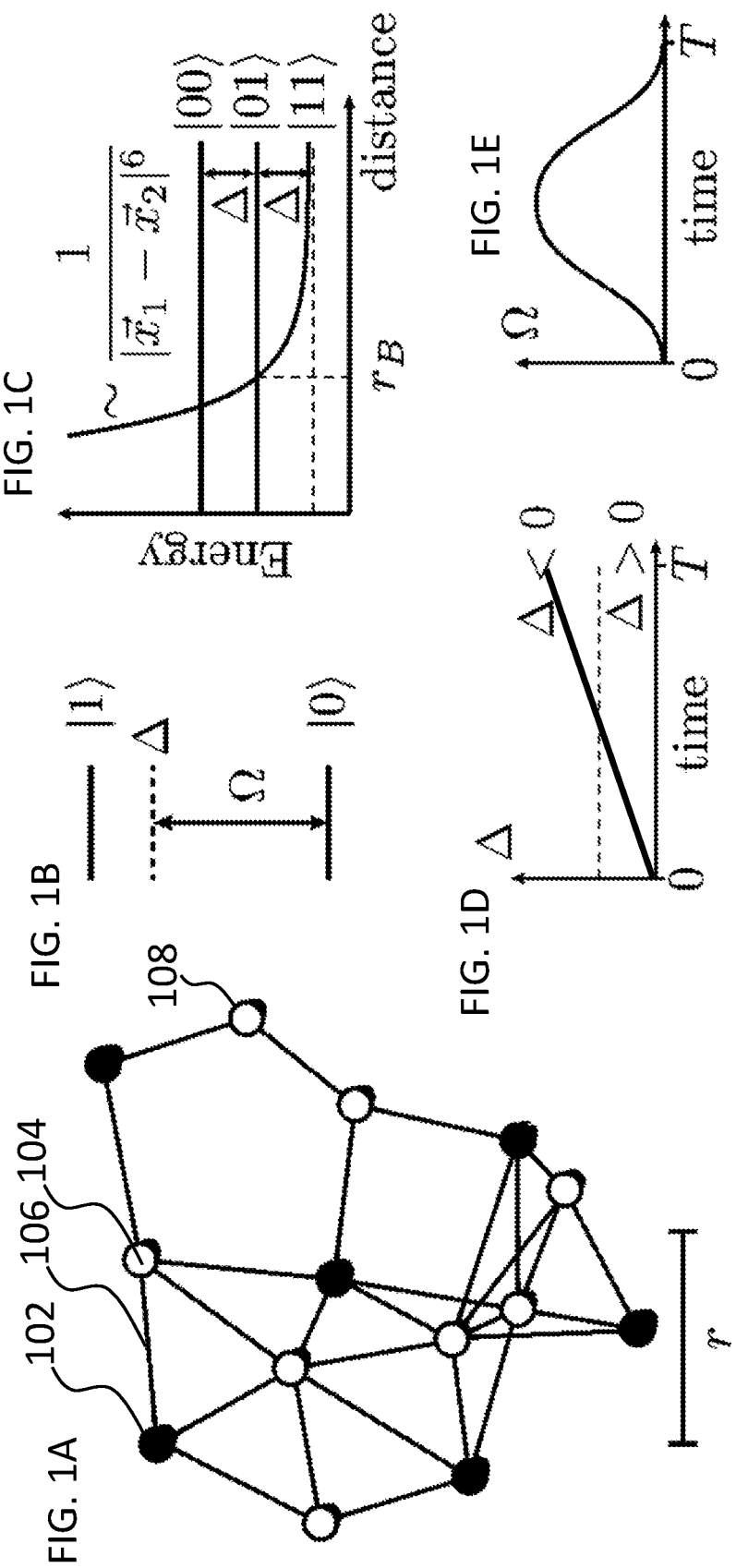

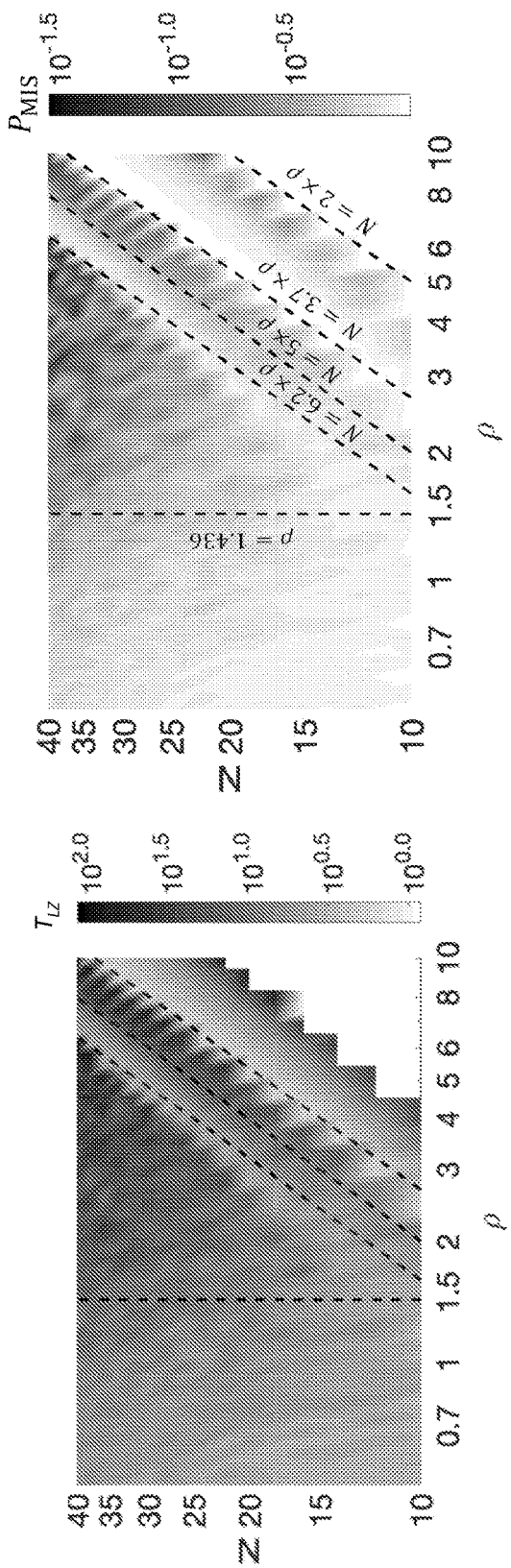
FIG. 4A
FIG. 4B
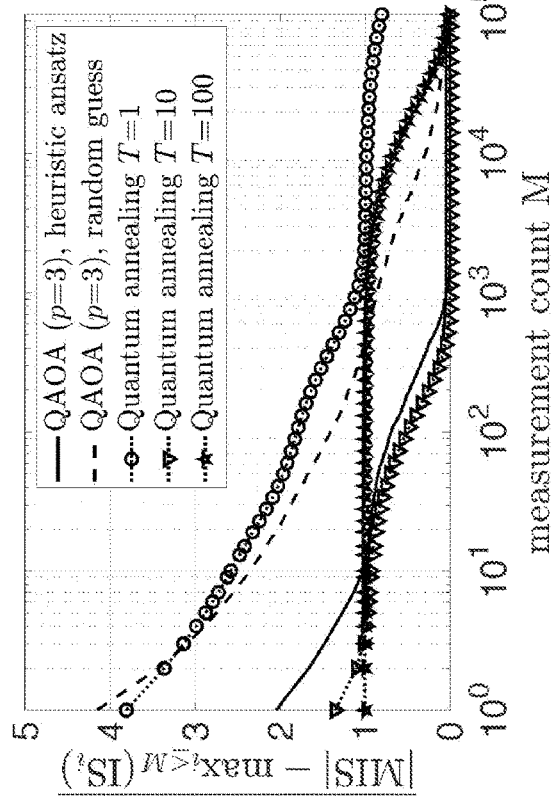
FIG. 4D
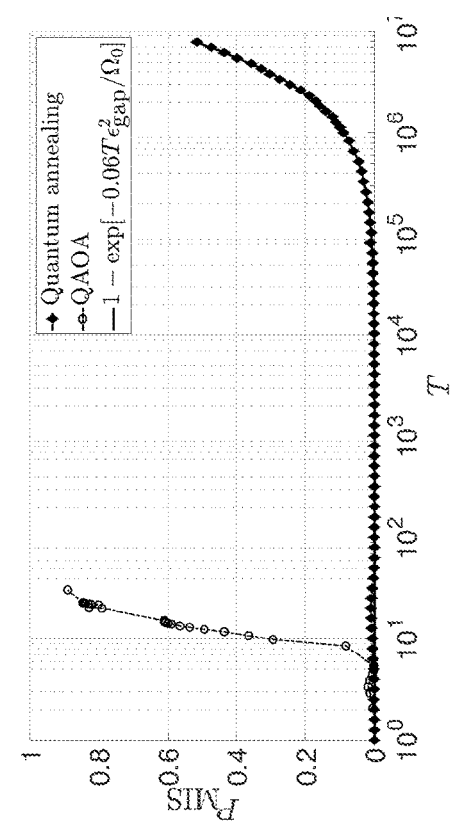
FIG. 4C

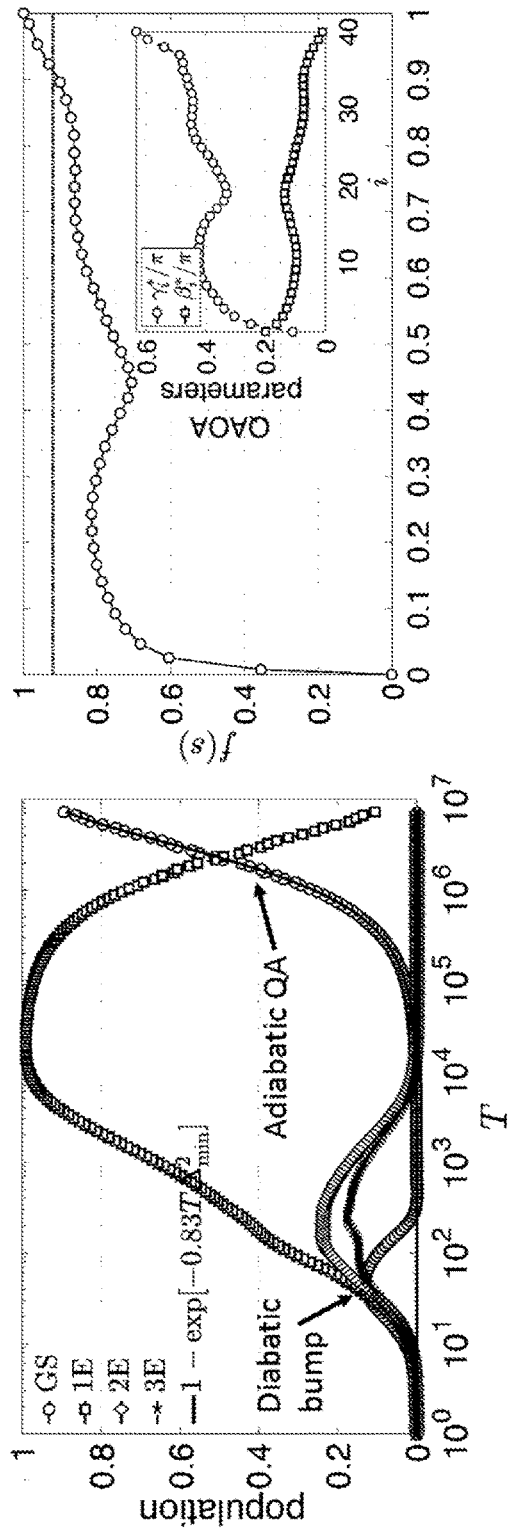
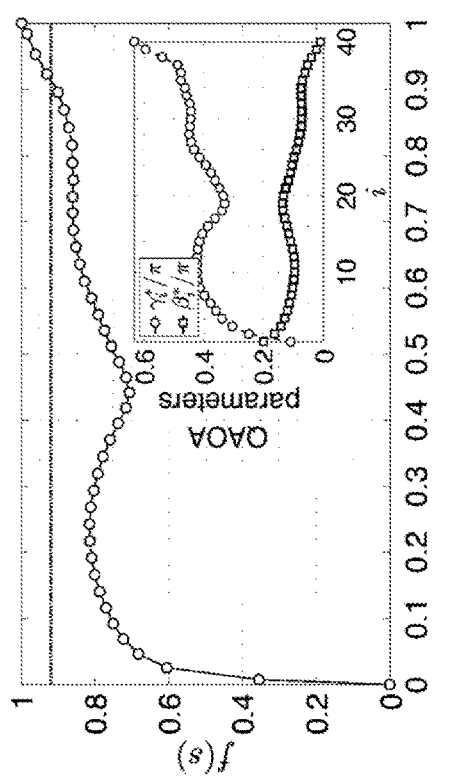
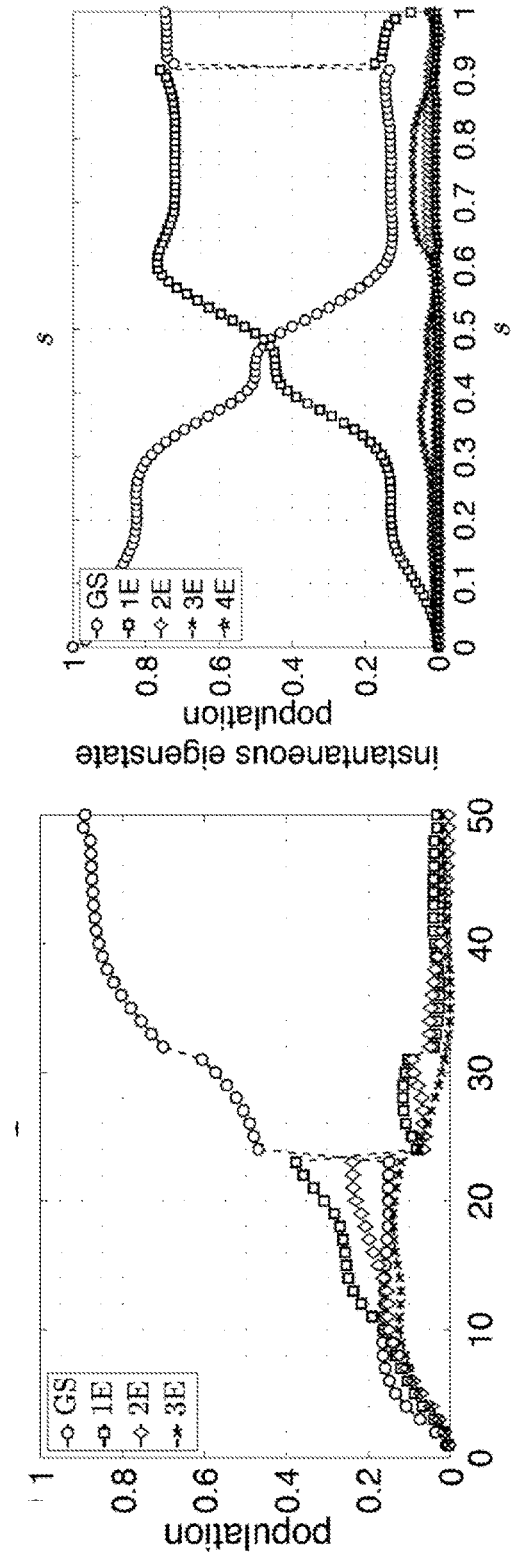
FIG. 18C
FIG. 18E
FIG. 18D
FIG. 18F

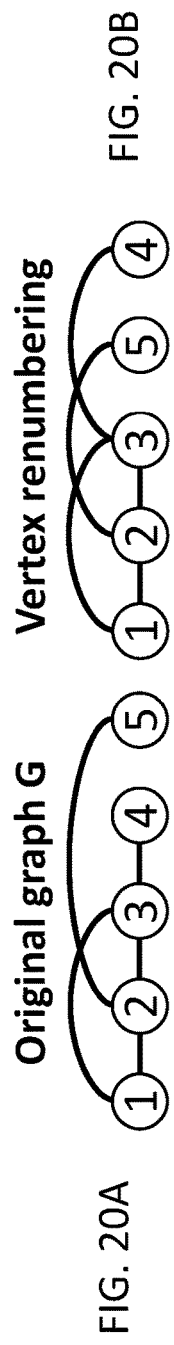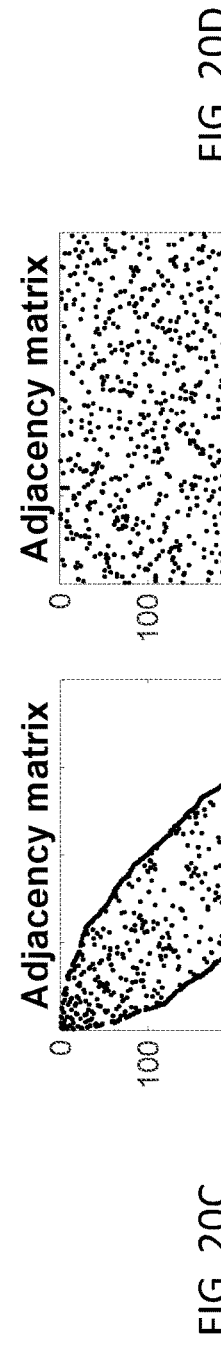
FIG. 20A  FIG. 20B  FIG. 20C  FIG. 20D  FIG. 20E

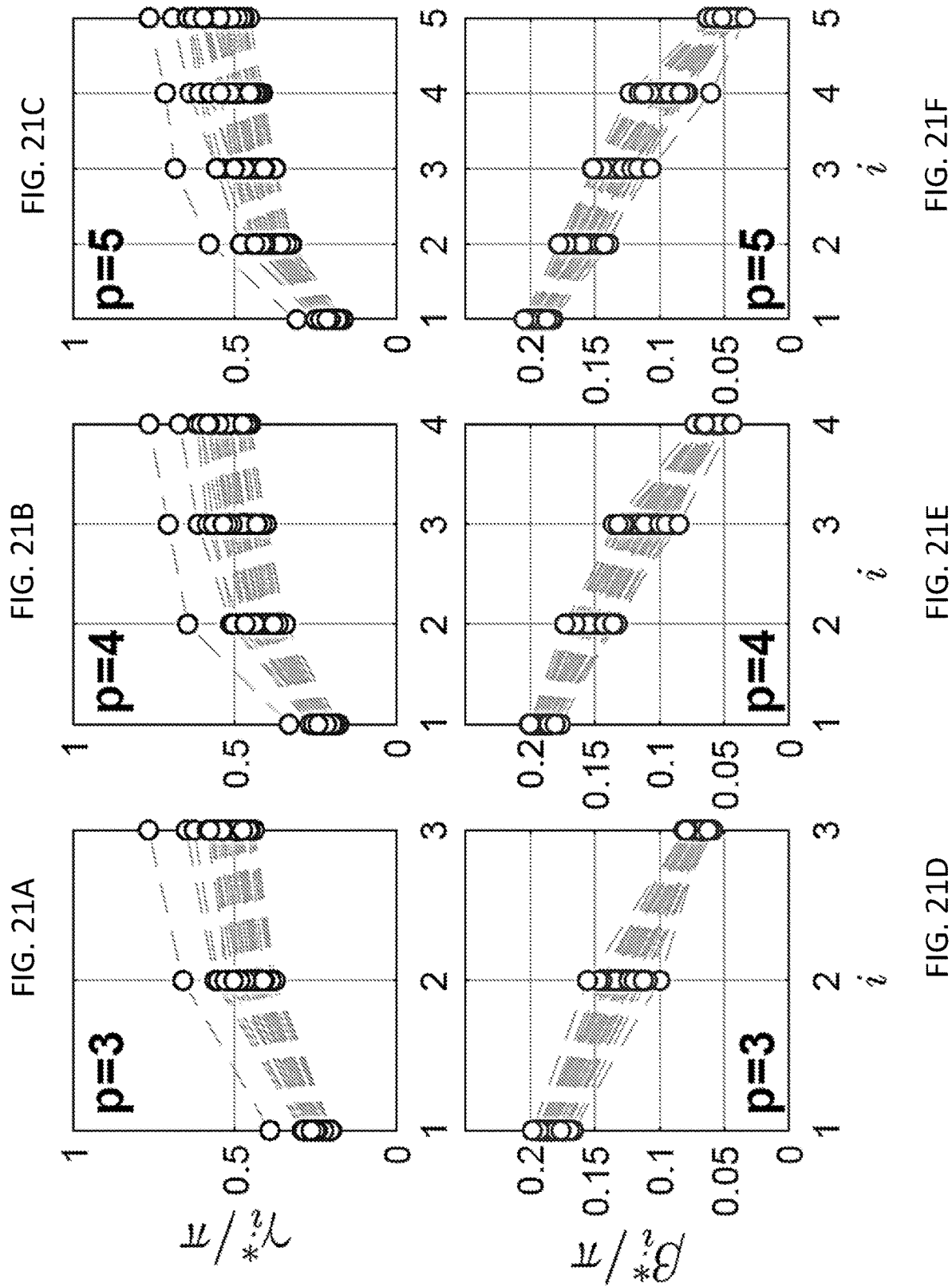

QUANTUM COMPUTING FOR COMBINATORIAL OPTIMIZATION PROBLEMS USING PROGRAMMABLE ATOM ARRAYS

CROSS-REFERENCE TO RELATED APPLICATIONS

This application is the U.S. National Stage of International Application No. PCT/US2019/049115, filed Aug. 30, 2019, which claims the benefit of priority to U.S. Provisional Application No. 62/725,874, entitled "QUANTUM OPTIMIZATION FOR MAXIMUM INDEPENDENT SET USING RYDBERG ATOM ARRAYS," filed on Aug. 31, 2018, the disclosures of which are hereby incorporated by reference in their entirety.

STATEMENT REGARDING FEDERALLY SPONSORED RESEARCH OR DEVELOPMENT

This invention was made with government support under Grant Nos. 1506284, PHY-1125846, and PHY-1521560 awarded by the National Science Foundation; FA9550-17-1-0002 awarded by the U.S. Air Force Office of Scientific Research; and N00014-15-1-2846 awarded by the U.S. Department of Defense/Office of Navy Research. The government has certain rights in the invention.

COPYRIGHT NOTICE

This patent disclosure may contain material that is subject to copyright protection. The copyright owner has no objection to the facsimile reproduction by anyone of the patent document or the patent disclosure as it appears in the U.S. Patent and Trademark Office patent file or records, but otherwise reserves any and all copyright rights.

TECHNICAL FIELD

This patent relates to quantum computing, and more specifically to preparing and evolving an array of atoms for quantum computations.

BACKGROUND

As quantum simulators, fully controlled, coherent many-body quantum systems can provide unique insights into strongly correlated quantum systems and the role of quantum entanglement and enable realizations and studies of new states of matter, even away from equilibrium. These systems also form the basis for the realization of quantum information processors. While basic building blocks of such processors have been demonstrated in systems of a few coupled qubits, increasing the number of coherently coupled qubits to perform tasks that are beyond the reach of modern classical machines is challenging. Furthermore, existing systems lack coherence and/or quantum nonlinearity for achieving fully quantum dynamics.

Neutral atoms can serve as building blocks for large-scale quantum systems, as described in more detail in PCT Application No. PCT/US18/42080, titled "NEUTRAL ATOM QUANTUM INFORMATION PROCESSOR." They can be well isolated from the environment, enabling long-lived quantum memories. Initialization, control, and read-out of their internal and motional states is accomplished by resonance methods developed over the past four decades. Arrays with a large number of identical atoms can be rapidly assembled while maintaining single-atom optical control. These bottom-up approaches are complementary to the methods involving optical lattices loaded with ultracold atoms prepared via evaporative cooling, and generally result in atom separations of several micrometers. Controllable interactions between the atoms can be introduced to utilize these arrays for quantum simulation and quantum information processing. This can be achieved by coherent coupling to highly excited Rydberg states, which exhibit strong, long-range interactions. This approach provides a powerful platform for many applications, including fast multi-qubit quantum gates, quantum simulations of Ising-type spin models with up to 250 spins, and the study of collective behavior in mesoscopic ensembles. Short coherence times and relatively low gate fidelities associated with such Rydberg excitations are challenging. This imperfect coherence can limit the quality of quantum simulations and can dim the prospects for neutral atom quantum information processing. The limited coherence becomes apparent even at the level of single isolated atomic qubits.

PCT/US18/42080 describes exemplary methods and systems for quantum computing. These systems and methods can involve first trapping individual atoms and arranging them into particular geometric configurations of multiple atoms, for example, using acousto-optic deflectors. This precise placement of individual atoms assists in encoding a quantum computing problem. Next, one or more of the arranged atoms may be excited into a Rydberg state, which can produce interactions between the atoms in the array. After, the system may be evolved under a controlled environment. Finally, the state of the atoms may be read out in order to observe the solution to the encoded problem. Additional examples include providing a high fidelity and coherent control of the assembled array of atoms.

SUMMARY

In one or more embodiments, a method includes selectively arranging a plurality of qubits into a spatial structure to encode a quantum computing problem, wherein each qubit corresponds to a vertex in the quantum computing problem, and wherein spatial proximity of the qubits represents edges in the quantum computing problem; initializing the plurality of qubits into an initial state; driving the plurality of qubits into a final state by applying a sequence of resonant light pulses with a variable duration and a variable optical phase to at least some of the plurality of qubits, wherein the final state comprises a solution to the quantum computing problem; and measuring at least some of the plurality of qubits in the final state.

In one or more embodiments, the spatial structure comprises a one-dimensional, two-dimensional or three-dimensional array of qubits.

In one or more embodiments, the encoded quantum computing problem comprises one or more of an unweighted maximum independent set problem, a maximum-weight independent set problem, a maximum clique problem, and a minimum vertex cover problem.

In one or more embodiments, weights in the maximum-weight independent set problem are encoded by applying light shifts to at least some of the plurality of qubits.

In one or more embodiments, the final state of the plurality of qubits comprises one or more of a solution to the encoded unweighted maximum independent set problem, a solution to the encoded maximum-weight independent set problem, a solution to the encoded maximum clique problem, and a solution to the encoded minimum vertex cover problem.

In one or more embodiments, the solution to the quantum computing problem comprises an approximate solution to the quantum computing problem.

In one or more embodiments, a method includes selectively arranging a plurality of qubits into a spatial structure comprising a plurality of vertex qubits and a plurality of ancillary qubits to encode a quantum computing problem using spatial proximity of the plurality of qubits, wherein each vertex qubit corresponds to a vertex in the quantum computing problem and wherein subsets of the ancillary qubits correspond to edges in the quantum computing problem; initializing the plurality of qubits into an initial state; driving the plurality of qubits into a final state, wherein the final state comprises a solution to the quantum computing problem; and measuring at least some of the plurality of qubits in the final state.

In one or more embodiments, the driving the plurality of qubits into the final state comprises applying light pulses with a constant or variable Rabi frequency $\Omega$ and a constant or variable detuning $\Delta$ to at least some of the plurality of qubits.

In one or more embodiments, the applying light pulses to the at least some of the plurality of qubits further includes: applying at least one light pulse with a detuning $\Delta_0$ to a vertex qubit comprising a corner vertex or a junction vertex; and applying at least one light pulse with a detuning $\Delta_i$ to each of i ancillary qubits adjacent to the vertex qubit on an edge connected to the vertex qubit.

In one or more embodiments, the applying the light pulses to the at least some of the plurality of qubits further comprises applying light shifts to selected qubits of the at least some of the plurality of qubits.

In one or more embodiments, the driving the plurality of qubits into the final state comprises applying a sequence of resonant light pulses with a variable duration and a variable optical phase to at least some of the plurality of qubits.

In one or more embodiments, the arranging the plurality of qubits into the plurality of vertex qubits and the plurality of ancillary qubits comprises arranging the plurality of qubits onto a grid.

In one or more embodiments, the encoded quantum computing problem comprises one or more of an unweighted maximum independent set problem, a maximum-weight independent set problem, a maximum clique problem, and a minimum vertex cover problem.

In one or more embodiments, weights in the maximum-weight independent set problem are encoded by applying light shifts to a plurality of qubits.

In one or more embodiments, the final state of the plurality of qubits comprises one or more of a solution to the encoded unweighted maximum independent set problem, a solution to the encoded maximum-weight independent set problem, a solution to the encoded maximum clique problem, and a solution to the encoded minimum vertex cover problem.

In one or more embodiments, the method further includes renumbering at least two vertices in the quantum computing problem prior to the encoding the quantum computing problem.

In one or more embodiments, the solution to the quantum computing problem comprises an approximate solution to the quantum computing problem.

In one or more embodiments, a method includes: selectively arranging a plurality of qubits into a spatial structure to encode a quantum computing problem, wherein each qubit corresponds to a vertex in the quantum computing problem; initializing the plurality of qubits into an initial state; stroboscopically driving the plurality of qubits into a final state, wherein the final state comprises a solution to the quantum computing problem; and measuring at least some of the plurality of qubits in the final state.

In one or more embodiments, stroboscopically driving the plurality of qubits into a final state comprises applying light pulses sequentially and selectively in an order to subsets of the plurality of qubits, the order of light pulses corresponding to the graph structure of the quantum computing problem.

In one or more embodiments, the driving the plurality of qubits into the final state comprises applying light pulses with a constant or variable Rabi frequency $\Omega$ and a constant or variable detuning $\Delta$ to at least some of the plurality of qubits.

In one or more embodiments, the driving the plurality of qubits into the final state comprises applying a sequence of resonant light pulses with a variable duration and a variable optical phase to at least some of the plurality of qubits.

In one or more embodiments, the encoded quantum computing problem comprises one or more of an unweighted maximum independent set problem, a maximum-weight independent set problem, a maximum clique problem, and a minimum vertex cover problem.

In one or more embodiments, weights in the maximum-weight independent set problem are encoded by applying light shifts to a plurality of qubits.

In one or more embodiments, the final state of the plurality of qubits comprises one or more of a solution to the encoded unweighted maximum independent set problem, a solution to the encoded maximum-weight independent set problem, a solution to the encoded maximum clique problem, and a solution to the encoded minimum vertex cover.

In one or more embodiments, the method further includes renumbering at least two vertices in the quantum computing problem prior to the encoding the quantum computing problem.

In one or more embodiments, the solution to the quantum computing problem comprises an approximate solution to the quantum computing problem.

In one or more embodiments, a method includes: arranging a plurality of qubits to encode a quantum computing problem; applying a sequence of q levels of light pulses to the plurality of qubits, wherein the q levels of light pulses comprises at least a first set of q variational parameters and a second set of q variational parameters; measuring the state of one or more of the plurality of qubits; optimizing, based on the measured state of at least some of the one or more of the plurality of qubits, the first set of q variational parameters and the second set of q variational parameters of the q levels of light pulses; optimizing, based at least on the first set of q optimized variational parameters and the second set of q optimized variational parameters of q levels of light pulses, a first set of p variational parameters and a second set of p variational parameters of p levels of light pulses, wherein q<p; and measuring at least some of the plurality of qubits in a final state.

In one or more embodiments, optimizing the first set of p variational parameters and the second set of p variational parameters of p levels of light pulses further comprises computing a first set of p variational parameter starting values and a second set of p variational parameter starting values of the p levels of light pulses.

In one or more embodiments, computing of the first set of p variational parameter starting values of the p levels of light pulses, wherein p>1, comprises: performing a Fourier transform on the first set of q variational parameters of the q levels of light pulses, into a plurality of k frequency components, each of the k frequency components having an amplitude $u_k$; and computing the first set of p variational parameter starting values of the p levels of light pulses based on the amplitudes $u_k$;

In one or more embodiments, computing of the second set of p variational parameter starting values of the p levels of light pulses, wherein p>1, comprises: performing a Fourier transform on the second set of q variational parameters of the q levels of light pulses, into a plurality of k frequency components, each of the k frequency components having an amplitude $v_k$; and computing the second set of p variational parameter starting values of the p levels of light pulses based on the amplitudes $v_k$.

In one or more embodiments, computing of the first set of p variational parameter starting values and computing of the second set of p variational parameter starting values of the p levels of light pulses, comprises: extrapolating the first set of p variational parameter starting values of the p levels of light pulses based on the first set of q variational parameters of the q levels of light pulses; and extrapolating the second set of p variational parameter starting values of the p levels of light pulses based on the second set of q variational parameters of the q levels of light pulses.

In one or more embodiments, the method further includes applying a sequence of p levels of light pulses to the plurality of qubits with a first set of p optimized variational parameters and a second set of p optimized variational parameters, wherein the measuring the at least some of the plurality of qubits in the final state comprises measuring the at least some of the plurality of qubits after the applying the sequence of p levels of light pulses to the plurality of qubits.

In one or more embodiments, the encoded quantum computing problem comprises a MaxCut problem, and wherein the final state of the plurality of qubits comprises a solution to the MaxCut problem.

In one or more embodiments, the encoded quantum computing problem comprises a maximum independent set problem, and wherein the final state of the plurality of qubits comprises a solution to the maximum independent set problem.

BRIEF DESCRIPTION OF THE FIGURES

Various objectives, features, and advantages of the disclosed subject matter can be more fully appreciated with reference to the following detailed description of the disclosed subject matter when considered in connection with the following drawings, in which like reference numerals identify like elements.

FIGS. 1A-1E illustrate an exemplary scheme for encoding and finding solutions to optimization problems using an array of qubits, according to some embodiments.

FIGS. 4A-4D are graphs illustrating the performance of quantum algorithms for MIS on random UD graphs, according to some embodiments.

FIGS. 18A-18F are graphs and illustrations showing nonadiabatic aspects of QAOA, according to some embodiments.

FIGS. 20A-20F are graphs and illustrations showing exemplary vertex renumbering techniques and Rydberg implementations, according to some embodiments.

FIGS. 21A-21F are graphs showing QAOA optimal variational parameters, according to some embodiments.

DETAILED DESCRIPTION

Figure 2A:
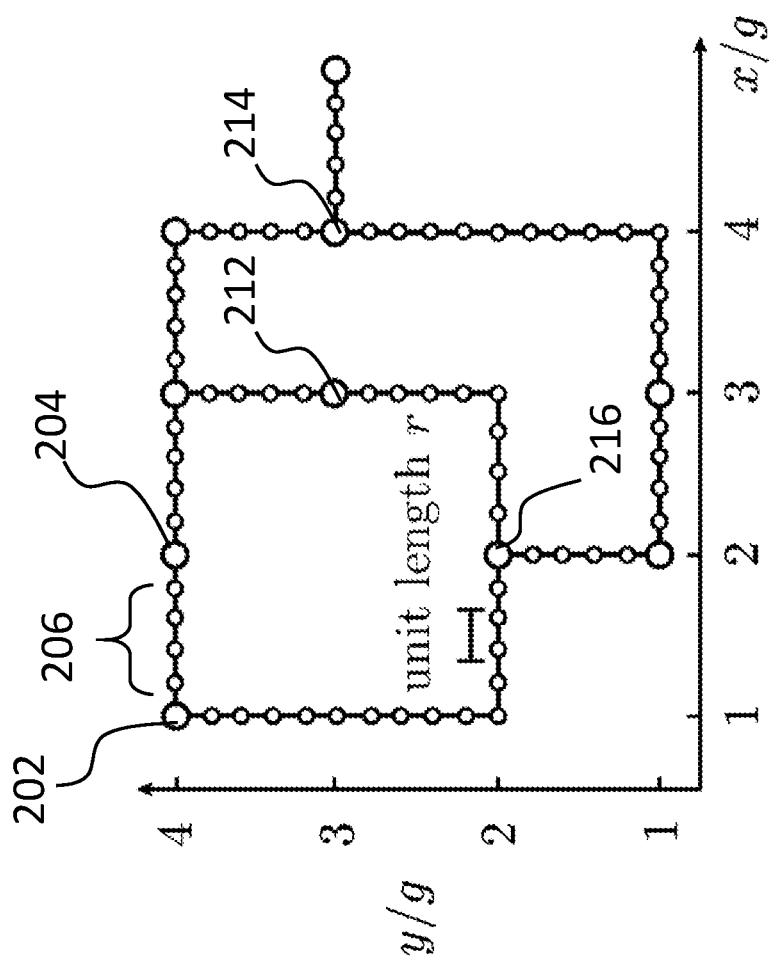
FIGS. 2A-2B illustrate and characterize arrangements of vertex and ancillary qubits, according to some embodiments.

Optimization algorithms are used for finding the best solution, given a specified criterion, for a specified problem. Combinatorial optimization involves identifying an optimal solution to a problem given a finite set of solutions. Quantum optimization is a technique for solving combinatorial optimization problems by utilizing controlled dynamics of quantum many-body systems, such as a 2D array of individual atoms, each of which can be referred to as a "qubit" or "spin." Quantum algorithms can solve combinatorially hard optimization problems by encoding such problems in the classical ground state of a programmable quantum system, such as spin models. Quantum algorithms are then designed to utilize quantum evolution in order to drive the system into this ground state, such that a subsequent measurement reveals the solution. In other words, a problem can be encoded by placing qubits in a desired arrangement with desired interactions that encode constraints set forth by the optimization problem. When properly encoded, the ground state of the many-body system comprises the solution to the optimization problem. The problem can therefore be solved by driving the many-body system through an evolutionary process into its ground state.

Without being bound by theory, assuming complete control of the interactions between the qubits, it is possible to encode nondeterministic polynomial ("NP")-complete optimization problems into the ground states of such systems. In most realizations, however, not all interactions are fully programmable. Instead, such interactions are determined by properties of specific physical realizations, such as, but not limited to locality, geometric connectivity, or controllability, which either constrain the class of problems that can be efficiently realized or imply that substantial overhead is required for their realization. Thus, one of the challenges in understanding and assessing quantum optimization algorithms involves designing methods to encode specific and larger classes of combinatorial problems in physical systems in an efficient and natural way.

In some implementations, quantum optimization can involve: (1) encoding a problem by controlling the positions of individual qubits in a quantum system given a particular type and strength of interaction between pairs of qubits and (2) steering the dynamics of the qubits in the quantum system through an evolutionary process such that their evolved final states provide solutions to optimization problems. The steering of the dynamics of the qubits into the ground state solution to the optimization problem can be achieved via multiple different processes, such as, but not limited to the adiabatic principle in quantum annealing algorithms (QAA), or more general variational approaches, such as, but not limited to quantum approximate optimization algorithms (QAOA). Such algorithms may tackle computationally difficult problems beyond the capabilities of classical computers. However, the heuristic nature of these algorithms poses a challenge to predicting their practical performance and calls for experimental tests. In addition, such systems, in their full generality, are inefficient and difficult to implement owing to practical constraints as described above, and can only be used on a subset of optimization problems.

Some aspects of the present disclosure relate to systems and methods for arranging qubits in programmable arrays that can encode or approximately encode in an efficient way a broader set of optimization problems. In some embodiments, chains of even numbers of adjacent "ancillary" qubits are used to encode interactions between distant qubits by connecting such distant qubits with chains of ancillary qubits, for example as described in more detail with reference to FIG. 2A. As described in more detail throughout the present disclosure, these chains of "ancillary" qubits can be used to encode interaction between certain "vertex" qubits, but not other vertex qubits and to reduce the strength of long-range interaction between two vertex qubits that are not intended to be connected via an edge. In some embodiments, the effects of long-range interactions can be further reduced by introducing a detuning parameter to a chosen control technique to selectively control interaction between particular qubits. For example, for corner and junction qubits, detuning patterns described in the present disclosure can reduce the effects of long-range interactions such that the ground state of the system is the optimal solution to the encoded problem. The techniques described herein can permit efficient encoding of a larger set of optimization problems beyond simple unit disk graphs.

Some additional or alternative aspects of the present disclosure relate to systems and methods for coherently manipulating the internal states of qubits, including excitation. In some embodiments, techniques are disclosed that can be used to evolve an encoded problem to find an optimal (or an approximately optimal) solution. For example, embodiments of the present disclosure relate to optimal variational parameters and strategies for performing the Quantum Approximate Optimization Algorithm ("QAOA"), some embodiments of which are described, for example, with reference to FIG. 14A. For example, embodiments include heuristics for classical feedback loops that can improve the performance of brute-force QAOA implementations. In some embodiments, these strategies perform at least as well if not better than existing algorithms. Some aspects of the present disclosure focus on implementations of using QAOA to solve MaxCut combinatorial problems, but the disclosed techniques are not limited thereto.

Exemplary Optimization Problems and Encodings

In some embodiments, particular types of optimization problems can be encoded with an arrangement of qubits. For example, FIGS. 1A-1E show an exemplary scheme for encoding and finding solutions to optimization problems using an array of qubits, according to some embodiments. FIG. 1A shows aspects of a Rydberg blockade mechanism and maximum independent set on unit disk graphs, according to some embodiments. One exemplary optimization problem that can be solved using the techniques described in the present disclosure is a maximum independent set ("MIS") problem. Given a graph G with vertices V and edges E, an independent set can be defined as a subset of vertices where no pair is connected by an edge. FIG. 1A shows an example graph with vertices such as 102, 104. Vertices 102, 104 can be connected via an edge, such as edge 106. The computational task of a MIS problem is to find the largest such set, called the maximum independent set (MIS). As shown in the graph of FIG. 1A, the maximum independent set is denoted via black vertices such as 102, none of which are connected. In the example of FIG. 1A, the size of the maximum independent set is 6. Determining whether the size of MIS is larger than a given integer a for an arbitrary graph G is a well-known NP-complete problem. Furthermore, even approximating the size of the MIS is an NP-hard problem. In some embodiments, the MIS problem is also equivalent to the maximum clique problem and the minimum vertex cover problem. Thus, a solution to the MIS problem will constitute a solution to the corresponding maximum clique problem and the minimum vertex cover problem.

Without being bound by theory, the embodiment of FIG. 1A can be referred to as a unit disk ("UD") graph. UD graphs are geometric graphs in which vertices are placed in a 2D plane and connected if their pairwise distance is less than a unit length, r. In other words, UD graphs are graphs where any two vertices within a distance r from one another are connected with an edge, such as vertices 102, 104 which are connected via edge 106. Vertex 108 is too far from vertices 102, 104 to be connected therewith with an edge. The MIS problem on UD graphs (UD-MIS) is still NP-complete and can be used to find practical situations ranging from, for example, wireless network design to map labelling in various industry sectors.

In some embodiments, a MIS problem can be formulated as an energy minimization problem, by associating a spin-½ with each vertex $v \in V$. Vertices like those shown in FIG. 1A can be prepared such that after a driving sequence, such as one with a Rabi frequency $\Omega$ and detuning $\Delta$ that vary over time (as shown in FIGS. 1D and 1E), the state $|1\rangle$ of each qubit is energetically favored unless a nearby vertex is also in the state $|1\rangle$, in which case it is energetically favored to have one vertex transition to the state $|0\rangle$. Without being limited by theory, the Hamiltonian ("$H_P$") of such a system can be represented as follows:

$$H_P = \sum_{v \in V} -\Delta n_v + \sum_{(v,w) \in E} U n_v n_w \qquad \text{Equation 1}$$

where a spin-½ system is assigned with states $|0\rangle$ and $|1\rangle$ to each vertex, $n_v = |1\rangle_v \langle 1|$, $\Delta$ is the detuning on the spin, and U is the energy penalty when two spins (v, w) connected by an edge (E) are both in state $|1\rangle$. Initially, all vertices can be prepared in the $|0\rangle$ state. Driving causes at least some of the vertices to transition to the $|1\rangle$ state. For $\Delta > 0$, $H_P$ favors qubits to be in state $|1\rangle$. However, if $U > \Delta$, it is energetically unfavorable for two qubits, u and v, to be simultaneously in state $|1\rangle$ if they are connected by an edge u, $v \in E$. Thus, each ground state of $H_P$ represents a configuration where the qubits that correspond to vertices in the maximum independent set are in state $|1\rangle$, and all other qubits are in state $|0\rangle$.

FIG. 1C is a graph showing interatomic interaction potentials between two adjacent vertices in the limit of weak driving, where $\delta \ll \Delta$ and $\Delta > 0$, according to some embodiments. Changing the detuning and Rabi frequency over time can produce quantum evolution that changes the system from the initial state to the final state, which can include a solution (or one or more approximate solutions) to the encoded problem. As described above, under such conditions, for qubits closer than $r_B$ (the Rydberg blockade radius) it is energetically favorable for one of the qubits to stay in the $|0\rangle$ state. For example, when $U > \Delta > 0$, the Hamiltonian $H_P$ energetically favors each spin to be in the state $|1\rangle$ unless a pair of spins are connected by an edge (i.e., within the Rydberg radius). Thus, in the ground state of the Hamiltonian $H_P$, only the vertices in the MIS are in state $|1\rangle$. Such a state can be referred to as a MIS-state, and $H_P$ can be referred to as a MIS-Hamiltonian. In some embodiments, the NP-complete decision problem of MIS becomes deciding whether the ground state energy of $H_P$ is lower than $-a\Delta$.

In some embodiments, a quantum annealing algorithm ("QAA") can be used to evolve the quantum state from the initial state to the final state, which encodes the solution of the optimization problem. For example, a simple QAA can be implemented by adding a transverse field $H_D = \Sigma_v \Omega \sigma_v^x$ with $\sigma^x = |0\rangle\langle 1| + |1\rangle\langle 0|$, that induces quantum tunneling between different spin configurations. FIG. 1B shows a transition between spin states, according to some embodiments. For example, the arrow labelled as Rabi frequency $\Omega$ describes a transition between the spin states $|0\rangle$ and $|1\rangle$ controlled, for example, by a laser beam with the Hamiltonian $\Omega \sigma_v^x$ for a spin v. When the detuning $\Delta < 0$, the ground state of the Hamiltonian $H_P$ is the trivial state where all qubits are in the $|0\rangle$ state. When the detuning $\Delta > 0$, the ground states of $H_P$ are the MIS states where qubits in state $|1\rangle$ form the MIS. By slowly changing $\Omega$ and $\Delta$ in a time-dependent fashion, for example as shown in FIGS. 1E and 1D, respectively, the trivial ground state with all qubits in $|0\rangle$ ($\Delta < 0$, $\Omega = 0$) can be adiabatically connected to a final state encoding the $M_{IS}$ ($\Delta > 0$, $\Omega = 0$), resulting in the qubits being left in a solution to the optimization problem. Note that in general, such a procedure can involve transitions across vanishing energy gaps as discussed in more detail throughout the present disclosure. Exemplary non-limiting embodiments of simulations are described in more detail below in the section titled "Quantum annealing for random UD-$M_{IS}$."

Figure 9:
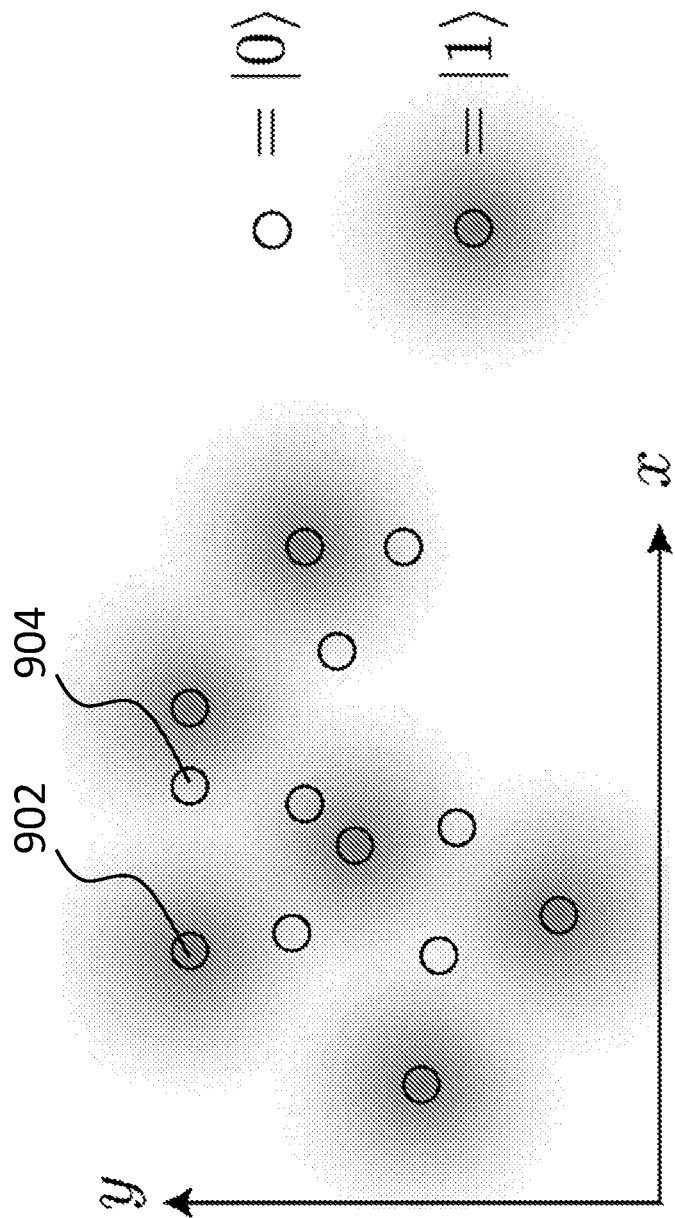
FIG. 9 is an illustration and graph showing behavior of a Rydberg problem, according to some embodiments.
Figures 10A, 10B:
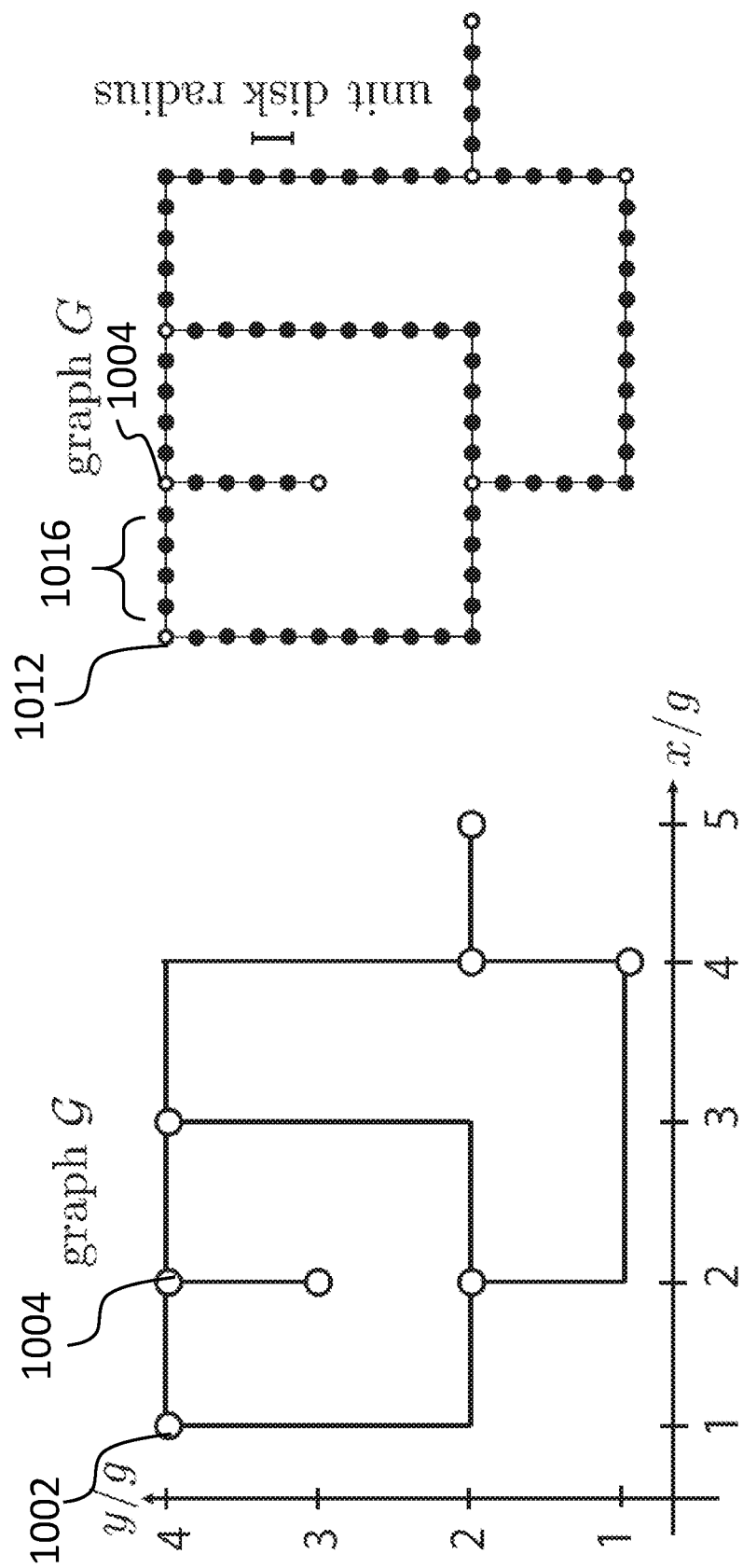
FIGS. 10A-10B are grid representations of planar graphs of maximum degree 3 and a transformation to a unit disk graph, according to some embodiments.

In some embodiments, MIS problems can be implemented using Rydberg interactions between individual atoms. For example, as discussed in more detail in PCT/US18/42080, graphs like that shown in FIG. 1A can be implemented using two-level qubits, the states of which are shown in FIG. 1B, according to some embodiments. Using optical tweezers, atoms (qubits) can be individually and deterministically arranged in fully programmable arrays in one, two and even three dimensions. Such a system can use individually trapped homogeneously excited neutral atoms interacting via the so-called Rydberg blockade mechanism. Each atom realizes a qubit, $\upsilon$, with an internal ground state, $|0\rangle$, and a highly excited, long-lived Rydberg state, $|1\rangle$, which can be coherently manipulated by external laser fields. If two atoms are both in this Rydberg state and within the Rydberg blockade radius, they interact via strong van der Waals interactions, which is energetically unfavorable. This makes it possible to encode a UD-MIS problem using qubits as vertices and the disk size set by the Rydberg radius, as explained in more detail below. FIG. 9 shows an exemplary solution to a UD-MIS problem, where some qubits 904 are found in the internal ground state, $|0\rangle$, and, other qubits 902 in the long-lived Rydberg state, $|1\rangle$, according to some embodiments.

Without being limited by theory, the Hamiltonian governing the evolution of embodiments of such a system can be represented as follows:

$$H_{Ryd} = \sum_v (\Omega_v \sigma_v^x - \Delta_v n_v) + \sum_{v < \omega} v(|\vec{x}_v - \vec{x}_\omega|) n_v n_w, \qquad \text{Equation 2}$$

where $\Omega_\upsilon$ and $\Delta_\upsilon$ are the Rabi frequency and laser detuning at the position $\vec{x}_\upsilon$ of qubit v. While individual manipulation is feasible, such a system can also be implemented with a homogeneous driving laser, for example, where $\Omega_\upsilon = \Omega$ and $\Delta_\upsilon = \Delta$. The operator $\sigma_v^x = |0\rangle_v \langle 1| + |1\rangle_v \langle 0|$ can give rise to coherent spin flips of qubit v and $n_v = |1\rangle_v \langle 1|$ counts if the qubit v is in the Rydberg state. In some embodiments, for isotropic Rydberg states, the interatomic interaction strength depends only on the relative atomic distance, x, and is given by $V_{Ryd}(x) = C/x^6$, where C is a constant. The strong interactions at short distances energetically prevent two qubits from being simultaneously in state $|1\rangle$ if they are within the Rydberg blockade radius $r_B = (C/\sqrt{(2\Omega)^2 + \Delta^2})^{1/6}$, as shown in FIG. 1C, resulting in the so-called blockade mechanism, according to some embodiments. This can provide a connection between the Rydberg Hamiltonian $H_{Ryd}$ and solutions to UD-MIS problems. In other words, the Rydberg blockade causes it to be energetically favorable for adjacent qubits within the Rydberg radius ($r_B$) to not both be in the Rydberg state $|1\rangle$. Like in UD graphs, in some embodiments of this configuration the qubits cannot be found to be both in state |1⟩ when separated by a distance smaller than the Rydberg blockade radius.

The $M_{IS}$-Hamiltonian $H_P$ shares some features with the Rydberg Hamiltonian $H_{Ryd}$ in the classical limit, $\Omega_v=0$. In some embodiments, the main difference lies in the achievable connectivity of the pairwise interaction, for example, when arbitrary graphs are allowed in $H_P$. A special, restricted class of graphs can be considered that are most closely related to the Rydberg blockade mechanism. These so-called unit disk (UD) graphs, as discussed above, are constructed when vertices can be assigned coordinates in a plane, and only pairs of vertices that are within a unit distance, r, are connected by an edge. Thus, the unit distance r plays an analogous role to the Rydberg blockade radius $r_B$ in $H_{Ryd}$. In other words, spatial proximity of the qubits is used to encode the edges in the UD-MIS problem. $M_{IS}$ is NP-complete even when restricted to such unit disk graphs. While embodiments of the present disclosure discuss 2D problems and 2D arrangement of qubits, a person of skill in the art would understand, based on the present disclosure, that aspects of the problem encoding described herein would be applicable to other spatial structures such as a one-dimensional or three-dimensional structure.

Without being bound by theory, the maximum-weight independent set problem is a MIS problem where each vertex v has a weight $\Delta_v$ that replaces the homogenous weight $\Delta$ in equation 1. The maximum-weight independent set problem is to find an independent set with the largest total sum of weights. In some embodiment implementation, these weights $\Delta_v$ can be encoded by applying corresponding light shifts to each qubit. In some embodiments, these light shifts can be AC Stark shifts created by off-resonant laser beams or spatial light modulators.

Exemplary Qubit Arrangements and Detunings

Although Rydberg interactions decay significantly beyond the Rydberg radius, there are still long-range interaction tails between distant qubits, such as 102 and 108, shown in FIG. 1A. Interaction tails, taken alone or in aggregate, can reduce the likelihood that the system will be found in the solution after driving, such as that shown in FIGS. 1D and 1E. Therefore, implementations such as that shown in FIG. 1A may not always perfectly encode an NP-complete $M_{IS}$ problem. Furthermore, the range of NP-complete problems that can be encoded using the technique described with reference to FIG. 1A is limited to those related to unit disks.

In some embodiments, one or more of these problems can be solved by choosing atom positions in two dimensions and laser parameters such that the low energy sector of the Rydberg Hamiltonian $H_{Ryd}$ reduces to the (NP-complete) $M_{IS}$-Hamiltonian $H_P$ on planar graphs with maximum degree 3. In some aspects of the present disclosure, antiferromagnetic order can be formed in the ground state of (quasi) 1D spin chains of ancillary qubits at positive detuning, due to the Rydberg blockade mechanism. Such a configuration can effectively transport the blockade constraint between distant vertex qubits. In other aspects of the present disclosure, a detuning pattern, $\{\Delta_v\}$ can be introduced to eliminate the effect of undesired long-range interactions without altering the ground state spin configurations. Some embodiments allow efficient encoding of NP-complete problems in the ground state of arrays of trapped neutral atoms. Without being bound by theory, the ground state energy of Rydberg interacting atoms in 2D array in such embodiments is NP-hard (and NP-complete when $\Omega_v=0$).

Exemplary Qubit Arrangements with Ancillary Qubits

As described with reference to FIGS. 2A and 2B, NP-complete problems can be encoded with "ancillary" qubits or vertices that implement edges between "vertex" qubits with vertex qubits having a maximum degree of 3, according to some embodiments. For example, as shown in FIG. 2A, a plurality of vertex qubits 202, 204, 212, 214, and 216 can be arranged in a graph. Edges between pairs of vertex qubits, such as vertex qubits 202 and 204, can be implemented using an even number of ancillary qubits 206, each of which is separated by a unit length r. This technique can be used to embed a planar grid graph with maximum degree 3 into a UD graph. For example, a planar graph with maximum degree 3 can be efficiently embedded on a grid (with grid unit g), $\mathcal{G}$, and transformed to a UD graph, G, by introducing an even number of ancillary vertices along each edge, as shown in FIG. 2A, according to some embodiments. The UD radius $$r \simeq \frac{g}{2k+1}$$

can be determined by a parameter k, proportional to the linear density of ancillary vertices along each edge. According to some embodiments, it is desirable to implement approximately the same density of ancillary qubits along any given edge to ensure that the interactions that form each vertex are roughly equal in strength.

In the example of vertex qubits 202 and 204, vertex qubit 202 can interact with the leftmost ancillary qubit 206 as if it were vertex qubit 204, and vertex qubit 204 can interact with the rightmost ancillary qubit 206 as if it were vertex qubit 202. In this way, edges can be implemented between vertex qubits outside the Rydberg radius, and in ways that cannot be implemented purely as a unit disk graph. Furthermore, whereas in unit disk graphs like that discussed with reference to FIG. 1A, it would not be possible to have some vertices separated by the same distance connected by an edge (e.g., vertex qubits 202, 204) while other vertices separated by the same distance are not connected by an edge (e.g., vertex qubits 212, 214), such configurations can be realized using the ancillary vertices described in the present disclosure.

Exemplary Detuning Patterns

In some embodiments, when a MIS graph is implemented as shown in FIG. 2A, the tail of the Rydberg interactions does not affect interactions between qubits except in the vicinity of corners and junctions, where arrays of ancillary qubits meet at an angle. Vertex qubits 202 is an exemplary corner, while vertex qubit 216 is an exemplary junction. As described in more detail with reference to FIG. 2B, the detuning pattern during driving of the qubits can be adjusted around these structures to compensate for the effect of interaction tails.

Figure 2B:
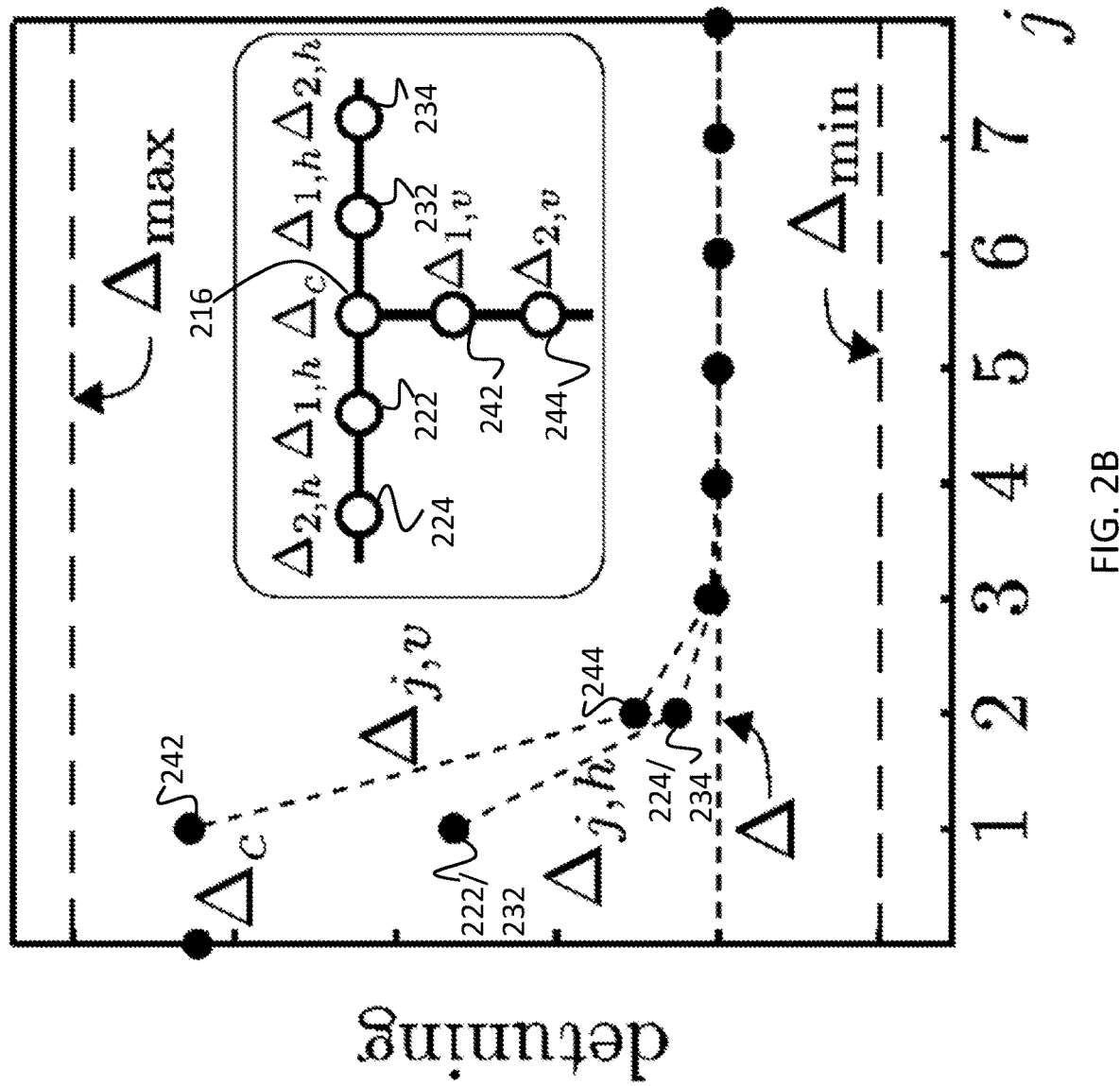

FIG. 2B shows an example of such a detuning pattern, according to some embodiments. The inset of FIG. 2B shows a vertex qubit 216 with degree of 3, such as the vertex qubit 216 in FIG. 2A, which is adjacent ancillary qubits 222, 224 in a first direction, 232, 234 in a second direction, and 242, 244 in a third direction. FIG. 2B plots detunings $\Delta_{j,v(h)}$ of qubits at distances j from the vertex qubit, with detuning $\Delta_c$, along the vertical (horizontal) direction. As shown in FIG. 2B, the detunings $\Delta_{j,v(h)}$ can individually address each ancillary qubit (for example, using individual addressing techniques described in PCT/US18/42080), and set in a way that eliminates the effects of interaction tails. For example, detunings $\Delta_v$ can be selected in a range $\Delta_{min} \equiv 0.51 C/r^6 < \Delta_v < \Delta_{max} \equiv C/r^6$, and with sufficiently large k. In some embodiments, detunings can be selected arbitrarily within this range. Such detunings can compensate for undesired effects of long-range interactions. Under such conditions, in the ground state of $H_{Ryd}$ (at $\Omega_v=0$), each array of ancillary qubits is in an ordered configuration, alternating between $|0\rangle$ and $|1\rangle$ (with at most one domain wall). This ensures that the ground state of $H_{Ryd}$ (2) for $\Omega_v=0$, coincides with the ground state of the $M_{IS}$ Hamiltonian (1) on G. This perturbation of the detunings for individual ancillary qubits can be performed with multiple different types of global driving patterns (such as QAA and QAOA described in more detail throughout the present disclosure) and without prior knowledge of what the solution is to the MIS. Furthermore, since the size of the MIS on G is identical to that of the MIS on G, up to half of the number of ancillary vertices, it is still NP-hard to find the ground state of the Rydberg Hamiltonian (2) when a MIS problem is implemented using ancillary vertices.

In some embodiments, implementations can be expanded beyond unit disk graphs to more general graphs. Such implementations can be referred to as "stroboscopic" implementations, which can involve an arbitrary graph implemented without ancillary qubits described with reference to FIG. 2A. For example, in some embodiments, various optical techniques can be employed to enlarge the class of problems that can be addressed in these systems. One exemplary approach involves qubits encoded in hyperfine ground states, rather than ground-Rydberg qubit encoding, and selective excitation (for example, with individual addressing of qubits) into various kinds of Rydberg states, such as Rydberg S and P states. In this example, strong and long-range dipolar interactions between Rydberg states with different parities S and P can be used to efficiently realize rotations of a single qubit, controlled by its multiple neighbors. For example, Rydberg S and P states can be used to realize multi-qubit-controlled rotations. Rotations (or qubit flips) can be used to evolve the quantum state from the initial state to the final MIS-state. By controlling these interactions, it is possible to ensure that evolution of a system does not violate the independent set constraint, for example, by ensuring that two qubits do not evolve to both be in the Rydberg state if they are connected by an edge. In some examples, all neighbors of a given (central) qubit can be selectively excited from the state $|1\rangle$ to an S-state. Subsequently, a two-step transition between the two hyperfine states of the central qubit, with an intermediary step in the Rydberg P-state, can implement a multi-qubit-controlled rotation. Combined with Trotterized time evolution (e.g., splitting the total Hamiltonian evolution into small discrete steps), these techniques provide means to go beyond UD graphs, and implement various quantum optimization algorithms for MIS problems on arbitrary graphs. In some embodiments, this technique can implement arbitrary graphs, which can include a broader range of graphs than what is depicted in FIG. 2A. In some embodiments, the "stroboscopic implementation" (selective and sequential excitation of qubits into Rydberg states) allows for the implementation of multi-qubit-controlled rotations. This selective excitation can facilitate controlled rotations according to the graph structure, which is not necessarily limited to the unit disk geometry.

Comparison of Exemplary Classical and Quantum Algorithms

According to some embodiments, it is desirable to identify the types of UD-MIS problems for which finding solutions with quantum computing would show large improvements over standard computing approaches. Numerical simulations of both classical and quantum algorithms can be used to identify regimes and system sizes where quantum algorithms are well suited for UD-MIS. In one embodiment, MIS on random UD graphs constructed by placing N vertices randomly with a density $\rho$ in a 2D box of size L×L, where $L=\sqrt{N/\rho}$ and UD radius r=1 can be considered. The hardness of this problem can depend on the vertex density: if the density is below the percolation threshold $\rho_c \approx 1.436$, the graph decomposes into disconnected, finite clusters, allowing for efficient polynomial time algorithms. In the opposite limit, for example if the density is very large, $\rho \to \infty$ (and $N \propto \rho$), the problem becomes essentially the closest packing of disks in the (continuous) 2D plane, with the known best packing ratio of $\pi/(2\sqrt{3})$.

Figure 3B:
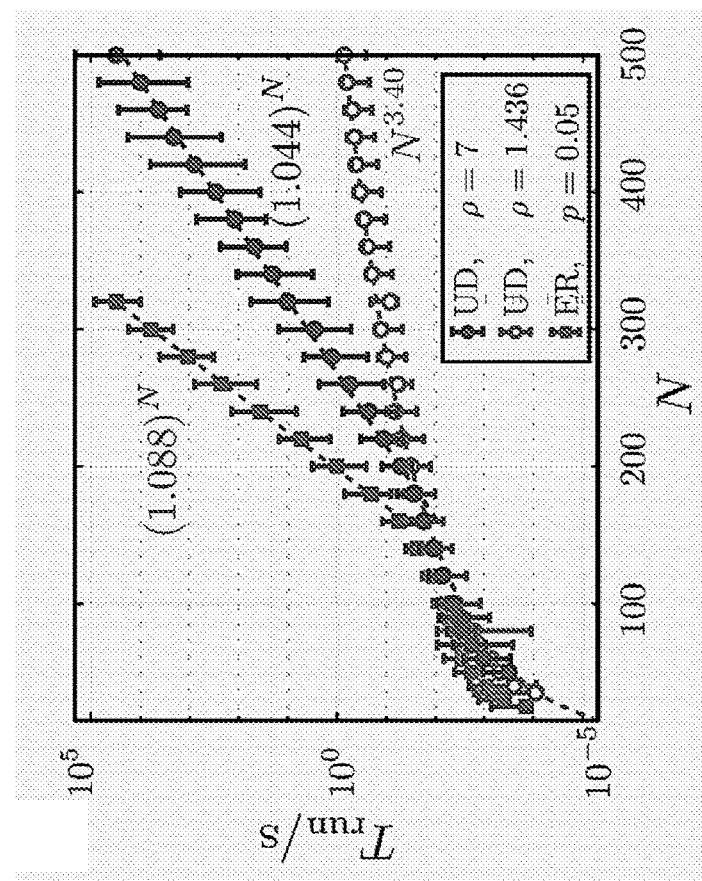
FIGS. 3A-3B are graphs illustrating the performance of classical branch and bound algorithms for MIS on random UD graphs, according to some embodiments.
Figure 3A:
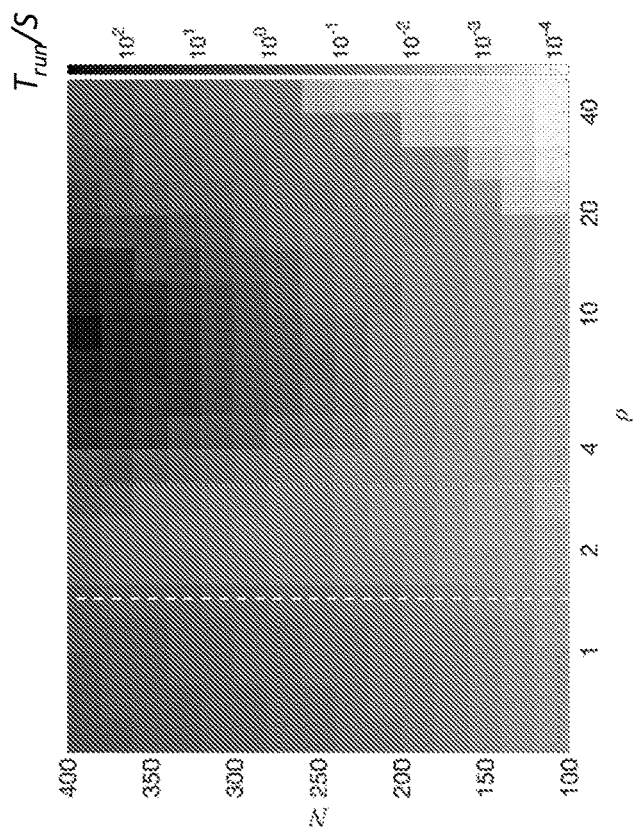

FIGS. 3A-3B show the performance of an exemplary classical optimization algorithm, according to some embodiments. In particular, it shows that in some density regions it is difficult for classical algorithms to solve optimization problems, requiring exponential time to solve exactly. In these regimes, quantum advantage is more beneficial than other regimes. FIGS. 4A-4D show the corresponding performance of quantum algorithms (both QAA and QAOA), according to some embodiments. Though implemented with small-size simulations, FIGS. 4A-4D indicate that QAOA can solve problems fast and beat QAA. FIGS. 4A-4D show quantum advantage for certain regimes, according to some embodiments. More particularly, FIG. 3A is a graph showing the performance of classical optimization algorithms, focusing on a branch and bound algorithm, according to some embodiments. The median runtime $T_{run}$ to find the MIS in CPU time is shown for bins at given numbers (vertical axis) and densities (horizontal axis). The exemplary statistics shown in FIG. 3A were obtained from 50 graphs per data point. The dashed line indicates the percolation threshold described above, which in this case is shown to be $\rho = \rho_c \approx 1.436$. As can be seen in FIG. 3A, in certain regimes of the parameter space of N and $\rho$, problems are difficult for classical optimization algorithms to solve because, for example, the run time is large.

FIG. 3B is a graph showing the run time $T_{run}$ as a function of N, according to some embodiments. While there is a polynomial scaling for $\rho < \rho_c \approx 1.436$, at an intermediate density $\rho \sim 7$, the runtime exhibits an exponential dependence with system sizes exceeding N~150 vertices. This exponential dependence can be seen in both worst cases and typical instances for any given number N. Note that at $\rho \sim 7$, the classical algorithm often could not find a solution for N≳440 within 24 hours of CPU time on a single node of the Odyssey computing cluster (managed by Harvard University). For more general, non-UD graphs, this limitation of the classical algorithm is observed at N≳320. For comparison, the performance on Erdös-Renyi graphs with edge probability p=0.05 are also shown, demonstrating a similar exponential runtime. Error-bars are 5th and 95th percentile values among 100 graphs. FIG. 3B shows that it can take a long time (for example, 24 hours) for classical algorithm to solve problems of a certain size (for example, ~N=400). This informs the problem size to test quantum algorithms such that the problem is nontrivial to solve classically.

FIGS. 4A and 4B are graphs showing performance of quantum algorithms for MIS on random UD graphs, according to some embodiments. FIG. 4A is a hardness diagram for a quantum adiabatic algorithm in terms of adiabatic time scale $T_{LZ}$, according to some embodiments, plotted against N on the vertical axis and density $\rho$ on the horizontal axis.

For example, FIG. 4A shows the results of numerical simulations of the adiabatic QAA, with the $M_{IS}$ annealing Hamiltonian $H_D+H_P$ described above, while sweeping the parameters as:

$$\Delta(t)=\Delta_0(2t/T-1), \quad \text{Equation 3:}$$

$$\Omega(t)=\Omega_0 \sin^2(\pi t/T) \quad \text{Equation 4:}$$

The limit $U/\Omega_0 \to \infty$ can be observed, where the dynamics are restricted to the independent set subspace, allowing numerical simulation of system sizes up to N~40 qubits. Sloped dashed lines parallel to the stripe pattern correspond to optimal disk packing. The fully connected region has trivially |MIS|=1. The Landau-Zener time scale, $T_{LZ}$, required for adiabaticity can be extracted by fitting numerical results to the expected long-time behavior of the ground state probability $P_{MIS}=1-e^{a-T/T_{Lz}}$. For example, it is possible to fit $P_{MIS}$ for large T to extract $T_{LZ}$. FIG. 4A shows a clear transition at the percolation threshold $\rho=1.436$ from the regime in which the problem is easy to solve to that where it is not. At high density the size of the MIS can be determined by $L=\sqrt{N/\rho}$ owing to the relation to the optimum packing problem. This is also reflected in $T_{LZ}$ as visible by the stripe pattern in FIG. 4A. The exponential Hilbert space size limits numerical simulations, making a conclusive comparison with the scaling of the classical algorithm above difficult. In some implementations, finite coherence times can further limit the performance of the adiabatic algorithms with exponential scaling of the minimum energy gap, $\epsilon_{gap}$ corresponding to the energy gap between the ground state and first excited state along a quantum adiabatic path.

Several approaches can be implemented to try to overcome these potential limitations. Such approaches include heuristics to open up the gap, the use of diabatic (non-adiabatic) transitions in QAA, and variational quantum algorithms such as QAOA studied below. FIG. 4B is a graph showing the probability to find the $M_{IS}$, $P_{MIS}$ for simulated non-adiabatic QAA, according to some embodiments. In some embodiments, $T_{LZ}$ and $P_{MIS}$ can convey similar information, and is related by $P_{MIS}=1-e^{a-T/T_{Lz}}$ for large T (in the adiabatic regime). FIG. 4A shows an exemplary adiabatic regime (large T) while FIG. 4B shows an exemplary nonadiabatic regime (short T). For example, FIG. 4B shows a single sweep (rather than sweeping multiple times for total time T, as shown in FIG. 4A) for a single T, which is in an exemplary short-time limit (e.g., nonadiabatic) with profile in Eq. (3) with a short annealing time $T=10/\Omega_0 \ll T_{LZ}$. FIG. 4B shows that substantial overlap with the $M_{IS}$ state can be obtained with evolution time $T \ll T_{LZ}$, while the success probability resembles qualitatively the adiabatic hardness diagram. These results are consistent with observations that non-adiabatic annealing can be advantageous, especially when the minimum spectral gap $\epsilon_{gap}$ is small. In some embodiments, if the gap is small (compared to other energy scales), it can require a long coherence time to run the quantum adiabatic algorithm (for example, $T \gg 1/\epsilon_{gap}^2$).

As described throughout the present disclosure, it is possible to take advantage of a direct connection between the many-body problem of spins interacting via van der Waals interactions and computational complexity theory. Individual control over the positions of such spins allows for NP-complete optimization problems to be directly encoded into such quantum systems. This result can be obtained from a reduction from $M_{IS}$ on planar graphs with maximum degree of 3. Quantum optimizers based on the techniques described in the present disclosure, in combination with techniques to trap and manipulate neutral atoms, can address NP-hard optimization problems as an improvement over traditional computing techniques.

Exemplary Quantum Algorithms

As discussed above, after encoding a combinatorial problem using the position of a quantum system, whether using the "ancillary" qubit technique described above or not, the next step is to evolve the system in a way that produces a ground state that is a solution to the combinatorial problem. Some examples include QAA and QAOA.

QAOA

In some embodiments, QAOA can be applied to quantum optimization problems like those described in the present disclosure. For example, a QAOA (of level p) can consist of applying a sequence of p resonant pulses to all qubits (or with some detuning and energy adjustments for specific qubits as described in more detail in the present disclosure) of varying duration, $t_k$, and optical phase, $\varphi_k$ on an initial prepared state. This can generate a variational wavefunction $\psi(\{t_k,\phi_k\}) = \Pi_{k=1}^P U_k|0\rangle^{\otimes N}$, where $U_k = e^{-iH_k t_k}$ and $H_k = \Sigma_{v \in V} \Omega_0 e^{i\Phi_k}|0\rangle_v\rangle 1|+h.c.)+\Sigma_{(v,w) \in E} U_{n_v n_w}$. Without being bound by theory, the present disclosure describes some additional or alternative optimization parameters ($\gamma$, $\beta$), which can in some embodiments be related to the duration, $t_k$, and optical phase, $\varphi_k$ as described in more detail in the section below titled QAOA for MIS.

The resulting quantum state can be measured in the computational basis and then used for optimization. For example, the variational parameters $t_k$ and $\varphi_k$ can be optimized in a classical feedback loop from measurements of $\langle H_P \rangle$ in this quantum state. Examples of this optimization are described in more detail below.

The performance of QAOA depends in part on the chosen classical optimization routine. Before explaining exemplary implementations of such techniques, the performance of QAOA can be shown, which marks an improvement upon classical computation techniques in some embodiments. For example, FIG. 4C compares optimized QAOA with quantum annealing, on an exemplary graph instance, $G_0$, (with N=32 and independent set space dimension $\dim_{IS}=17734$, $\rho=2.4$ and |MIS|=8, $\epsilon_{gap} \approx 0.0012\Omega_0$) for which the adiabatic timescale can be observed to be approximately $\sim 10^6/\Omega_0$, according to some embodiments. As shown in FIG. 4C, QAOA achieves O(1) success probability at depth $p \le 40$ (i.e., less than 40 resonant pulses) thereby displaying significantly shorter evolution times, $T=\Sigma_k t_k \sim 10/\Omega_0 \ll T_{LZ}$ and showing exceptionally good variational states, which can indicate that the algorithm is effective at solving the encoded problem. And discussed in more detail below, this is also reflected in implementations of QAOA on large systems. For exemplary system sizes that can be assessed using common numerical analytics, however, the fluctuations associated with measurement projection noise can imply that the MIS size can be easily found during the classical optimization routine, even at smaller p. In some embodiments, this "measurement projection noise" is not noise in the measurement. For example, each measurement can produce a configuration space. To estimate the expectation value of an observable and perform QAOA optimization, the measurement has to be repeated multiple times. For small system sizes, the measurement result may hit the MIS before much optimization since each measurement has a high probability to produce the MIS.

FIG. 4D shows the simulated performance of various quantum algorithms on the graph $G_0$, according to some embodiments. For example, FIG. 4D shows the average difference between the true MIS and the largest independent set found after M measurements for simulated QAOA and QAA on $G_0$. As shown in FIG. 4D, both QAOA with heuristic ansatz as well as random guess methods are shown. To obtain such results, simulations for QAOA were performed with Monte Carlo simulations techniques, including sampling from projective measurements. The size of the largest measured independent set is plotted as a function of the number of measurements (averaged over Monte Carlo trajectories). With a properly chosen heuristic ansatz for $t_k$ and $\varphi_k$, QAOA (at p=3) finds the $M_{IS}$ already after $\sim 10^2$-$10^3$ measurements. This is comparable to the number of measurements required for accurately estimating $\langle H_P \rangle$, as part of the classical optimization routine. This performance can be compared to repeated runs of QAA with sweeps described by equation 3 above (and $\Delta_0/\Omega_0$=6) for non-adiabatic annealing times T=1/$\Omega_0$, 10/$\Omega_0$, 100/$\Omega_0$. For this small system size, QAOA performs similarly as non-adiabatic QAA at the annealing time T$\sim$10/$\Omega_0$.

As explained above, QAOA is a quantum processor that prepares a quantum state according to a set of variational parameters. Using measurement outputs (such as the measured qubit state ($|0\rangle$ or $|1\rangle$) of each qubit), the parameters can then be optimized, for example via a classical computer and fed back to the quantum machine in a closed loop. In QAOA, the state is prepared by a p-level circuit specified by 2p variational parameters. In other words, each pulse has two parameters ($t_k$, $\phi_k$), for k from 1 to p. Even at the lowest circuit depth (p=1), QAOA has non-trivial provable performance benefits (for example, better performance than a simple classical algorithm) but cannot be efficiently simulated by classical computers.

However, very little is known about QAOA with p>1. One hurdle lies in the difficulty to efficiently optimize in the non-convex, high-dimensional parameter landscape. Without constructive approaches to perform the parameter optimization, any potential advantages of the hybrid algorithms could be lost. Furthermore, although QAOA can be shown to succeed in the p→∞ limit due to its ability to approximate adiabatic quantum annealing (i.e., the adiabatic algorithm), its performance when 1<p<<∞ is largely unexplored.

Exemplary Parameter Optimization for QAOA

Aspects of the present disclosure detail techniques to efficiently optimize QAOA variational parameters. In some examples, given a set of qubits in a particular arrangement, QAOA proceeds by applying a series of operations to the qubits, each operation having at least two variational parameters. The evolved state of the qubits is measured, which is fed back into an optimization routine (such as a classical algorithm) to adjust the variational parameters. The process then repeats on the qubits until it is determined that the measured state of the qubits is a solution to the encoded problem or an approximation thereof. In some embodiments, techniques for classical optimization routines are disclosed. These techniques are quasi-optimal in the sense that they typically produce known global optima, and generically require $2^{O(p)}$ brute-force optimization runs to surpass performance. Aspects of the present disclosure also disclose implementations of QAOA with such optimization techniques, such as an example involving a 2D physical array of a few hundred Rydberg-interacting atoms that presents potential advantages over classical algorithms for solving MaxCut problems.

As discussed above, many real-world problems can be framed as combinatorial optimization problems. In some embodiments, these are problems that can be generally defined on N-bit binary strings $z=z_1 \ldots z_N$, where the goal is to determine a string that maximizes a given classical objective function C(z): $\{+1, -1\}^N \mapsto \mathbb{R}_{\geq 0}$. An approximate optimization algorithm aims to find a string z that achieves a desired approximation ratio $$\frac{C(z)}{C_{max}} \geq r^*, \quad \text{Equation 5A}$$

where $C_{max} = \max_z C(z)$.

The Quantum Approximate Optimization Algorithm (QAOA) is a quantum algorithm that can tackle these combinatorial optimization problems. To encode the problem, the classical objective function can be converted into a quantum problem Hamiltonian by promoting each binary variable $z_i$ into a quantum spin $\sigma_i^z$:

$$H_C = C(\sigma_1^z, \sigma_2^z, \ldots, \sigma_N^z) \quad \text{Equation 5B:}$$

Figure 14A:
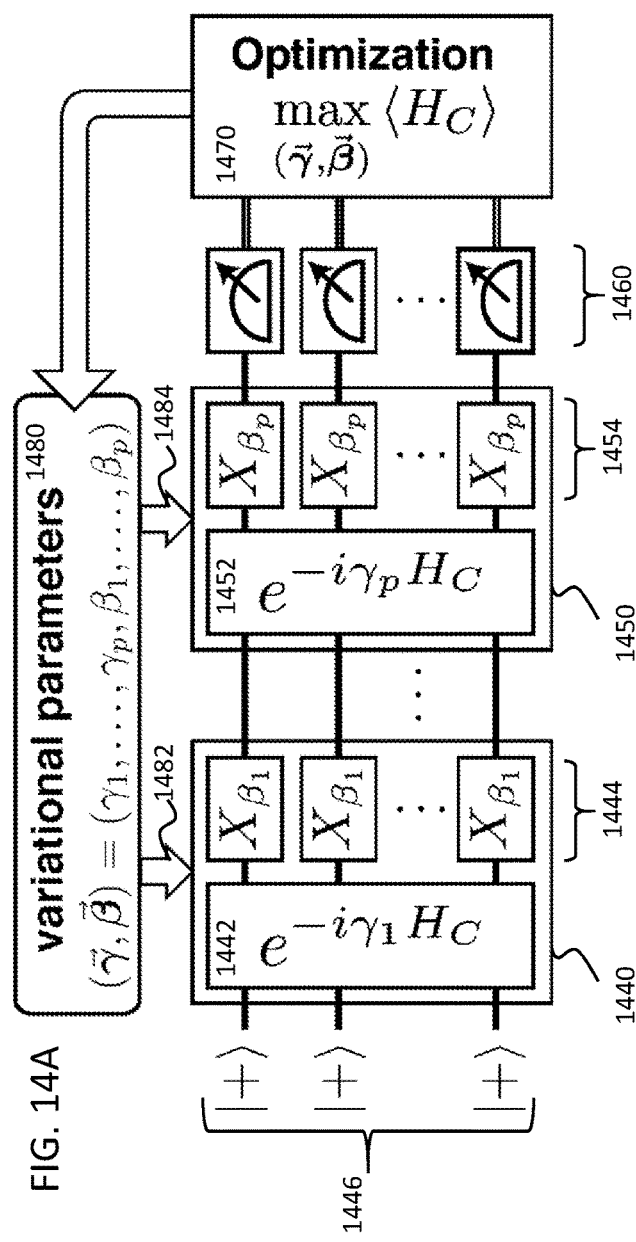
FIG. 14A is a schematic of a p-level QAOA algorithm, according to some embodiments.

FIG. 14A is a flow diagram of an example QAOA algorithm, according to some embodiments. As shown in FIG. 14A, the quantum circuit takes inputs $|+\rangle^{\otimes n}$ 1446 and alternately applies sets of p levels (1440, ..., 1450) of $e^{-i\gamma_i H_C}$ (1442, ..., 1452) and $X_{\beta_i} = e^{-i\beta_i H^x}$ (1444, ..., 1454). In some embodiments, $e^{-i\gamma_i H_C}$ and $X_{\beta_i}$ represent 2 different types of evolution of the system, which can be induced physically by laser pulses. The parameters γ and β can quantify for how long each evolution occurs. Each of these levels applies variational parameters 1480, which can differ between each of the set of p levels. The outputs are then measured at 1460 with respect to a function $\langle H_C \rangle$. In some embodiments, the outputs are a superposition of spin states. When measured the system collapses to one of these spin states, so the measurement result can be a single spin configuration. In some embodiments, the expectation value $\langle H_C \rangle$, which is a function of the spin configuration, is the number arrived at when evaluating the Hamiltonian HC in this configuration, and averaged for multiple experimental runs, which is then fed through an optimizer 1470 (which can be a classical optimization function), which calculates the parameters ($\vec{\gamma}$, $\vec{\beta}$) for each level 1440, ..., 1450 in the set that maximizes $\langle H_C \rangle$. These parameters ($\vec{\gamma} \vec{\beta}$) are then provided as variational parameters 1480 for the next iteration (for example, as a feedback loop). Note that the variational parameters 1480 may be different at each level 1440, ..., 1450 in the set of p levels. The inputs $|+\rangle^{\otimes n}$ 1446 are then provided again and the process repeats. In some embodiments, after a number of iterations, the measurement 1460 can be considered to be the solution to the encoded problem.

For the p-level QAOA described in FIG. 14A, the quantum processor can be initialized in the state $|+\rangle^{\otimes n}$ (1446). The problem Hamiltonian $H_C$ (1442, 1452) and a mixing Hamiltonian $$H_B = \sum_{j=1}^{N} \sigma_j^x$$

(1444, 1434) are applied alternately (p times) with controlled durations to generate a variational wavefunction:

$$|\psi_p(\vec{\gamma},\vec{\beta})\rangle = e^{-i\beta_p H_B} e^{-i\gamma_p H_C} \ldots e^{-i\beta_1 H_B} e^{-i\gamma_1 H_C} |+\rangle^{\otimes N} \quad \text{Equation 6A:}$$

which is parameterized by 2p parameters $\gamma_i$ and $\beta_i$ (i= 1, 2, ... p) (one for each level in the set of p level). The expectation value $H_C$ in this variational state can be determined as follows:

$$\langle H_C \rangle = F_p(\vec{\gamma},\vec{\beta}) = \langle \psi_p(\vec{\gamma},\vec{\beta}) | H_C | \psi_p(\vec{\gamma},\vec{\beta}) \rangle, \quad \text{Equation 6B:}$$

which can be identified by repeated measurements 1460 of the quantum system in the computational basis and taking the average (e.g., with two orthogonal spin configurations |0⟩ and |1⟩), which can be measured using existing measurement techniques).

Once the measurements 1460 are performed, the results (e.g., the calculated $F_p$ determined by taking the average over many $H_C$) can be fed back to an optimizer 1470, such as a classical computer, to search for the optimal parameters ($\vec{\gamma}*,\vec{\beta}*$) so as to maximize $F_p(\vec{\gamma},\vec{\beta})$, $$\left(\vec{\gamma}^*,\vec{\beta}^*\right) = \underset{\vec{\gamma},\vec{\beta}}{\mathrm{argmax}} F_p\left(\vec{\gamma},\vec{\beta}\right). \qquad \text{Equation 7}$$

The performance of QAOA can, in some embodiments, be benchmarked based on the approximation ratio:

$$r = \frac{F_p\left(\vec{\gamma}^*,\vec{\beta}^*\right)}{C_{max}} \qquad \text{Equation 8}$$

In some embodiments, r characterizes how good the solution provided by QAOA is. The higher the r value, the better the solution.

In some embodiments, without being bound by theory, this QAOA framework can be applied to general combinatorial optimization problems. In one example, an archetypical problem called MaxCut can be considered.

Figure 14B:
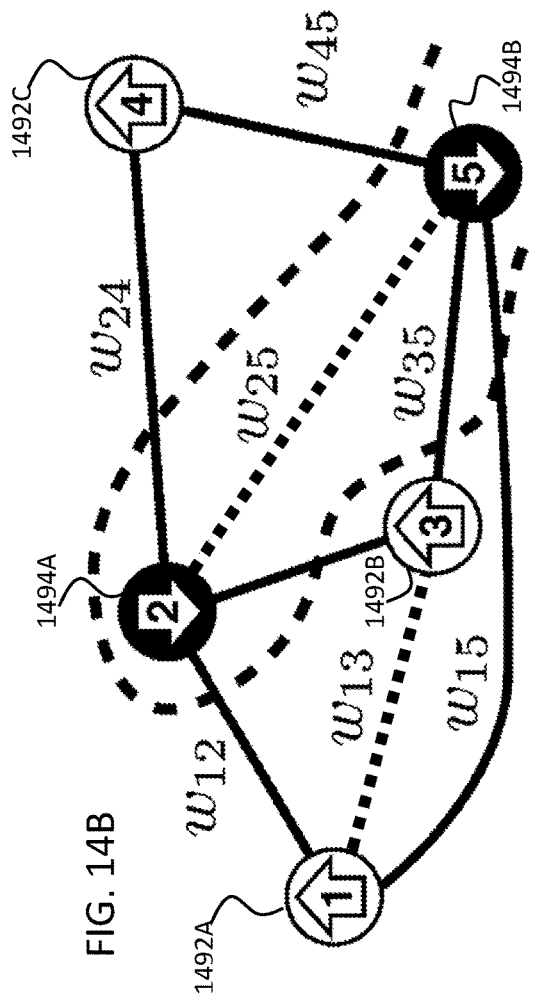
FIG. 14B is an illustration of an example MaxCut problem, according to some embodiments.

FIG. 14B shows an example of a MaxCut problem, according to some embodiments. A MaxCut problem can be described for an input graph G=(V, E). Here, V={1, 2, . . . , N} denotes the set of vertices (shown as up and down spins 1492A, 1492B, 1492C, 1494A, 1494B) and E={(⟨ i, j⟩, $w_{ij}$)} is the set of edges (shown with solid and dotted lines), where $w_{ij} \Sigma \mathbb{R}_{\geq 0}$ is the weight of the edge ⟨ i, j⟩ connecting vertices i and j. For example, the edge connecting the two up spins 1492A, 1492B has a weight of $w_{13}$. The goal of MaxCut is to maximize the following objective function:

$$H_C = \sum_{(i,j)} \frac{w_{ij}}{2}(1 - \sigma_i^z \sigma_j^z), \qquad \text{Equation 9}$$

where an edge ⟨ i, j⟩ contributes with weight $w_{ij}$ if and only if spins $\sigma_i^z$ and $\sigma_j^z$ are anti-aligned. For example, the curved dashed line shows a cut through all edges of spins that are anti-aligned, excluding edges $w_{13}$ and $w_{25}$, which are aligned.

Exemplary Combinatorial Problems

While embodiments of the present disclosure discuss MaxCut on d-regular graphs, where every vertex is connected to exactly d other vertices, based on the present disclosure a person of skill in the art would understand that the aspects of QAOA described herein would be applicable to other types of combinatorial problems such as, but not limited to MaxCut problems on other types of graphs, Maximum Independent Set problems, and others. Two types of d-regular MaxCut graphs are considered: (1) unweighted d-regular graphs (udR), where all edges have equal weight $w_{ij}=1$; and (2) weighted d-regular graphs (wdR), where the weights $w_{ij}$ are chosen uniformly at random from [0,1] (though other weights other than the interval [0,1] can be selected in other embodiments).

It is NP-hard to design an algorithm that guarantees a minimum approximation ratio of r*≥16/17 for MaxCut on all graphs, or r*≥331/332 when restricted to unweighted 3 regular graphs ("u3R") discussed above.

According to some embodiments, QAOA presents several benefits. For certain cases, it achieves a guaranteed minimum approximation ratio when p=1. Additionally, under some reasonable complexity-theoretic assumptions, QAOA may not be efficiently simulated by any classical computer even when p=1, making a candidate algorithm for "quantum supremacy," or the ability of a quantum computer to perform calculations that a traditional computer cannot. The square-pulse ("bang-bang") ansatz of dynamical evolution, of which QAOA can be one example, can be optimal given a fixed quantum computation time. In general, the performance of QAOA can improve with increasing p, achieving r→1 as p→∞ since it can approximate adiabatic quantum annealing via Trotterization. This monotonicity makes it more attractive than quantum annealing, whose performance may decrease with increased run time.

While some embodiments of QAOA have a simple description, not much is currently understood beyond p=1. For the example problem of MaxCut on u2R graphs, (such as 1D antiferromagnetic rings,) QAOA may yield r≥(2p+1)/(2p+2) as determined by numerical evidence. In another example, such as Grover's unstructured search problem among n items, QAOA can find the target state with p=Θ($\sqrt{n}$), achieving the optimal query complexity within a constant factor. In some embodiments, for more general problems, a simple brute-force approach can be used by discretizing each parameter into O(poly(N)) grid points. However, this technique requires examining $N^{O(p)}$ possibilities at level p, which can become impractical to calculate using typical computers as p grows. Embodiments of the present disclosure therefore address efficient optimization of QAOA parameters and understanding of the algorithm for 1<<p<∞.

Exemplary Heuristics for Parameter Optimization

Some embodiments of the present disclosure relate to techniques for optimizing variational parameters. As described in more detail below, patterns in optimal parameters can be exploited to develop a heuristic optimization strategy for more quickly identifying the optimal variational parameters. In some examples described below, parameters identified for level-p QAOA can be used to more quickly optimize parameters for level-(p+1) QAOA, thereby producing a good starting point for optimization. These techniques provide improvements over brute-force techniques. In some embodiments, parameters identified for level-q QAOA, for any q<p, can be used to more quickly optimize parameters for level-p QAOA. Further, while some examples discuss randomly generated instances of u3R and w3R, similar results can be found when applying these techniques to u4R and w4R graphs, as well as complete graphs with random weights (or the Sherington-Kirkpatrick spin glass problem. These other exemplary u3R, w3R, u4R, and w4R graphs are regular graphs, meaning, for example, that each vertex has the same number of neighbors (3 or 4 respectively). The letters u and the w can refer to whether one considers unweighted or weighted graphs, respectively. In some embodiments, these graphs are useful as test samples. The patterns in the optimal parameters identified herein are used to develop example heuristic strategies that can efficiently find quasi-optimal solutions in O(poly(p)) time.

In some embodiments it is possible to eliminate degeneracies in the parameter space due to symmetries. For example, generally, QAOA can have a time-reversal symmetry, $F_p(\vec{\gamma}, \vec{\beta}) = F_p(-\vec{\gamma}, -\vec{\beta})$, since both $H_B$ and $H_C$ are real-valued. For QAOA applied to MaxCut, there can be an additional $Z_2$ symmetry, as $e^{-i(\pi/2)H_B} \equiv (\sigma^x)^{\otimes N}$ commutes through the circuit. Furthermore, the structure of the MaxCut problem on udR graphs can create redundancy since $e^{-i\pi H_C} = 1$ if d is even, and $(\sigma^z)^{\otimes N}$ if d is odd. These symmetries make it possible to restrict $$\beta_i \in \left[-\frac{\pi}{4}, \frac{\pi}{4}\right)$$

in general, and $$\gamma_i \in \left[-\frac{\pi}{2}, \frac{\pi}{2}\right)$$

for udR graphs.

In some embodiments, it is possible to numerically investigate the optimal QAOA parameters for MaxCut on random u3R and w3R graphs with vertex number $8 \leq N \leq 22$, using a brute-force approach. For each graph instance and a given level p, a random starting point (seed) in the parameter space can be chosen and a gradient-based optimization algorithm such as Broyden-Fletcher-Goldfarb-Shanno ("BFGS") can be used to find a local optimum $(\vec{\gamma}^L, \vec{\beta}^L)$ starting with this seed. In some embodiments, a local optimum can refer to a case where for a given choice of parameters $\beta$ and $\gamma$, the result always gets worse if the values of the parameters $\beta$ and $\gamma$ are changed slightly. However, for such local optima, the result might get better if the values of these parameters are instead changed drastically. Thus the optimum can be referred to as local optimum, not global optimum. In some embodiments, for each graph, it is possible to optimize the variational parameters to cause the solution to go to a local optimum by a local optimization method, such as one where the optimization only searches parameters close to the initial starting parameters. This local optimization can be repeated with sufficiently many different seeds to find the global optimum $(\vec{\gamma}*, \vec{B}*)$. In some embodiments, a global optimum may refer to the case where there is not a better choice of parameters. The global optimum can change from graph to graph. The degeneracies of the optimal parameters $(\vec{\gamma}*, \vec{\beta}*)$ can be reduced using the symmetries discussed above (e.g., by finding some (distinct) values of $\gamma$ and $\beta$ that are equivalent because they lead to exactly the same result and thus do not need to be considered individually). In some illustrative examples, the global optimum can be non-degenerate up to these symmetries.

In some embodiments, the process of identifying optimal parameters $(\vec{\gamma}*, \vec{\beta}*)$ can be repeated for additional random graphs, such as 100 u3R and w3R graphs with various vertex numbers N, which can draw out one or more patterns in the optimal parameters $(\vec{\gamma}*, \vec{\beta}*)$. In one example, the optimal $\gamma_i*$ can tend to increase smoothly with each iteration i=1, 2, . . . , p, while $\beta_i*$ can tend to decrease smoothly. For example, FIGS. 15A-15B show an example instance of optimal QAOA parameters $(\vec{\gamma}*, \vec{\beta}*)$ obtained for example instances of MaxCut on a 16-vertex unweighted 3-regular (u3R) graph at level p=7, according to some embodiments.

Figures 15A, 15B:
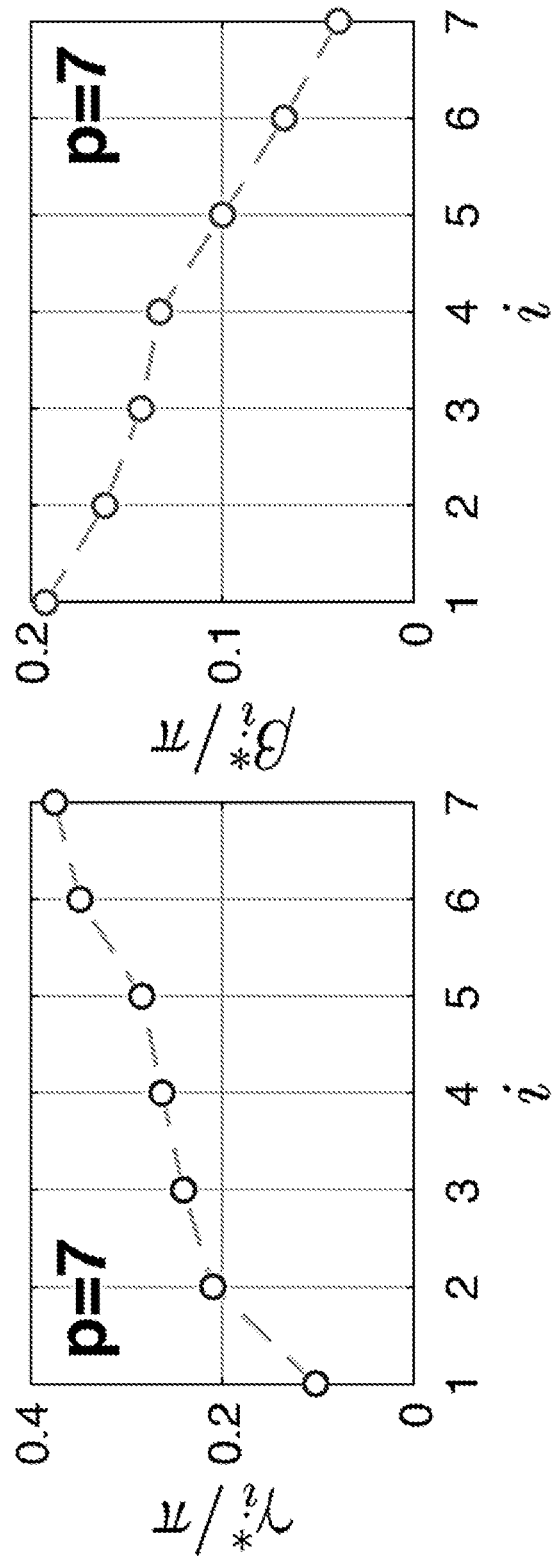
FIGS. 15A-15H are graphs showing QAOA optimal variational parameters, according to some embodiments.
Figures 15C, 15D, 15E:
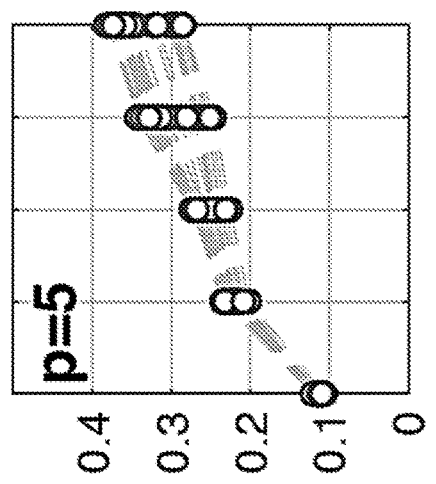
Figures 15F, 15G, 15H:
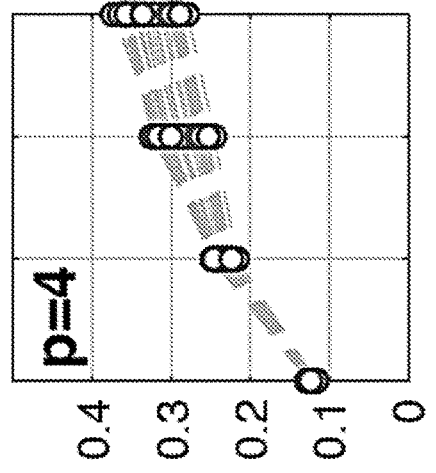

As shown in FIGS. 15A-15B, the parameters for level p=7 transition smoothly for each iteration i.

FIGS. 15C-15H shows a parameter pattern visualized by plotting the optimal parameters of 40 instances of 16-vertex u3R graphs (such as the example used to plot FIGS. 15A-15B), for $3 \leq p \leq 5$ as a function of iteration i, according to some embodiments. Each dashed line connects parameters for one particular graph instance. For each instance and each p, the classical BFGS optimization algorithm was used from $10^4$ random seeds (starting points), with the best parameters being kept. Similar patterns can be found for w3R graphs, which are discussed in more detail below. Furthermore, in some examples, for a given class of graphs, the optimal parameters can be observed to roughly occupy the same range of values as p is varied. This demonstrates a pattern in the optimal QAOA parameters that can be exploited in the optimization, as discussed in more detail below. Similar patterns are found for parameters up to $p \lesssim 15$, if the number of random seeds is increased accordingly.

FIGS. 21A-21F show graphs demonstrating optimal QAOA parameters $(\vec{\gamma}*, \vec{\beta}*)$ for 40 instances of 16-vertex weighted 3-regular (w3R) graphs, for $3 \leq p \leq 5$, according to some embodiments. Each dashed line connects parameters for one particular graph instance. For each exemplary instance and each p, the BFGS algorithm is used to optimize from $10^4$ random starting points, and the best parameters are kept as $(\vec{\gamma}*, \vec{\beta}*)$. FIGS. 21A-21F are analogous to the results of unweighted graphs in FIGS. 15C-15H. The spread of $\vec{\gamma}*$ for weighted graphs is wider than that for unweighted graphs shown in FIGS. 15C-15H. In some embodiments, this is because the random weights effectively increase the number of subgraph types. Moreover, the larger value for $\vec{\gamma}*$ for weighted graphs compared to unweighted graphs can be understood via the effective mean-field strength that each qubit experiences.

Notably, even at small depth, this parameter pattern can be reminiscent of adiabatic quantum annealing where $H_C$ is gradually turned on while $H_B$ is gradually turned off, in some embodiments. However, the mechanism of QAOA can be shown to go beyond the adiabatic principle, as discussed in more detail below. In addition, in some embodiments, the optimal parameters can have a small spread over many different instances. This can be because the objective function $F_p(\vec{\gamma}, \vec{\beta})$ can be a sum of terms corresponding to subgraphs involving vertices that are a distance$\leq$p away from every edge. At small p, there are only a few relevant subgraph types that enter into $F_p$ and can effectively determine the optimal parameters. As N→∞ and at a fixed finite p, the probability of a relevant subgraph type appearing in a random graph can approach a fixed fraction. This implies that the distribution of optimal parameters $(\vec{\gamma}*, \vec{\beta}*)$ can converge to a fixed set of values in this limit.

In some embodiments, the optimal parameter patterns observed above can indicate that generically, there is a slowly varying continuous curve that underlies the parameters $\gamma_i*$ and $\beta_i*$. In some embodiments, this curve changes only slightly from each level p to p+1. Based on these observations, a new parameterization of QAOA can be used, as well as a heuristic optimization strategy that can, without limitation, be referred to as "FOURIER." In some embodiments, the heuristic strategy uses information from the optimal parameters at level p to help optimization at level p+1 by producing good starting points. While this heuristic does not necessarily find the global optimum of QAOA parameters, it can produce, in O(poly(p)) time, quasi-optima that can only be surpassed with $2^{O(p)}$ number of brute-force runs. In some beneficial embodiments, this facilitates evaluation of the performance and mechanism of QAOA beyond p=1.

In some embodiments, QAOA can be re-parameterized based on the observation that the optimal QAOA parameters $\gamma_i^*$ and $\beta_i^*$ appear to be smooth functions of their index i. An alternative representation of the QAOA parameters can be implemented using Fourier-related transforms of real numbers, which permits reductions in the number of necessary parameters. Instead of using the 2p parameters $(\vec{\gamma}^*, \vec{\beta}^*) \in \mathbb{R}^{2p}$, FOURIER can instead use 2q parameters $(\vec{u}, \vec{v}) \in \mathbb{R}^{2q}$, where the individual elements $\gamma_i$ and $\beta_i$ are written as functions of $(\vec{u}, \vec{v})$ through the following transformation:

$$\gamma_i = \sum_{k=1}^{q} u_k \sin\left[\left(k - \frac{1}{2}\right)\left(i - \frac{1}{2}\right)\frac{\pi}{p}\right],$$ Equation 10

$$\beta_i = \sum_{k=1}^{q} v_k \cos\left[\left(k - \frac{1}{2}\right)\left(i - \frac{1}{2}\right)\frac{\pi}{p}\right].$$ Equation 11

In some embodiments, these transformations can be referred to as Discrete Sine/Cosine Transforms, where $u_k$ and $v_k$ can be interpreted as the amplitude of k-th frequency component for $\vec{\gamma}$ and $\vec{\beta}$, respectively. When $q \geq p$, this new parametrization can describe all possible QAOA protocols at level p.

Embodiments of the FOURIER strategy work by starting with level p=1, optimizing using an optimization function such as brute force for level p=1, and then using the optimum at level p to determine a starting point for level p+1. The starting points can be generated by re-using the optimized amplitudes $(\vec{u}^*, \vec{v}^*)$ of frequency components from level p extrapolated from the optimized parameters $(\vec{\gamma}^*, \vec{\beta}^*)$ to identify the parameters $(\vec{\gamma}^*, \vec{\beta}^*)$ for the level p+1. This can be repeated for increasing p.

Some embodiments include several variants of this strategy, examples of which are referred to as FOURIER[q, R] and INTERP, for optimizing p-level QAOA. Without limitation, embodiments of one of variants can be referred to as FOURIER [q, R], characterized by two integer parameters q and R. The first integer q can refer to the maximum frequency component allowed in the parameters $(\vec{u}, \vec{v})$, which can be the maximum value of k. If q=p, the full power of p-level QAOA can be utilized. However, since the smoothness of the optimal parameters $(\vec{\gamma}^*, \vec{\beta}^*)$ implies that only the low-frequency components are important, it is also possible to consider the case where q is a fixed constant independent of, but smaller than p, so the number of parameters is bounded even as the QAOA circuit depth increases.

In some embodiments, the second integer R can refer to the number of controlled random perturbations added to the parameters to escape a local optimum towards a better one. For example, where the optimization parameters $(\vec{\gamma}^*, \vec{\beta}^*)$ were identified at a local but not global optimum for the initial value p=1, perturbations can be introduced to avoid focusing only on that local optimum for increased values of p. Exemplary results discussed in the present disclosure implement the FOURIER[q, R] strategy with q=p and R=10 unless otherwise stated, but such as selection is not limiting.

In embodiments where q is chosen such that q=p, the strategy can be denoted as FOURIER[∞, R], since q grows unbounded with p. In embodiments of the FOURIER [∞, 0] variant of this strategy, a starting point is generated for level p+1 by adding a higher frequency component, initialized at zero amplitude, to the optimum at level p. For example, as shown in FIG. 22, according to some embodiments, from the optimized variational parameters 2212 $(\vec{u}_{(p-1)}^L, \vec{v}_{(p-1)}^L)) \in \mathbb{R}^{2p-2}$ at level p−1, the starting point 2222A $(\vec{u}_{(p)}^0, \vec{v}_{(p)}^0) \in \mathbb{R}^{2(p)}$ is generated according to:

$$\vec{u}_{(p)}^0 = (\vec{u}_{(p-1)}^L, 0), \quad \vec{v}_{(p)}^0 = (\vec{v}_{(p-1)}^L, 0).$$ Equation 12:

Using $(\vec{u}_{(p)}^0, \vec{v}_{(p)}^0)$ 2222A as a starting point, a BFGS optimization routine can be performed to obtain a local optimum 2224B $(\vec{u}_{(p)}^L, \vec{v}_{(p)}^L)$ for the level p. This is output to the next level of p, as the process continues.

Figure 22:
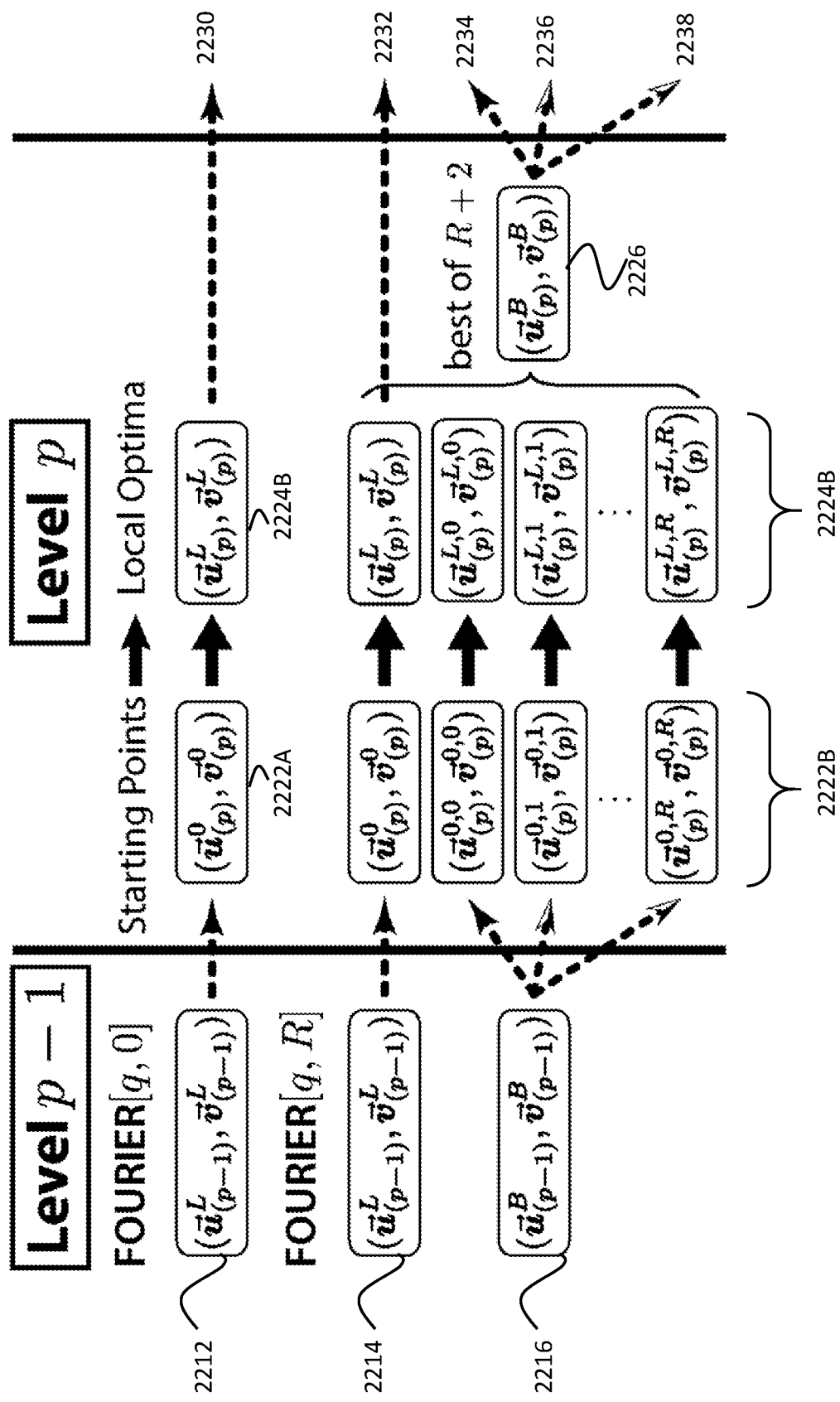
FIG. 22 is a schematic of two variants of a FOURIER[q, R] heuristic strategy, according to some embodiments.

In some embodiments, improvements over this technique can be gained with the strategy, FOURIER[∞, R>0], which is also shown in FIG. 22. In some embodiments, the strategy FOURIER[∞, 0] can become stuck at a sub-optimal local optimum. Accordingly, perturbing its starting point as is performed in FOURIER[∞, R>0] can greatly improve the performance of QAOA already seen with FOURIER[∞, 0].

As shown in FIG. 22, the technique begins at level p−1, according to some embodiments. In some embodiments of FOURIER[∞, R>0], in addition to optimizing according to the strategy FOURIER[∞, 0], the p-level QAOA can be optimized from R+1 extra starting points, R of which are generated by adding random perturbations to the best of all local optima $(\vec{u}_{(p-1)}^B, \vec{v}_{(p-1)}^B)$ found at level p−1. Specifically, for each instance at p-level QAOA, and for r=0, 1, . . . , R, optimization can start from $$\vec{u}_{(p)}^{0,r} = \begin{cases} (\vec{u}_{(p-1)}^B, 0), & r = 0 \\ (\vec{u}_{(p-1)}^B + \alpha \vec{u}_{(p-1)}^{P,r}, 0), & 1 \leq r \leq R \end{cases}$$ Equation 13

$$\vec{v}_{(p)}^{0,r} = \begin{cases} (\vec{v}_{(p-1)}^B, 0), & r = 0 \\ (\vec{v}_{(p-1)}^B + \alpha \vec{v}_{(p-1)}^{P,r}, 0), & 1 \leq r \leq R \end{cases}$$ Equation 14 where $\vec{u}_{(p-1)}^{P,r}$ and $\vec{u}_{(p-1)}^{P,r}$ contain random numbers drawn from normal distributions with mean 0 and variance given by $\vec{u}_{(p-1)}^B$ and $\vec{v}_{(p-1)}^B$:

$$[\vec{u}_{(p-1)}^{P,r}]_k \sim \text{Normal}(0, [\vec{u}_{(p-1)}^B]_k^2),$$ Equation 15

$$[\vec{v}_{(p-1)}^{P,r}]_k \sim \text{Normal}(0, [\vec{v}_{(p-1)}^B]_k^2),$$ Equation 16

In such embodiments, there is a free parameter a corresponding to the strength of the perturbation. In some non-limiting examples derived from trial and error, setting $\alpha=0.6$ can yield good results. This choice of $\alpha$ is assumed in the present disclosure unless otherwise stated. However, a person of skill in the art would understand that other values of $\alpha$ can be used, including dynamic values of $\alpha$ as needed depending on particular implementations.

In some embodiments, additional strategies can be used to take advantages of the parameter pattern indicated above. One exemplary strategy can use linear interpolation of optimal parameters at lower level QAOA to generate starting points for higher levels, which can be referred to without limitation as "INTERP." Both INTERP and FOURIER strategies are effective for the instances discussed throughout the present disclosure and are applicable to others as well. While FOURIER has demonstrated a slight edge in its performance in finding better optima when random perturbations are introduced, a person of skill in the art would understand from the present disclosure that INTERP is also an efficient way of improving QAOA and can present additional benefits. Embodiments of FOURIER[q, R] and INTERP are described below in more detail. However, additional techniques are contemplated by the present disclosure, such as the use of machine learning. Furthermore, although in aspects of the present disclosure, the heuristic strategies makes use of optimal variational parameters found at level-(p−1) QAOA to find initial variational parameters at level-p QAOA, a person of skill in the art would understand that optimal variational parameters found at level-m, for any m<p, can be used to design initial variational parameters at level-p QAOA.

In some variants of the FOURIER strategy, the number of frequency components q is fixed. These variants can be treated similarly to the strategies where q=p discussed above, except all $\vec{u}$ and $\vec{v}$ parameters can be truncated at the first q components. For example, when optimizing QAOA at level p≥q with the FOURIER[q,0] strategy, no further higher frequency components are added, and the starting point begins at $\vec{u}_{(p)}^0 = \vec{u}_{(p-1)}^L \in \mathbb{R}\,q$.

In some embodiments of the optimization strategy referred to as INTERP, linear interpolation can be used to produce a starting point for optimizing QAOA and an optimization routine can iteratively increase the level p. However, for purposes of the present discussion, p should be considered the same as p−1 in the discussion for the FOURIER strategy, as this is simply a matter of semantics for where to begin the algorithm. In some embodiments, this is based on the observation that the shape of parameters $(\vec{\gamma}_{(p+1)}^*, \vec{\beta}_{(p+1)}^*)$ closely resembles that of $(\vec{\gamma}_{(p)}^*, \vec{\beta}_{(p)}^*)$. For a given instance, QAOA is iteratively optimized by starting from p=1, obtaining local optimum parameters $(\vec{\gamma}_{(p)}^L, \vec{\beta}_{(p)}^L)$, and incrementing p to p+1. To optimize parameters for level p+1, optimized parameters from level p are used to produce starting points $(\vec{\gamma}_{(p+1)}^0, \vec{\beta}_{(p+1)}^0)$ according to:

$$[\vec{\gamma}_{(p+1)}^0]_i = \frac{i-1}{p}[\vec{\gamma}_{(p)}^L]_{i-1} + \frac{p-i+1}{p}[\vec{\gamma}_{(p)}^L]_i \quad \text{Equation 17}$$

for i=1, 2, . . . , p+1, where i denotes the i-th element of the vector. Here, $[\vec{\gamma}]_i \equiv \gamma_i$ denotes the i-th element of the parameter vector $\vec{\gamma}$, and $$[\vec{\gamma}_{(p)}^L]_0 \equiv [\vec{\gamma}_{(p)}^L]_{p+1} \equiv 0.$$

The expression for $\vec{\beta}_{(p+1)}^0$ can be the same as above after swapping γ↔β. Starting from $(\vec{\gamma}_{(p+1)}^0, \vec{\beta}_{(p+1)}^0)$, the BFGS optimization routine (or any other optimization routine) can be performed to obtain a local optimum $(\vec{\gamma}_{(p+1)}^L, \vec{\beta}_{(p+1)}^L)$ for the (p+1)-level QAOA. Finally, p can be incremented by one and the same process can be repeated until a target level is reached.

The INTERP strategy can also get stuck in a local optimum in some embodiments. Adding perturbations to INTERP can help but may not be as effective in some embodiments as with FOURIER. This may occur because the optimal parameters are smooth, and adding perturbations in the $(\vec{u}, \vec{v})$-space modify $(\vec{\gamma}, \vec{\beta})$ in a correlated way, which can enable the optimization to escape local optima more easily. However, a similar perturbation routine is contemplated.

As discussed above, the heuristic approaches described in the present disclosure constitute a significant improvement over brute force QAOA techniques. Non-limiting comparisons of example implementations are discussed below in the sections below.

Based on the present disclosure, a person of skill in the art would understand that the disclosed heuristic strategies could be implemented on a number of technical platforms. In the section below titled "Example QAOA Implementations" the MaxCut problem is considered as an example, although it can also be applied to solve other interesting problems.

Example Implementations with Quantum Systems

In some embodiments, large-size problems are suitable for implementation on quantum systems. Two aspects of such implementations (reducing the interaction range and examples with Rydberg atoms) are discussed in more detail below.

First, with regard to reducing the interaction range, in some quantum implementations, as discussed above, each vertex can be represented by a qubit. For a large problem size, a major challenge to encode general graphs is the necessary range and versatility of the interaction patterns (between qubits). The embedding of a random graph into a physical implementation with a 1D or 2D geometry may require very long-range interactions. By re-labelling the graph vertices, it is possible reduce the required range of interactions. Without being bound by theory, this can be formulated as the graph bandwidth problem: Given a graph G=(V, E) with N vertices, a vertex numbering is a bijective map from vertices to distinct integers, f:V→{1, 2, . . . , N}. The bandwidth of a vertex numbering f is, $B_f(G)=\max\{|f(u)-f(v)|:(u, v)\in E(G)\}$ which can be understood as the length of the longest edge (in 1D). The graph bandwidth problem is then to find the minimum bandwidth among all vertex numberings, i.e., $B(G)=\min/B_f(G)$; namely, it is to minimize the length of the longest edge by vertex renumbering.

In general, finding the minimum graph bandwidth is NP-hard, but good heuristic algorithms have been developed to reduce the graph bandwidth. FIGS. 20A-20E show a simple example of bandwidth reduction, according to some embodiments. FIGS. 20A, 20B illustrate the vertex renumbering with a 5-vertex graph. FIG. 20E shows the histogram of graph band-widths for 1000 random 3-regular graphs of N=400 each. Using the Cuthill-McKee algorithm, the graph bandwidth can be reduced to around B=100. While this still may require quite a long interaction range in 1D, the bandwidth problem can also be generalized to higher dimensions. In 2D arrangements, the radius of interaction can be considered to be $B_{2D} \sim \sqrt{100}$ for N=400 3-regular graphs, which is possible for quantum devices. FIGS. 20C and 20D show sparsity patterns of the adjacency matrix before and after vertex renumbering for one exemplary graph. While, in this illustrative example, the vertex renumbering technique is applied to the MaxCut problem, a person of skill in the art would understand based on the present disclosure that the same technique can be used for other combinatorial optimization problems such as maximum independent set problems.

In some embodiments, a general construction can be used to encode any long-range interactions to local fields by including additional physical qubits and gauge constraints. It is also possible to restrict to special graphs that exhibit some geometric structures. For example, unit disk graphs are geometric graphs in the 2D plane, where vertices are connected by an edge only if they are within a unit distance. These graphs can be encoded into 2D physical implementations, and the MaxCut problem is still NP-hard on unit disk graphs.

In some embodiments, the above discussion of QAOA has been platform independent, and is applicable to any state-of-the-art platforms. Exemplary platforms include neutral Rydberg atoms, trapped ions, and superconducting qubits. Although the following discussion focuses on an implementation of QAOA with neutral atoms interacting via Rydberg excitations, where high-fidelity entanglement has been recently demonstrated, other implementations are contemplated.

Figure 20F:
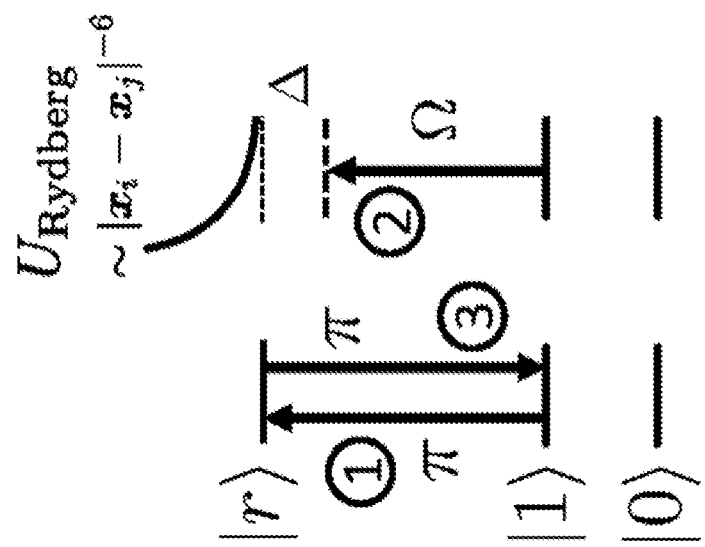

In some embodiments, it is possible to implement control over the interaction between individual atoms according to a given graph. In some embodiments, in this way it is possible to control which types of problems are to be solved. Since the interactions can specify the problem, controlling the interactions is one way to control the problem. As discussed in more detail above, in an exemplary Rydberg implementation, the hyperfine ground states in each atom can be used to encode the qubit states $|0\rangle$ and $|1\rangle$, and the $|1\rangle$ state can be excited to the Rydberg level $|r\rangle$ to induce interactions. The qubit rotating term, exp $$\left(-i\beta \sum_{j=1}^{N} \sigma_j^x\right)$$

can be implemented by a global driving beam with tunable durations. The interaction terms $\Sigma_{(i,j)} \sigma_i^z \sigma_j^z$ can be implemented stroboscopically for general graphs; this can be realized by a Rydberg-blockade controlled gate, as illustrated in FIG. 20F. For example, FIG. 20F shows a protocol to use Rydberg-blockade controlled gate to implement the interaction term $\exp(-i\gamma \sigma_i^z \sigma_j^z)$. For example, FIG. 20F shows how to realize a specific component of the interaction term by first applying a pi-pulse to a control qubit, second applying a pulse with coupling strength $\Omega$ and detuning $\Delta$ to a target qubit, and following this pulse with another pi-pulse on the control qubit. By choosing a proper gate time for the second step, such as $(t=2\pi/\sqrt{\Omega^2+\Delta^2})$, the population on the Rydberg level $|r\rangle$ may not be accumulated. With tunable coupling strength $\Omega$ and detuning $\Delta$, it is possible to control the interaction time $\gamma$.

By controlling the coupling strength $\Omega$, detuning $\Delta$, and the gate time, together with single-qubit rotations, it is possible to implement $\exp(-i\gamma \sigma_i^z \sigma_j^z)$, which can then be repeated for each interacting pair. In this way, it is possible to choose which pairs should interact, and thus control which problem to solve. In some embodiments, an additional advantage of the Rydberg-blockade mechanism is its ability to perform multi-qubit collective gates in parallel. This can reduce the number of two-qubit operation steps from the number of edges to the number of vertices, N, which means a factor of N reduction for dense graphs with $\sim N^2$ edges. While the falloff of Rydberg interactions may limit the distance two qubits can interact, MaxCut problems of interesting sizes can still be implemented by vertex renumbering or focusing on unit disk graphs, as discussed above. Furthermore, implementing ancillary vertices discussed in the present disclosure can be used to increase the length of interactions.

Without being bound by theory, in some embodiments, for generic problems of 400-vertex regular graphs, the interaction range can be on the order of 5 atoms in 2D. This can be determined by assuming a minimum inter-atom separation of 2 μm, which means an interaction radius of 10 μm, which is realizable with high Rydberg levels. Given examples of coupling strength $\Omega \sim 2\pi \times 10\text{-}100$ MHz and single-qubit coherence time $\tau \sim 200$ μs (limited by Rydberg level lifetime), with high-fidelity control, the error per two-qubit gate can be made roughly $(\Omega\tau)^{-1} \sim 10^{-3}\text{-}10^{-4}$. For 400-vertex 3-regular graphs, QAOA of level $p \approx \Omega\tau/N \sim 25$ can be implemented with a 2D array of neutral atoms. Advanced control techniques such as pulse-shaping would increase the capabilities of QAOA in such systems. Furthermore, QAOA may not be sensitive to some of the imperfections present in existing implementations with Rydberg atoms.

The following sections explore additional examples and embodiments of the present disclosure. The present disclosure is not limited by the theory described herein, which is merely meant for illustration of some aspects of operational principles that underly some embodiments of the present disclosure.

Quantum Annealing for Random UD-$M_{IS}$

Figure 5:
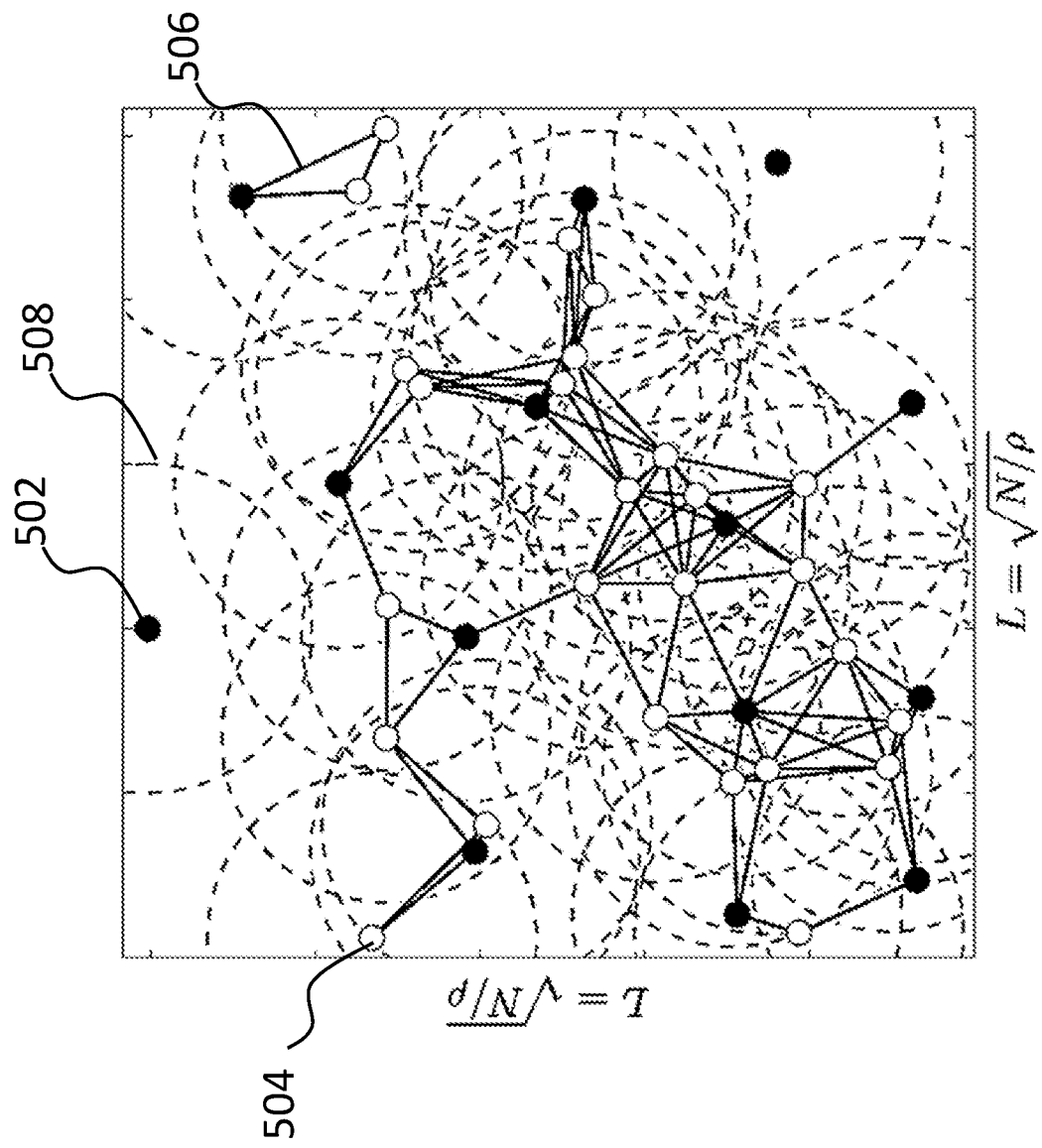
FIG. 5 is an example random unit disk graph, according to some embodiments.

In some embodiments, quantum optimization algorithms such as quantum annealing algorithm (QAA) can be used for random UD-$M_{IS}$ problems. As discussed above, the maximum independent set problem on random unit disk (UD) graphs is only one type of problem that is contemplated by the present disclosure. For QAA with UD graphs, a random UD graphs can be parameterized by two parameters: the number of vertices N and the 2D vertex density ρ. As shown in FIG. 5, the unit distance can be taken to be $r=1$, and the vertices are put into a box of L×L, where $L=\sqrt{N/\rho}$, in some embodiments. In particular, FIG. 5 shows an example of a random unit disk graph with N=40, ρ=1.5, |MIS|=14, and 93 edges. Without being bound by theory, for a random UD graph with density ρ, the average vertex degree is approximately πρ. To minimize the finite-size boundary effect, periodic boundary conditions are used for UD graphs in numerical simulations discussed in the present disclosure. However, such conditions are not necessary.

As discussed above, a QAA for MIS can be performed using the following Hamiltonian:

$$H_{QA}(t) = \sum_{v \in V} (-\Delta(t) n_v + \Omega(t) \sigma_v^x) + \sum_{(u,w) \in E} U n_u n_w \qquad \text{Equation 18}$$

The QAA can be designed by first initializing all qubits in $|0\rangle$ at time t=0, which is the ground state of $H_{QA}(t=0)$ when $\Delta(t=0)<0$ and $\Omega(t=0)=0$ (with U>0). The parameters can then be changed, for example by first turning on $\Omega(t)$ to a non-zero value, sweeping $\Delta(t)$ to a positive value, and finally turning off $\Omega(t)$ again. Without being bound by theory, the exemplary annealing protocol discussed throughout the present disclosure can be specified by $$\Delta(t)=(2s-1)\Delta_0, \ \Omega(t)=\Omega_0 \sin^2(\pi s) \text{ with } s=t/T. \quad \text{Equation 19:}$$

If the time evolution is sufficiently slow, then by the adiabatic theorem, the system can follow the instantaneous ground state, ending up in the solution to the MIS problem. $\Omega_0=1$ can be considered the unit of energy, and it is possible to fix $\Delta_0/\Omega_0=6$, which in non-limiting examples has been identified as a good ratio to minimize nonadiabatic transitions.

In some embodiments, quantum annealing can be explored on random unit disk graphs, with N vertices and density ρ. In some embodiments, in the limit of $\Delta_0, \Omega_0 \ll U$, the non-independent sets are pushed away by large energy penalties and can be neglected. In some implementations, this can correspond to the limit where the Rydberg interaction energy is much stronger than other energy scales. Without being bound by theory, in some examples in this limit, the wavefunction can be restricted to the subspace of all independent sets, such as:

$$\mathcal{H}_{IS} = \{ |\psi\rangle : n_v n_w |\psi\rangle = 0 \text{ for any } (v,w) \in E \} \quad \text{Equation 20:}$$

in the exemplary numerical simulation discussed herein, which allows for access to a much bigger system size up to N~50 since $\dim(H_{IS}) \ll 2^N$. First, in an example, the subspace of all independent sets can be found by a classical algorithm, the Bron-Kerbosch algorithm, and the Hamiltonian in equation 18 can then be projected into the subspace of all independent sets. The dynamics with the time-dependent Hamiltonian can be simulated by dividing the total simulation time t into sufficiently small discrete time steps τ and at each small-time step, a scaling and squaring method with a truncated Taylor series approximation can be used to perform the time evolution without forming the full evolution operators.

In some embodiments, exemplary time scales for adiabatic quantum annealing to perform well can be explored. In some examples, this time scale can be governed by the minimum spectral gap, εgap, where the runtime required can be $T=O(1/\epsilon_{gap}^2)$. However, the minimum spectral gap can be considered to be ambiguous when the final ground state is highly degenerate, since it is possible for the state to couple to an instantaneous excited state as long as it comes down to the ground state in the end. For an example generic graph, there can be many distinct maximum independent sets (the ground state of $H_P$ can be highly degenerate). So instead of finding the minimum gap, a different approach can be taken to extract the adiabatic time scale.

In some embodiments, in the adiabatic limit, the final ground state population (including degeneracy) can take the form of the Landau-Zener formula $P_{MIS} \approx 1 - e^{a-T/T_{LZ}}$, where a is a constant and $T_{LZ}$ is the adiabatic time scale. In embodiments of the nondegenerate case, it is typical to have $T_{LZ}=O(1/\epsilon_{gap}^2)$. In the more general case, the time scale $T_{LZ}$ can be extracted by fitting to this expression. However, in some examples, the simple exponential form holds only in the adiabatic limit, where $T \gtrsim T_{LZ}$. Hence, for each graph instance, it is possible to search for the minimum T such that the equation holds. For example, T can be adaptively doubled iteratively (from $T_{min}=5$) until the minimum T* is found such that $P_{MIS} > 0.9$, at which it is possible to assume, in some embodiments, that the time evolution lies in the Landau-Zener regime. The dynamics can then be simulated for another three time points 1.5T*, 2T*, and 2.5T*, before finally fitting to the equation from T* to 2.5T* to extract the time scale $T_{LZ}$.

Figure 6:
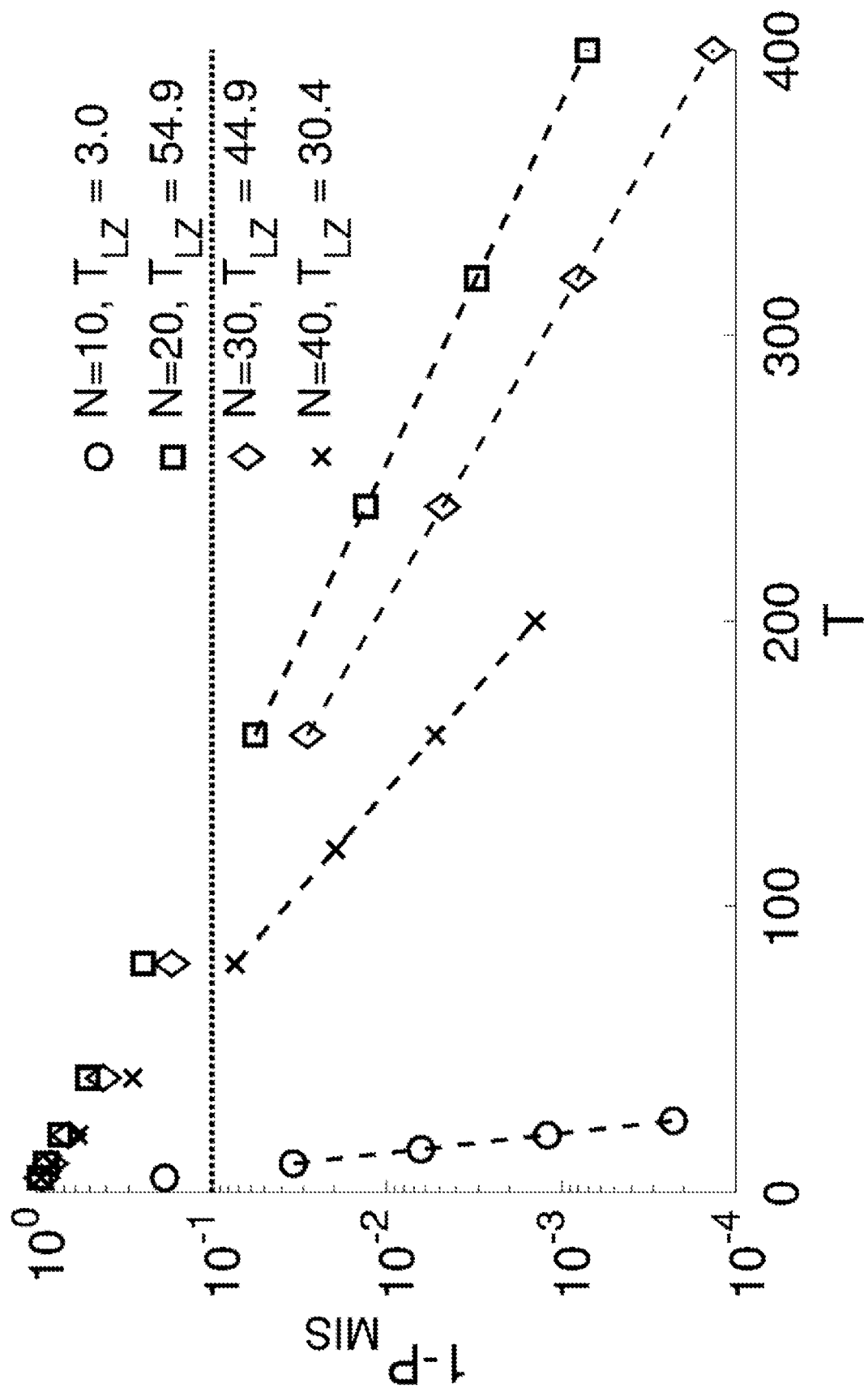
FIG. 6 is a graph showing a method to extract the adiabatic time scale $T_{LZ}$, according to some embodiments.

The fitting has been shown in some examples to be effective for most instances. For example, FIG. 6 shows the Landau-Zener fitting to $1-P_{MIS}=e^{a-T/T_{LZ}}$ to extract the adiabatic time scale $T_{LZ}$. Here, four random unit disk graphs with N=10, 20, 30, 40 are plotted. For each exemplary instance, the first Tis found iteratively such that $P_{MIS}(T)>0.9$, denoted as T*. The fitting is then performed on four points T*, 1.5T*, 2T*, 2.5T* to extract the time scale $T_{LZ}$. It is possible to drop the few graphs where the goodness-of-fit $R^2<0.99$. In some embodiments, this procedure can be performed to extract $T_{LZ}$ for up to 30 graph instances at each N and ρ. From these, the median can be taken, which can be used to produce the full phase diagram in terms of $T_{LZ}$ as plotted in FIG. 4A described above.

Figure 7A:
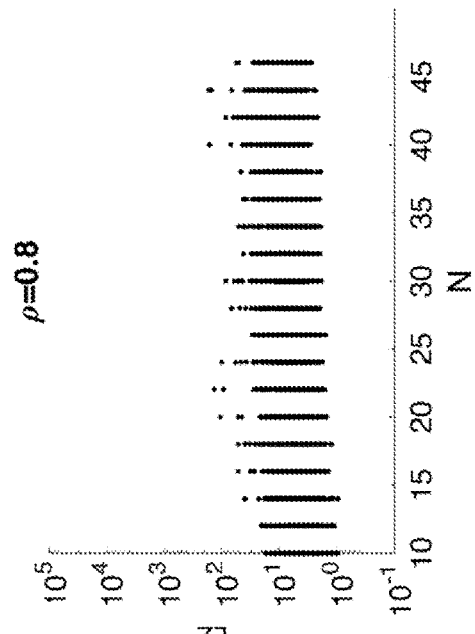
FIGS. 7A-7C are graphs showing aspects of the adiabatic time scale $T_{LZ}$, according to some embodiments.
Figure 7B:
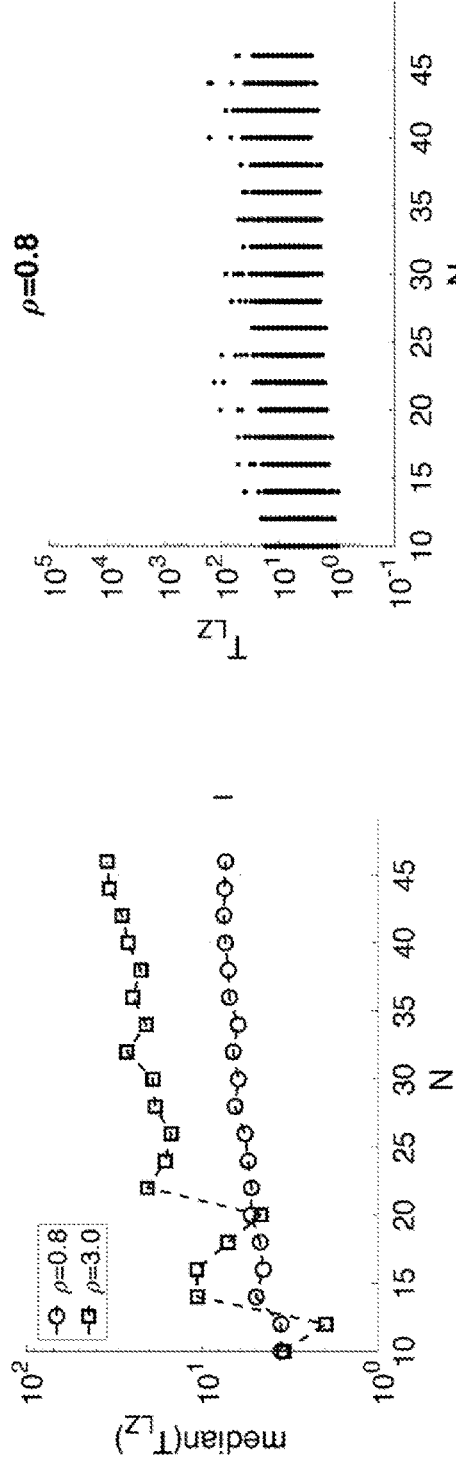
Figure 7C:
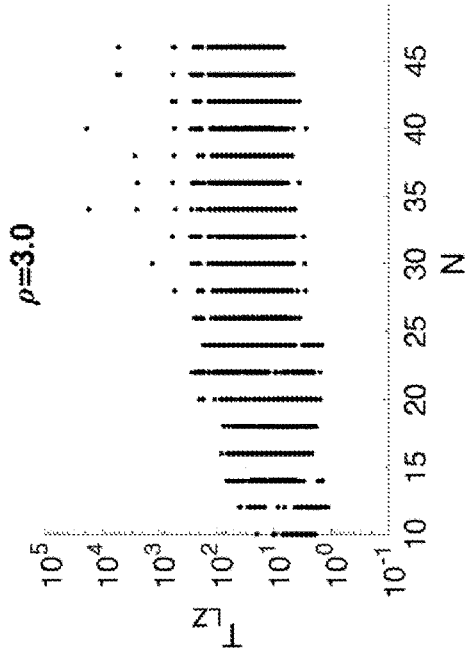

FIGS. 7A-7C show the adiabatic time scale $T_{LZ}$ at some fixed densities. More particularly, FIGS. 7A-7C show 200 random unit disk graphs that are simulated for QAA for system sizes up to N=46. FIG. 7A plots the median $T_{LZ}$, while FIGS. 7B and 7C plot $T_{LZ}$ for individual instances for ρ=0.8 and ρ=3. FIGS. 7A-7C show the scaling of $T_{LZ}$ with N at some fixed densities ρ=0.8 (below the percolation threshold) and ρ=3 (above the percolation threshold). FIG. 7A shows a clear separation between ρ=0.8 and ρ=3, according to some embodiments. However, the scaling of N is unclear, which can be due to a finite-size effect: $N \gtrsim 100$ may be a better condition to show scaling. FIGS. 7B and 7C also show the spread of $T_{LZ}$ for each instance. It can be seen that some exemplary hard instances require significantly longer $T_{LZ}$ than the typical instance, though even on average $T_{LZ}>10$ for ρ=3, $N \gtrsim 20$.

Figure 8:
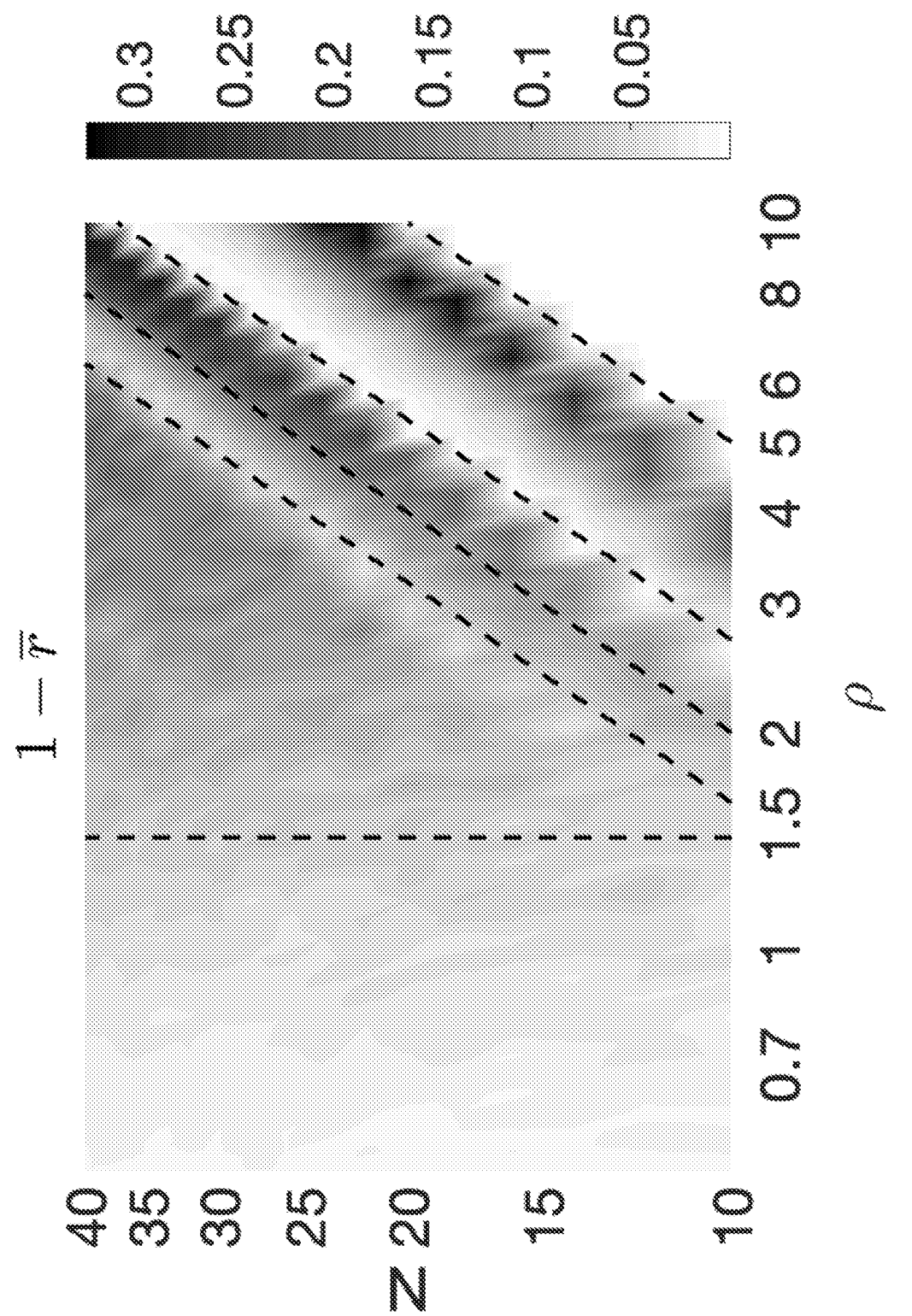
FIG. 8 is a phase diagram for a quantum algorithm in terms of an approximation ratio r, according to some embodiments.

While some embodiments discussed above focused mainly on the capacity of exemplary algorithms to solve MIS exactly, it is also possible to identify whether the algorithms can solve MIS approximately, for example in the sense of finding an independent set as large as possible. For some exemplary quantum algorithms, without being bound by theory, the approximation ratio r can be used to gauge performance for approximations. For example, for a quantum algorithm (such as a quantum annealer) that outputs a state $|\psi\rangle$, it is possible to write $r = \Sigma_i \langle \psi_i | n_i | \psi_i \rangle /|MIS|$, where |MIS| is the size of the MIS. In other words, r can quantify the ratio of the average independent-set size found by measuring the output quantum state to the maximum independent-set size. FIG. 8 shows an exemplary analogous phase diagram in terms of the approximation ratio r by simulating quantum annealing at a fixed time $T=10/\Omega_0$, averaged over 30 graph instances per N and ρ (the same instances as in FIG. 4B discussed above), according to some embodiments. The vertical dashed line corresponds to the percolation ratio at $\rho=\rho_c \approx 1.436$, while the sloped dashed lines correspond to optimal disk packing. FIG. 8 shows qualitatively the same features as the ground state population discussed above with reference to FIG. 4B, but the finite-size effect is stronger due to the small discrete |MIS| values at large densities.

Generalizations to Arbitrary Graph Structure Beyond UD Graphs

Stroboscopic Evolution

As discussed above, it is possible to generalize the exemplary implementation discussed above to address MIS problems on graphs, G=(V, E) that are beyond the UD paradigm.

In some embodiments, the quantum algorithms discussed above with reference to the UD paradigm involve evolution with a Hamiltonian $H(t)=\Sigma_v \Omega_v(t) \sigma_v^x - \Delta(t) n_v + \Sigma_{(u,v) \in E} U n_u n_v$. In exemplary embodiments where $U \gg |\Omega|, |\Delta|$, the dynamics can be effectively restricted to the independent set space His. Without being bound by theory, in some embodiments to generate such evolution with a Hamiltonian corresponding to a general graph structure, a Trotterized version of the time evolution operator can be considered:

$$\mathcal{T}\exp\left(-i\int_0^T dt H(t)\right) \approx \prod_j \mathcal{U}(t_j) \equiv \prod_j \exp(-i(t_{j+1}-t_j)H(t_j)) \quad \text{Equation 21}$$

where the time interval [0,T] is sliced defining times $t_j$ such that $\Sigma_j t_j = T$ and $t_{j+1}-t_j \ll \sqrt{D_{max}}\Omega(t_j), |\Delta(t_j)|$. Here $D_{max}$ can denote the maximum degree of the graph. Each $U(t_j)$ can be further Trotterized as follows $$\mathcal{U}(t_j) \approx \prod_{v=1}^{N} \mathcal{U}_v(t_j) =$$

$$\prod_{v=1}^{N} \exp\left(-i(t_{j+1}-t_j)\left(\Omega_v(t_j)\sigma_v^x - \Delta_v(t_j)n_v + \frac{1}{2}\sum_{u\in N(v)} U n_u n_v\right)\right) \quad \text{Equation 22}$$

In other words, it can be split into a product of terms $\mathcal{U}_v$ that each are associated with the evolution of one spin, v. Here $\mathcal{N}$ (v) can denote the neighbors of v on the graph. Note that in the U→∞ limit this can be written as $$\mathcal{U}_v(t_j) = \exp(-i(t_{j+1}-t_j)(\Omega_v(t_j)\sigma_v^x - \Delta_v(t_j)n_v)) \prod_{u\in N(v)} |0\rangle_u\langle 0| \quad \text{Equation 23}$$

This is a simple single qubit rotation of atom v, conditioned in some embodiments on the state of the atoms corresponding to neighbors of v being $|0\rangle$. If at least one of the neighbors is in state $|1\rangle$, atom v may not evolve.

Implementation Using Qubit Hyperfine Encoding

In some embodiments it is desirable to add further control of a quantum system in order to specify interactions between particular pairs or subsets of qubits. One exemplary approach to implement the corresponding dynamics with individually controlled neutral atoms can take advantage of qubit states $|0\rangle$ and $|1\rangle$ encoded in two (non-interacting) hyperfine states, in the internal atomic ground state manifold. In other words, when implementing other forms of graphs, it is possible to iterate through desired interactions between individual pairs (or sets) of qubits.

In some embodiments, the atoms can be positioned on the points of a 2D square lattice with distance g. To realize a single step, $U_v(t_j)$, the atoms, u, can be excited that correspond to neighbors of v on the graph (u∈ $\mathcal{N}$ (v)), selectively from the state $|1\rangle$ to a Rydberg S-state $|1'\rangle$. In some embodiments, a grid length $g \ll r_B$ can be chosen such that none of the atoms u∈ $\mathcal{N}$ (v) interact during this process. Atom v can then be driven to realize the single qubit rotation in the hyperfine manifold, for example with a unitary, such as, but not limited to, a physical operation that can be performed deterministically such as driving the atom with a laser to cause a quantum state evolution corresponding to an evolution with $\Omega_v(t)\sigma_v^x - \Delta_v(t)n_v$, where $\sigma_v^x$ couples the two hyperfine qubit states of atom v, and $n_v$ counts if atom v is in hyperfine state $|1\rangle$. In some embodiments, to realize this rotation, an individually addressed two-step excitation can be used that can couple the two hyperfine states $|0\rangle$ and $|1\rangle$ of atom v via a transition through a Rydberg P-state (for example, by first exciting the atom from the state $|0\rangle$ to a Rydberg P state with a first laser pulse, and then changing its state from the Rydberg P state to the state $|1\rangle$ with a second laser pulse). In some embodiments, if all atoms u are in the state $|0\rangle$, then this process may not be disturbed, but if at least one of the neighbors is the Rydberg S state, the strong S-P interaction can give rise to a blockade mechanism that prevents the rotation of the qubit v, thus realizing exactly equation 23. Note that in some embodiments this may require a different scale of interaction length of the blockade radius for two atoms in the Rydberg S-states on one hand, and the S-P blockade radius on the other hand because these two interactions scale differently with separation of the atoms: the S-P interactions decay as $1/x^3$ (much slower than the S-S interactions that scale like $1/x^6$), which makes it possible to implement collective gate with high fidelity. Accordingly, it is possible to apply quantum optimization to MIS problems on graphs that are more general than the unit disk graphs.

Maximum Independent Sets for Unit Disk Graphs

Without being bound by theory, this section addresses some aspects of $M_{IS}$ problems on unit disk graphs that can be solved according to the techniques described in the present disclosure. FIG. 5 shows a unit disk graph with vertices 502, 504, some of which are connected by edges 506 when they fall within a radius r of one another, as represented by disks 508, according to some embodiments. The problem can be formulated as minimizing the energy of:

$$H_{UD} = \sum_{v\in V} -\Delta n_v + \sum_{w>v} V_{UD}(|\vec{x}_v - \vec{x}_w|)n_v n_w, \quad \text{Equation 24}$$

where:

$$V_{UD}(x) = \begin{cases} U, & x \leq r \\ 0, & x > r \end{cases} \quad \text{Equation 25}$$

which is a subclass of $H_P$ (2). This problem can be proved to be NP-complete by reducing it from $M_{IS}$ on planar graphs of maximum degree 3. Since, in some embodiments, analysis of the computational complexity associated with the Rydberg Hamiltonian (Equation 2) discussed herein is based on a similar reduction, it can be instructive to review the following theorem and its proof: $M_{IS}$ on unit disk graphs is NP-complete.

Without being bound by theory, this theorem can be proven as follows: (1) $M_{IS}$ on planar graphs with maximum degree 3 is NP-complete. (2) A planar graph $\mathcal{G}$ =(V, ε), with vertices V and edges ε, with maximum degree 3 can be embedded in the plane using $\mathcal{O}(|V|)$ area in such a way that its vertices are at integer coordinates, and its edges are drawn by joining line segments on the grid lines x=i×g or y=j×g, for integers i and j, and grid spacing g. (3) One can replace each edge {u, v} of $\mathcal{G}$ by a path having an even number, $2k_{u,v}$, of ancillary vertices, in such a way that a UD graph, G=(V, E) with vertices V and edges E, can be constructed. It is straightforward to verify that $\mathcal{G}$ has an independent set S ⊂ V such that |S|≤a if and only if G has an independent set S ⊂ V such that $|S|\leq a'=a+\Sigma_{\{u,v\}\in \epsilon} k_{u,v}$.

In some embodiments, this theorem shows that it is NP-complete to decide whether the ground state energy of $H_{UD}$ is lower than $-a'\Delta$. In some embodiments, the transformation in the proof of this theorem does not fully determine the actual positions of the ancillary vertices in the 2D plane. In some embodiments, a particular arrangement can be specified consistent with the requirements of this transformation. Once Rydberg interactions are considered, the interaction strength between each pair of qubits can be fixed in a way that takes into account the distance of the atoms.

Given an edge {u, v} of the graph $\mathcal{G}$ embedded on a grid, the length of this edge can be denoted by $g \times \ell_{u,v}$ with $\ell_{u,v}$ an integer, and g the grid unit length, in some embodiments. First, an ancillary vertex can be placed on the $\ell_{u,v}-1$ grid point along the edge, separating the edge in $\ell_{u,v}$ segments of length g. An integer $k \geq 3$ can be selected and equally spaced 2k ancillary vertices can be placed along each segment, dividing it into 2k+1 pieces of equal length d=g/(2k+1). In some embodiments, irregular vertices can be used to ensure that the number of ancillary spins on each edge is even. In some embodiments, however, the total number of spins on each edge might be different. If $\ell_{u,v}$ is even, one segment can be chosen and the $4\phi+2$ ancillary vertices close to the center of this segment can be replaced with $4\phi+1$ ancillary vertices, that are equally spaced by a distance $$D = d + \frac{d}{4\phi},$$

for some integer $\phi$ to be determined. Such segments can be referred to as "irregular segments", and to the vertex at the center of the irregular segment can be referred to as an irregular vertex. In some embodiments, these exceptions are made to ensure that the total number of ancillary vertices along each edge {u, v}∈ε, $2k_{u,v}$, is even in order to ensure that the ancillary vertices transfer the independent set constraint without changing the nature of the problem to be solved. Following this arrangement, the nearest-neighbor distance of the ancillary vertices can be either d or D. Setting the unit disk radius to $r=D+0^+$ can produce the unit disk graph G. The positions of the vertices can be labelled by $\vec{x}_v$. In some embodiments, arrangement depends on the freely chosen parameters k and $\phi$. Accordingly, as described throughout the present disclosure, a hard problem can be transformed into an $M_{IS}$ problem on an arrangement of vertices that form a unit disk graph.

Without being bound by theory, a few properties of the maximum independent set on the types of unit disk graphs constructed in this way can be noted, according to some embodiments. First, in some embodiments, the maximum independent set on G is in general degenerate, even if the maximum independent set on $\mathcal{G}$ is unique. The properties of a particular set of $M_{IS}$-states on G can be considered, such as $M_{IS}$-states on G, $|\psi_G\rangle$, that coincide with $M_{IS}$-states on $\mathcal{G}$, $|\psi\mathcal{G}\rangle$, on the vertices V. Without being bound by theory, to see that such states can always exist, $|\psi_G\rangle$ can be constructed from $|\psi\mathcal{G}\rangle$ as follows: given the state of two qubits corresponding to two vertices, u, v∈V, if u is in the state $|0\rangle$ and v is in state $|1\rangle$ (or vice versa) then the $2k_{u,v}$ ancillary vertices can be placed on the edge connecting u and v in an (antiferromagnetically) ordered state, where the qubits are alternating in states $|1\rangle$ and $|0\rangle$. In the other case, if u and v are both in states $|0\rangle$, the ancillary vertices can be placed in an analogously ordered state. In embodiments of this latter case, a domain wall, such as an instance where two neighboring qubits are both in the state $|0\rangle$ can be introduced. The position of this domain wall along the edge is irrelevant. In both cases half of the $2k_{u,v}$ ancillary vertices along the edge are in state $|1\rangle$. Therefore, by the above theorem, the state constructed from $|\psi\mathcal{G}\rangle$ by applying this process on all edges of $\mathcal{G}$, is a MIS-state on G.

Without being bound by theory, the structure of these MIS-states around points where edges meet under a 90° angle can be further specified, according to some embodiments. Such points can be either junctions, where 3 edges meet at a vertex, such as point 216 in FIG. 2A, or corners, such as 202 in FIG. 2A. There is a MIS-state, $|\psi_G\rangle$, such that the qubits close to each corner or junction are ordered (for example, in a state where every other vertex is in state $|1\rangle$ and the others are in state $|0\rangle$ ). For example, there exists a maximum independent set, such that for every corner and junction, all vertices within a distance $\delta < g/4$ are in one of the two possible ordered configurations with no domain wall. Without being bound by theory, this follows from the above discussion by noting that the position of any domain wall along an edge ε is irrelevant, in some embodiments. For example, any domain wall can be moved along an edge ε such that its distance to any vertex on a grid point is larger than g/4. The possibility to move domain walls is also exploited in the discussion of the full Rydberg problem discussed, for example below in the section titled NP-Completeness of the Rydberg Problem.

Model Detunings for Corners and Junctions

Without being bound by theory, to illustrate applications of the above reduction to implementations that employ Rydberg interactions, a simple model can be implemented to explain aspects of some implementations. This model can be used to show some aspects and benefits of embodiments of the present disclosure, including, but not limited to treatment of special vertices. For example, a Hamiltonian similar to $H_{UD}$, the MIS-Hamiltonian for UD graphs, can be considered with the introduction of interactions beyond the unit disk radius. Similar to the situation in the Rydberg system, these additional interactions can cause energy shifts that can result in a change of the ground state, thus invalidating the encoding of the $M_{IS}$. In other words, such additional interaction can cause the ground state of an encoded $M_{IS}$ problem to be mismatched with the solution to the $M_{IS}$ problem. To resolve this issue, local detunings can be used to compensate for the additional interactions.

Without being bound by theory, embodiments of the model can be expressed as:

$$H_{model} = \sum_{v \in V} -\Delta_v n_v + \sum_{w > v} V_{model}(|\vec{x}_w - \vec{x}_v|) n_v n_w \quad \text{Equation 26}$$

with interactions given by:

$$V_{model}(x) = \begin{cases} U, & x \leq r, \\ W, & r < x \leq R \\ 0, & x > R, \end{cases} \quad \text{Equation 27}$$

where W<U. For W=0 and $\Delta_v$=A, $H_{model}$ can reduce to the Hamiltonian $H_{UD}$ described in Equation 25. For W>0 it includes interactions beyond the unit disk radius, r, and can thus be considered as a first approximation to the Rydberg Hamiltonian.

In some embodiments, in the case of a qubit arrangement described in the section titled "Maximum Independent Sets for Unit Disk Graphs" corresponding to a unit disk graph, G, and the case $\sqrt{2}r < R < 2r$, most qubits interact only with their neighbors on G, with an exception being qubits that are close to corners (such as qubit 202 in FIG. 2A) or junctions (such as qubit 216 in FIG. 2A). In such geometric arrangements, some qubits that are not neighboring on G interact with strength W>0. These interactions can, in some embodiment, change the ground state, as compared to the $M_{IS}$-Hamiltonian, $H_P$.

Figure 11A:
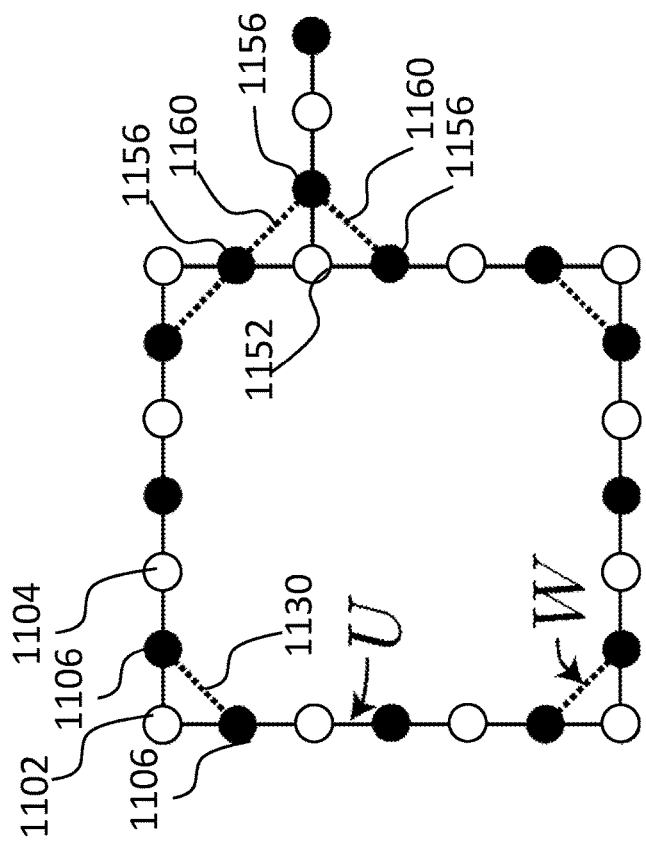
FIGS. 11A-11C are grid representations of planar graphs of maximum degree 3 taking into account non-nearest-neighbor interactions, according to some embodiments.
Figure 11C:
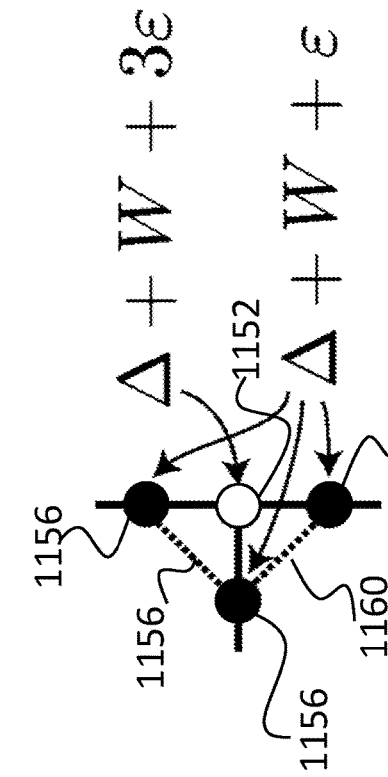
Figure 11B:
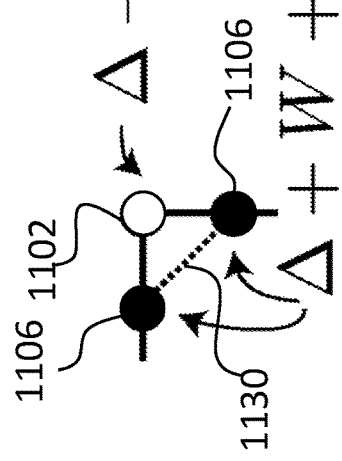

FIGS. 11A-11C show examples of vertex arrangements corresponding to a unit disk graph, where the ground state of the model $H_{model}$ (Equation 26) does not correspond to the maximum independent set, according to some embodiments. The maximum independent set on this graph in FIG. 11A is indicated by the black vertices, such as vertices 1106 and 1156. The white vertices, such as vertices 1102, 1104, 1152 indicate another independent set whose size is smaller than the size of the maximum independent set by one vertex. If W is too large, the additional interactions on the diagonals 1130, 1160 close to corners 1102 and junctions 1152 disfavor the MIS-state; instead, the state where the black qubits are in state |1⟩, becomes the ground state. As described throughout the present disclosure, this problem can be resolved by changing the detuning locally at the problematic structures as indicated FIGS. 11B and 11C for corners and junctions, respectively.

In some embodiments, it is desirable to find a detuning pattern, $\Delta_v$, such that the MIS-state of $H_{UD}$ remains the ground state of $H_{model}$, even at finite W. In other words, it is desirable to find a detuning pattern that renders the MIS solution of the graph more energetically favorable (i.e., coupling it to the ground state of the system) than other solution of the graph. For the relevant qubit arrangements, the interactions of the $H_{UD}$ and $H_{model}$ differ only around corners and junctions, in some embodiments. Thus, $\Delta_v$ can be set to $\Delta_v=\Delta$ everywhere (e.g., for all qubits) except at these structures, which can be considered individually and separately.

In some embodiments, with reference to corners as shown in FIG. 11B, as discussed above in the section titled "Maximum Independent Sets for Unit Disk Graphs," there exists at least one MIS-state, $|\psi_G\rangle$, such that the corner qubit 1102 and its two neighbors 1106 are in one of the two ordered configurations: either the corner qubit 1102 is in state |0⟩ and its two neighbors 1106 are in state |1⟩ (|011⟩), or the corner qubit 1102 is in state |1⟩ and its two neighbors 1106 are in state |0⟩ (|100⟩), where |100⟩ is a state of three vertices where the first vertex is in the state |1⟩, and the other two vertices are in the state |0⟩. Detunings can be chosen for these three qubits in such a way that only these two configurations are relevant for the ground state of $H_{model}$. That is, detunings can be specified such that the energy of all possible qubit configurations can always be lowered by arranging the qubits on the corners in one of the two ordered states, such as, but not limited to 01010 or 10101. In some embodiments, this can be achieved if the detuning of the corner qubit 1102 is selected to be $\Delta_C=\Delta+W+2\epsilon$, and the detuning of its two neighbors 1106 is selected to be $\Delta_N=\Delta+W+\epsilon$. Here $\epsilon>0$ can be chosen freely (up to the trivial constraint $\Delta_v<U$, where U is the strength of interaction for two vertices that are very close). In some embodiments, there might be some advantages for choosing different $\epsilon$, and the values described herein are discussed as examples. In some embodiments, this choice of the detuning restores the energy difference between the two ordered configurations on the three qubits to $\Delta$, corresponding to the additional vertex qubit in state |1⟩. Without being bound by theory, up to a trivial constant (and contributions from junctions discussed below), $H_{model}$ and $H_{UD}$ are identical on all states where each corner is in one of the above ordered configurations. This includes in particular one ground state of $H_{UD}$, which corresponds to a MIS-state. All states that are not of this type have higher energy with respect to $H_{model}$ by construction, according to some embodiments.

In some embodiments, with reference to FIG. 11C, junctions can be treated with a similar detuning technique. Without being bound by theory, there exists at least one MIS such that the central qubit 1152 is in the state |0⟩ and its three neighbors 1156 are in the state |1⟩, or the central qubit 1152 is in the state |1⟩ and its three neighbors 1156 are in the state |0⟩. A detuning of the degree-3 junction qubit 1152 (denoted $\Delta_J$) can be chosen as $\Delta_J=\Delta+W+3\epsilon$, and the detuning of its three neighbors 1156 (denoted by $\Delta_N'$) can be chosen as $\Delta_N'=\Delta+W+\epsilon$. In some embodiments, this choice renders one of the two ordered states on the junction energetically more favorable than any other state and restores their energy difference to exactly $2\Delta$. It should be appreciated, based on the present disclosure, that other values of $\epsilon$ can be selected.

In some embodiments, by using the detuning patterns described above, the actions of $H_{UD}$ and $H_{model}$ are, for non-limiting theoretical purposes, identical for at least one MIS-state. In addition, some embodiments ensure that the chosen detunings do not lower the energy of any other configurations. Therefore, a ground state of $H_{model}$ is a ground state of $H_{UD}$, encoding an MIS problem on the corresponding unit disk graph such that the ground state is a solution to the MIS problem.

NP-Completeness of the Rydberg Problem

Without being bound by theory, in some embodiments the detuning model described above can be applied to the case of the Rydberg Hamiltonian, thereby showing that it is NP-complete to decide whether the ground state energy of $H_{Ryd}$ is below a given threshold, when $\Omega_v=0$, where the atoms can be positioned arbitrarily in at least two dimensions. While the main idea is similar, the infinite ranged Rydberg interactions warrant more explanation.

As described above, it is possible to apply a detuning pattern that separates length and interaction scales, in some embodiments. This is possible in part because the Rydberg interactions decay fast, such that interactions between qubits that are close can be separated from the interactions between qubits that are far apart on the graph G. For example, the interactions between distant qubits can be neglected, if k is chosen large enough. In such embodiments, individual substructures of the system can be treated separately for purposes of theory.

In some embodiments, the low energy sector of the Rydberg Hamiltonian can be mapped to a much simpler effective spin model. For example, clusters of qubits can be addressed with specific detuning patterns such that only two configurations are relevant for each cluster. In some embodiments, the resulting, effective pseudo-spins are described by a MIS Hamiltonian. This makes it possible to encode $M_{IS}$ problems on planar graphs with maximum degree 3 such that the ground state of the Rydberg Hamiltonian is the $M_{IS}$ solution. The discussion in this section proves the details of the mapping to the effective model.

First, with regard to separation of length scales, the Rydberg interactions can decay as a power law with distance, and thus do not define a length scale where the interactions cease to exist. Nevertheless, in some embodiments, an exemplary qubit arrangement introduces two length scales: (1) the closest distance between two qubits, d, and (2) the grid length, g. These length scales are separated by a factor, g=d (2k+1), that can be chosen arbitrarily in the transformation of the planar graph, $\mathcal{G}$, to the unit disk graph, G. In some embodiments, with such implementations, interactions between qubits that are "close" can be separated from interactions between qubits that are "distant", for example when k is selected to be sufficiently large, as described in the present disclosure.

The closest qubits in the system are separated by a distance d and thus interact with a strength of $\mathcal{U}=C/d^6$. This defines a convenient unit of energy, $\mathcal{U}$, which depends on the choice of the parameter k specifying the transformation from $\mathcal{G}$ to G.

Without being bound by theory, two qubits can be described as "distant" if their x or y coordinate differs by at least g (the grid length). The interaction energy of a single qubit with all distant qubits can be upper bounded by:

$$E_{dist} = C\left(\sum_{j=1}^{\infty}\sum_{i=1}^{\infty}\frac{8}{(d^2i^2+g^2j^2)^3} + \sum_{i=0}^{\infty}\frac{4}{(id+g)^6}\right) \quad \text{Equation 28}$$

In some embodiments, this bound can be derived by considering a system where a qubit can be placed in state $|1\rangle$ on each possible qubit position in the 2D plane (i.e. along all grid lines). $E_{dist}$ is the interaction energy of a single qubit in such a system with all other qubits that are distant in the above sense. This is an upper bound to the maximum interaction energy of a single qubit with all distant qubits on arbitrary graphs, that itself can be upper bounded by $$E_{dist} = \leq \mathcal{U}\left(\frac{3\pi\zeta(5)}{2} + \frac{4}{5} + 4\left(\frac{d}{g}\right)\right)\left(\frac{d}{g}\right)^5, \quad \text{Equation 29}$$

where $\zeta(x)$ is the Riemann zeta function. Since in some embodiments, d/g=1/(2k+1), the interaction energy of a spin with all distant spins can scale as $E_{dist}=\mathcal{O}(\mathcal{U}/k^5)$. The total number of spins can scale as $|V|\sim\mathcal{O}(k|V|)$, as the grid representation of the original planar graph $\mathcal{G}$ in the plane can be done with $\mathcal{O}(|V|)$ area. Thus, in some embodiments, the contribution of interactions between all pairs of spins that are distant with respect to each other can be bounded by $E_{dist}|V\sim\mathcal{O}(\mathcal{U}|V|/k^4)$. In some embodiments, k can be chosen large enough such that these contributions can be neglected. In such embodiments, the ground state does not change due to the long range interactions. Note that the required k can scale polynomially with the problem size |V|.

Effective Spin Model

As described in more detail below, without being bound by theory, an effective spin model can be developed in order to show that for each planar graph $\mathcal{G}=(V, \mathcal{E})$ of maximum degree 3, an arrangement of $\mathcal{O}(k|V|)=\mathcal{O}(|V|^{5/4})$ atoms can be identified, and detuning patterns applied such that the ground state of the corresponding Rydberg Hamiltonian directly reveals a maximum independent set of $\mathcal{G}$. Furthermore, without being bound by theory, it can be seen that it is NP-complete to decide whether the ground state energy of $H_{Ryd}(\Omega_v=0)$ is lower than some threshold. In addition, without being bound by theory, it is possible to treat certain arrangements as pseudo-spins to simplify nonlimiting discussion of aspects of some embodiments.

In some embodiments, similar to the model discussed above, interactions beyond the unit disk radius (e.g., interaction tails) can be problematic. For example, longer range interactions can cause the ground state of systems with encoded MIS problems described above to differ from MIS solutions. These interactions can be more prominent close to vertices of degree 3, such as at vertex qubit 216 in FIG. 2A or corners, such as vertex qubit 202 in FIG. 2A.

Figure 12E:
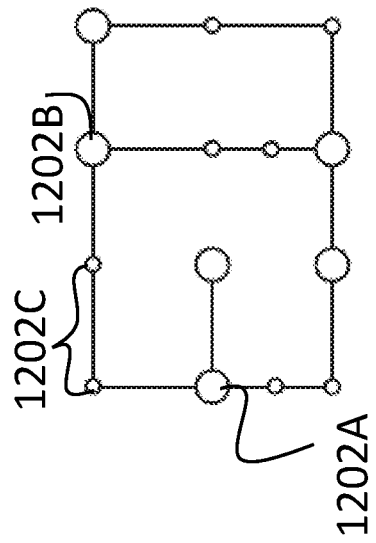
FIGS. 12A-12E are grid representations of transformations to an effective spin model, according to some embodiments.
Figure 12A:
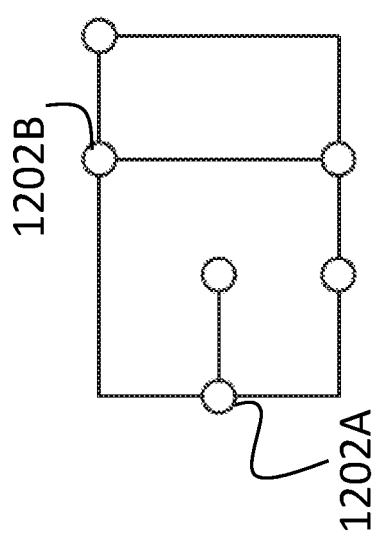

In some embodiments, as discussed throughout the present disclosure, to address these complications length and interaction scales can be separated to isolate these structures and control them individually. For example, for some graphs discussed in the present disclosure, various "special" vertices can be defined. These are special vertices can correspond to those that that either have integer grid coordinates or are irregular vertices. Special vertices thus include all vertices V of $\mathcal{G}$, but also a subset of vertices introduced to transform $\mathcal{G}$ to the UD graph G. FIG. 12A shows an example of a planar graph with maximum degree 3, $\mathcal{G}$ embedded on a grid, according to some embodiments. The planar graph of FIG. 12A includes vertex qubits 1202A, 1202B that can be connected with edge qubits as discussed above.

Figure 12B:
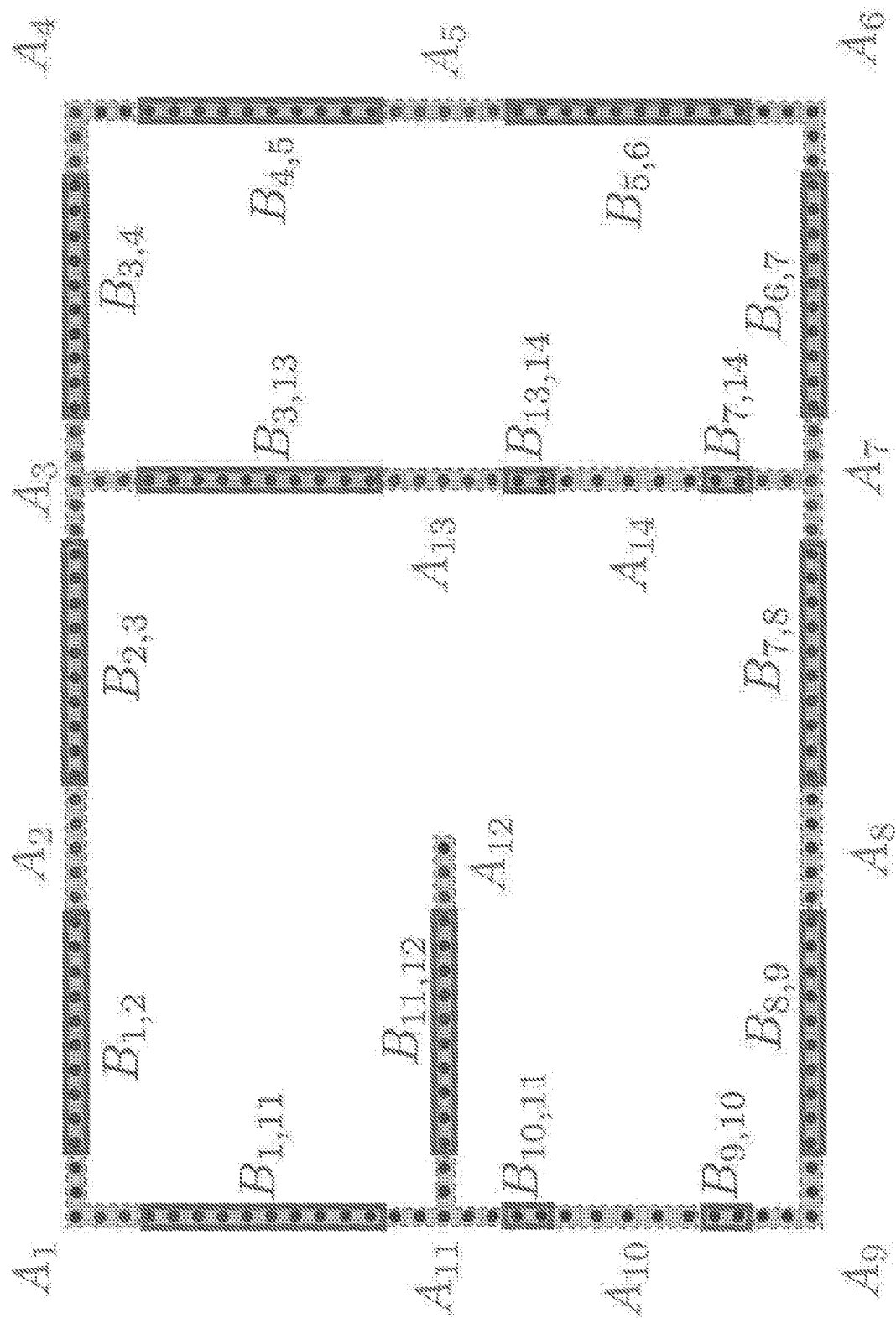

FIG. 12B shows a spin arrangement implementing the graph of FIG. 12A with k=7 and $\phi=1$, according to some embodiments. For each special vertex, denoted as i, a set of vertices, $A_i$, can be defined that includes i and its 2q neighbors on each leg. The value of q can be chosen such that $2\phi<2q\leq k/4$.

Figure 12C:
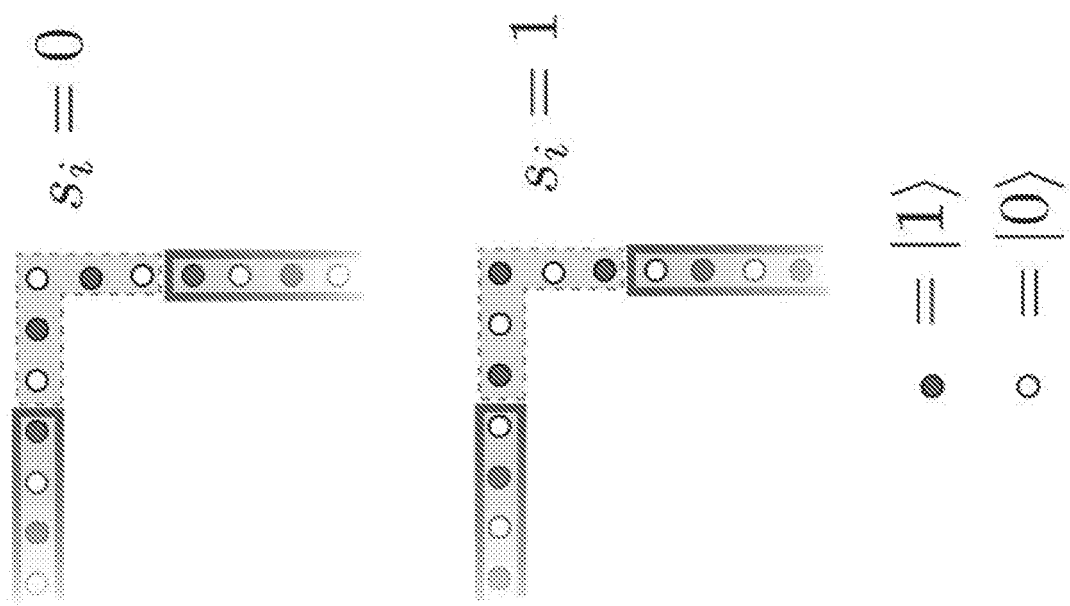
Figure 12D:
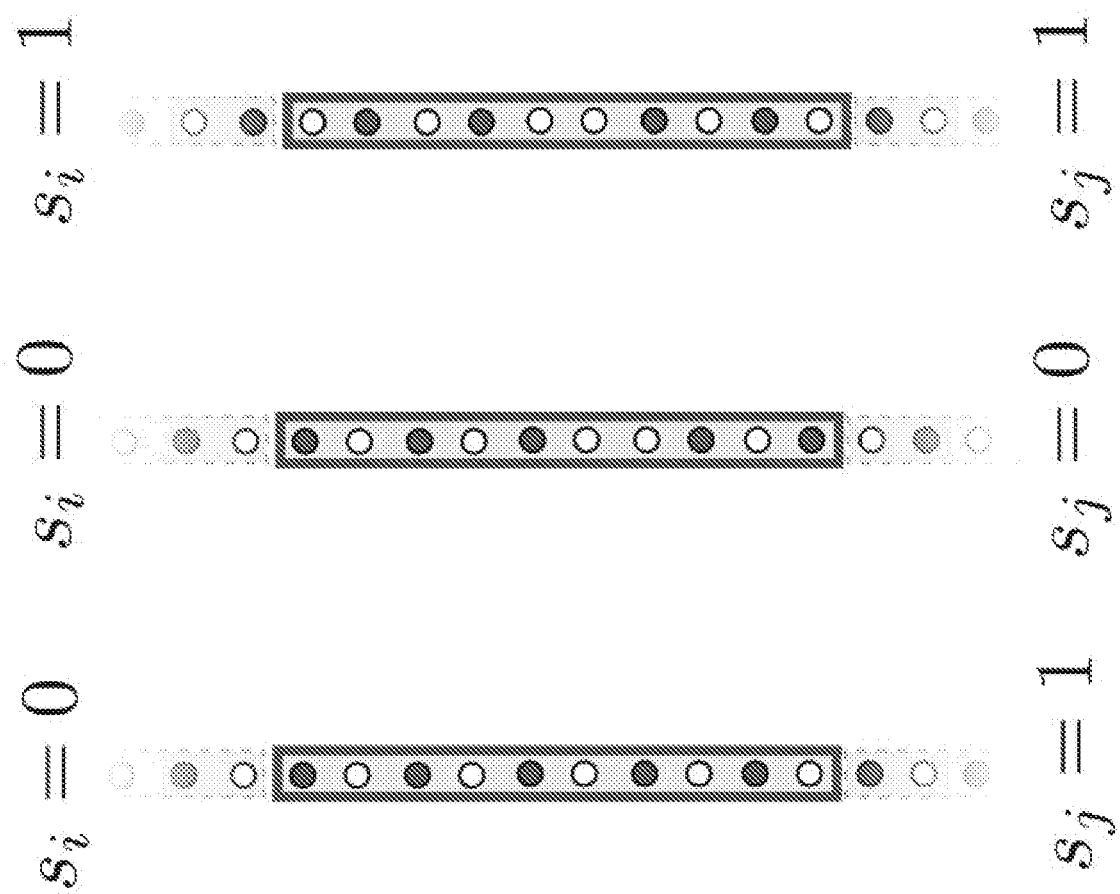

FIG. 12B shows the regions $A_i$, corresponding to special vertices and their 2q neighbors on each leg with a value of q=1. The regions $A_1$, $A_4$, $A_6$ and $A_9$ can be referred to as corners, and regions $A_3$, $A_7$, and $A_{11}$ can be referred to as junctions. The region $A_{12}$ can be referred to as an open leg, while regions $A_2$, $A_5$, $A_8$, $A_{10}$, $A_{13}$ and $A_{14}$ can be referred to as special vertices on straight segments. Regions $A_{10}$ and $A_{14}$ can be referred to as irregular regions (e.g., those in which the spacing between vertices is different than in the other regions). In a spin model, each region A, can be represented by a pseudo-spin si that interacts with neighboring pseudo-spins. In other words, the spins in a certain region can be aggregated as a pseudo-spin, which, as explained in more detail below, is limited to a specified number of states in the ground state. The two pseudo-spin states correspond to the two ordered configurations in $A_i$. These two configurations, denoted by $s_i=0$ and $s_i=1$, correspond to states where the special spin, i, is in state $|s_i\rangle$ and all other spins in $A_i$ are in the corresponding perfectly ordered state. For each region $A_i$ a pseudo-spin $s_i$ can be defined and $E_{A_i}$ can be calculated for both pseudo-spin states (denoted $E_{A_i}^{s_i}$). Note that the number of spins in $A_i$ that are in state $|1\rangle$ can be directly determined by the pseudo-spin state $s_i$, as it is given by $s_i+m_iq$ (where m denotes the degree of the special vertex i). As shown in FIG. 12B, sets $B_{i,j}$ can be defined as the vertices along the path connecting $A_i$ and $A_j$. In such embodiments, by construction $B_{i,j}$ contains an even number of vertices. The ground states of different types of pseudo-spins A and B are described in more detail with reference to the section titled "Behavior at Low Energy." For example, FIG. 12D shows the 3 possible configurations of vertices along a straight segment of ancillary spins that can appear in a ground state configuration. FIG. 12E shows the effective spin model corresponding to the graph $\mathcal{G}_{eff}$, according to some embodiments.

Without being bound by theory, due to the separation of length and interaction scales described throughout the present disclosure, interactions between two spins, u and v, are only relevant if they belong to the same set, u, $v\in A_i$ (or $u,v\in B_{i,j}$), or if they belong to adjacent sets, $u\in A_i$ and $v\in B_{i,j}$. All other interaction terms will give contributions that vanish like $\mathcal{O}(\mathcal{U}|\mathcal{V}|/k^4)$. Without being bound by theory, the total energy can be written as $$E = \sum_i E_{A_i} + \sum_{\langle\langle i,j\rangle\rangle} \left(E_{A_i,B_{i,j}} + \frac{1}{2} E_{B_{i,j}}\right) + O(\mathcal{U}|\mathcal{V}|/k^4). \quad \text{Equation 30}$$

Where, $E_X = \sum_{v \in X} -\Delta_v n_v + \sum_{w > v \in X} V_{Ryd}(|\vec{x}_w - \vec{x}_v|) n_w n_v$ gives the energy of the system when only spins in X are taken into account, and $E_{X,Y} = \sum_{u \in X} \sum_{v \in Y} V_{Ryd}(|\vec{x}_u - \vec{x}_v|) n_u n_v$ quantifies the interaction energy between spins in two regions X and Y. The sum $\Sigma_{\langle\langle i,j\rangle\rangle} = \Sigma_i \Sigma_{j \in \mathcal{N}(i)}$ runs over i and j, such that $A_i$ is connected to $A_j$ by a non-empty set $B_{i,j}$, and the factor ½ compensates for double counting.

It is possible to apply an appropriate choice of the detunings, Δv, such that only a few configurations of spins in regions $A_i$ and $B_{i,j}$ are relevant to construct the ground state of the entire system, in some embodiments. In some such configurations it is possible to consider only a few configurations as candidates for the ground state, rather than exponentially many. For example, as discussed in more detail below, in such embodiments only two configurations of spins in the regions $A_i$ shown in FIG. 12C are relevant. Furthermore, in such embodiments, only four configurations of spins in each region $B_{i,j}$ are relevant, as shown in FIG. 12D, according to some embodiments. Moreover, these configurations can be completely determined by the pseudo-spin state $s_i$ and $s_j$. If $s_i=1$ and $s_j=0$ (or vice versa) the total energy is minimized if $B_{i,j}$ is in the perfectly ordered state. If $s_i=s_j=0$ or $s_i=s_j=1$, the lowest energy state is also ordered but with a single domain wall in the center of the region $B_{i,j}$. Without being bound by theory, the energy $E_{B_{i,j}}$ for these configurations can be denoted by by $$\sum_{B_{i,j}}^{s_i, s_j},$$

which yields:

$$E_{B_{i,j}} = (s_i(1-s_j) + (1-s_i)s_j)E_{B_{i,j}}^{1,0} + (1-s_i)(1-s_j)E_{B_{i,j}}^{0,0} + s_i s_j E_{B_{i,j}}^{1,1}, \quad \text{Equation 31}$$

where note $$E_{B_{i,j}}^{1,0} = E_{B_{i,j}}^{0,1}.$$

The number of spins in state $|1\rangle$ in $B_{i,j}$ can be written as $b_{i,j} - s_i s_j$ (where $2b_{i,j}$ gives the number of spins in $B_{i,j}$). The interaction energy $E_{A_i B_{i,j}}$ can be constant for all of the above combinations of relevant states [up to $\mathcal{O}(\mathcal{U}/k^5)$].

In some embodiments, the total energy in the relevant configuration sector containing the ground state of $H_{Ryd}$ can be given by an effective spin model for the pseudo-spins:

$$E = \sum_i -\Delta_i^{eff} s_i + \sum_{\langle\langle i,j\rangle\rangle} s_i s_j U_{i,j}^{eff} + \xi + O(\mathcal{U}|\mathcal{V}|/k^4), \quad \text{Equation 32}$$

where the sum $\Sigma_{\langle i,j\rangle}$ runs over neighboring pairs of pseudospins (without double-counting). Effective detunings $\Delta_i^{eff}$ (e.g., detunings that have a similar effect on pseudospins as detunings for normal spins) can be introduced and pseudo-spin interactions $U_{i,j}^{eff}$ can be given by:

$$\Delta_i^{eff} = E_{A_i}^0 - E_{A_i}^1 - \sum_{j \in N(i)} \left(E_{B_{i,j}}^{1,0} - E_{B_{i,j}}^{0,0}\right), \quad \text{Equation 33}$$

$$U_{i,j}^{eff} = E_{B_{i,j}}^{1,1} + E_{B_{i,j}}^{0,0} - 2E_{B_{i,j}}^{1,0}, \quad \text{Equation 34}$$

$$\xi = \sum_i E_{A_i}^0 + \sum_{\langle\langle i,j\rangle\rangle} \left(E_{A_i,B_{i,j}} + \frac{1}{2}E_{B_{i,j}}^{0,0}\right). \quad \text{Equation 35}$$

In some embodiments, detuning patterns, $\Delta_v$, can be chosen such that the effective pseudo-spin detunings and interactions are homogeneous, $\Delta_i^{eff} = \Delta^{eff}$ and $U_{i,j}^{eff} = U^{eff}$, and satisfy $0 < \Delta^{eff} U^{eff}$. In some embodiments, when these parameters are chosen such that the above equations are satisfied the problem of the Rydberg Hamiltonian can be treated as equivalent to the MIS problem. To ensure that the long-range correction is bounded by some small constant $\eta << \Delta^{eff}$, k can be selected such that $k \geq \mathcal{O}((\mathcal{U}|\mathcal{V}|/\eta)^{1/4})$. $\xi$ can be computed based on the chosen detuning pattern.

This effective spin model in equation 32 can be related back to the original MIS problem on $\mathcal{G}$. Without being bound by theory, embodiments of this effective spin model corresponds exactly to a MIS problem on a graph $\mathcal{G}^{eff}$ obtained from $\mathcal{G} = (V, \varepsilon)$ by replacing each edge $\{u,v\} \in \varepsilon$ by a string of an even number $2K_{u,v}$ of vertices as discussed in more detail with reference to FIGS. 12A-12E. These additional vertices transport the independent set constraint giving an exact correspondence between the maximum independent sets of $\mathcal{G}$ and $\mathcal{G}^{eff}$, in complete analogy to the discussion above in the section titled "Maximum Independent Sets for Unit Disk Graphs."

Therefore, for each planar graph $\mathcal{G} = (V, \varepsilon)$ of maximum degree 3, an arrangement of $\mathcal{O}(k|V|) = \mathcal{O}(|V|^{5/4})$ atoms can be identified, and detuning patterns applied such that the ground state of the corresponding Rydberg Hamiltonian directly reveals a maximum independent set of $\mathcal{G}$. Thus, without being bound by theory, it can be seen that it is NP-complete to decide whether the ground state energy of $H_{Ryd}(\Omega_v = 0)$ is lower than some threshold. First, this question is in NP since the ground state of $H_{Ryd}(\Omega_v = 0)$ has a classical description. In addition, for reduction from the NP-complete problem of deciding whether the size of MIS on $\mathcal{G}$, a planar graph of maximum degree 3, is ≥a. Let $a' = a + \Sigma_{\{u,v\} \in \varepsilon} K_{u,v}$. If the size of MIS of $\mathcal{G}$ is ≥a, then the ground state energy of $H_{Ryd}$ is $\leq -a'\Delta^{eff} + \xi + \eta$. If the size of MIS of $\mathcal{G}$ is ≤a−1, then the ground state energy of $H_{Ryd}$ is $\geq -(a'-1)\Delta^{eff} + \xi - \eta$. In some embodiments, by choosing $\eta < \Delta^{eff}/2$, the MIS of $\mathcal{G}$ has size ≥a if and only if the ground state energy of $H_{Ryd}$ is $\leq -(a'-\frac{1}{2})\Delta^{eff} + \xi$.

Behavior at Low Energy

Without being bound by theory, embodiments of aspects of the ground state of the Rydberg Hamiltonian are described below. Example aspects of the Rydberg Hamiltonian show that at lower energy, the ground state corresponds to an MIS solution to an encoded problem. Thus, in example implementations, if a problem is properly encoded, transitioning the corresponding qubits into lower energy states can result in the system in the ground state which corresponds to the solution to the encoded problem. Without being bound by theory, discussion of such transitions can be aided by referencing the "pseudo-spins" discussed in the previous section.

In some embodiments, the ground state of $H_{Ryd}$ corresponds to a maximal independent set on the associated UD graph if the detuning of each spin is selected according to the techniques described herein. Maximal independent sets refer to independent sets where no vertex can be added without violating the independence property (e.g., that no two neighboring vertices can both be in the state $|1\rangle$). The largest maximal independent set is the maximum independent set. For configurations corresponding to such sets, no two neighboring spins can be in state $|1\rangle$ (independence), and no spin can be in state $|0\rangle$ if all its neighbors are in state $|0\rangle$ (maximality).

In some embodiments of the Rydberg Hamiltonian, no two neighboring vertices on G can be simultaneously in state $|1\rangle$ if the system is in the ground state of $H_{Ryd}$ as long as the detuning $\Delta_v$ on all vertices obeys:

$$\Delta_v < \Delta_{max} \equiv C/D^6 \xrightarrow{\phi \gg 1} \mathcal{U}, \qquad \text{Equation 36}$$

where D is the maximal Euclidean distance between two vertices that are neighboring on G.

Figures 13A, 13B:
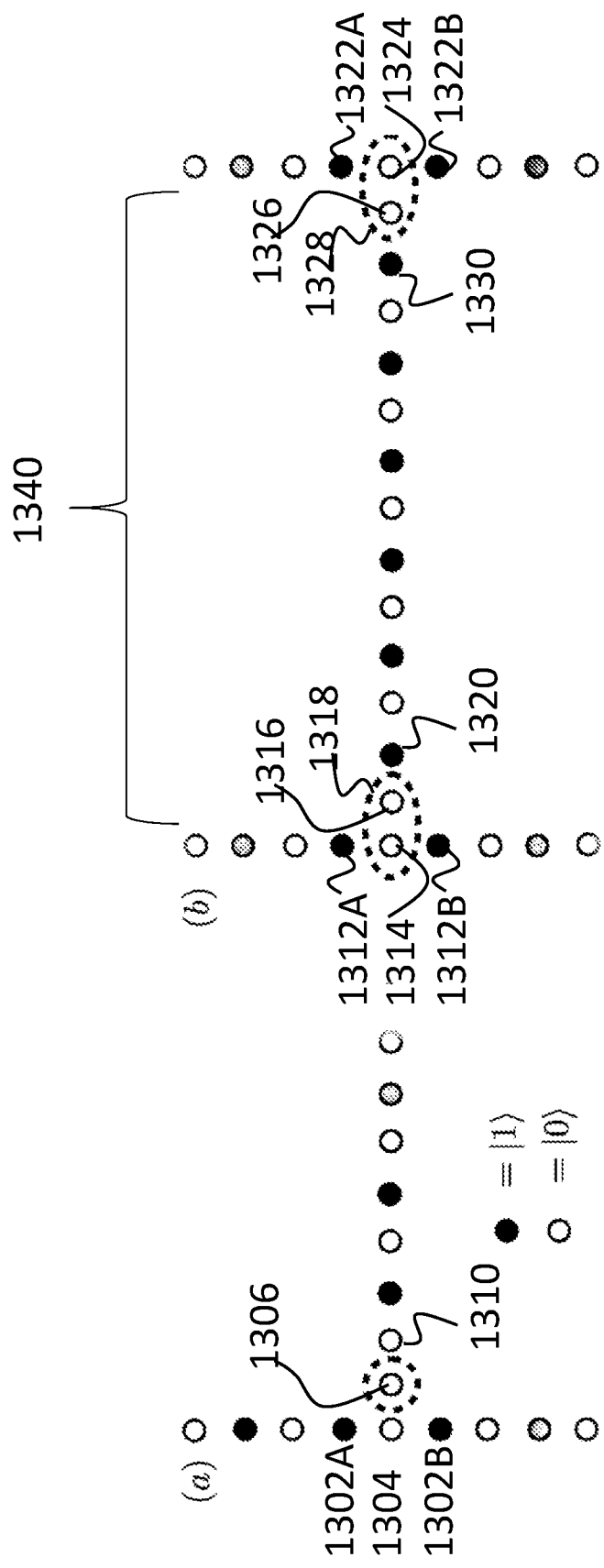
FIGS. 13A-13B are illustrations of local non-maximal independent set configurations and domain walls, according to some embodiments.

FIG. 13A shows a portion of a graph of qubits at a vertex of degree–3, according to some embodiments. The graph includes qubits 1302A, 1302B, 1304, 1306, and 1310. FIG. 13B shows a similar graph with two vertices of degree–3, according to some embodiments. FIG. 13B shows vertices of degree three 1314, 1324, as well as qubits 1312A, 1312B, 1316, 1318, 1320, 1322A, 1322B, 1326, 1328, 1330. While for the MIS Hamiltonian $\Delta > 0$ is sufficient to energetically favor spins to be in the state $|1\rangle$ and thus maximality of the ground state, this is not necessarily the case for the Rydberg Hamiltonian. This is in part due to long range interactions discussed throughout the present disclosure. In this case, the energy gain $\Delta v$ has to exceed the energy cost associated with the interaction energy of a spin v, with all other spins that are in state $|1\rangle$. In order to determine the required detuning that guarantees maximality, the interaction energy of a spin, v (such as qubit 1306 in FIG. 13A or qubits 1316 and 1326 in FIG. 13B) whose neighbors (on G) are all in state $|0\rangle$ can be bounded with the rest of the system. In order to obtain a bound, the energy to a contribution can be split from distant spins (bounded by $E_{dist} = \mathcal{O}(\mathcal{U}/k^5)$, see equation 29) and a contribution from the remaining "close" spins, $B_1$. The latter contribution from close spins is maximal if the spin v (1306, 1316, 1326) is directly neighboring to a vertex 1304 of degree 3. Since no two neighboring spins can be simultaneously in the state $|1\rangle$ as long as $\Delta_v < \Delta_{max}$, it can be upper bounded by $$B_1 \leq \mathcal{U} \sum_{i=1}^{\infty} \frac{1}{(2i)^6} + 2\mathcal{U} \sum_{i=1}^{\infty} \frac{1}{((2i-1)^2 + 1)^3} = 0.268031 \times \mathcal{U}.$$

The first term corresponds to the maximum interaction of spin v with spins on the same grid line (such as qubits 1304, 1310 in FIG. 13A, and qubits 1314, 1320 or 1324, 1330 in FIG. 13B), while the second term bounds the interaction with spins on the two perpendicular gridlines (such as 1302A, 1302B in FIG. 13A, or 1312A, 1312B, 1322A, 1322B in FIG. 13B).

The configuration shown in FIG. 13A corresponds to a non-maximal independent set configuration where three qubits (1304, 1306) are in the same state $|0\rangle$, according to some embodiments. It is energetically favorable to flip the spin 1306 if the detuning is $\Delta_v > 0.268031 \times \mathcal{U}$. $\mathcal{G}$ embedded on a grid. The configuration shown in FIG. 13B is another non-maximal independent set configuration with two domain walls 1318, 1328 along a straight segment. As discussed in more detail below, by merging the two domain walls (i.e., by flipping the spins along the straight segment such that only one domain wall exists), it is possible to obtain a defect-free configuration with one more spin in state $|1\rangle$. The increase in interaction energy between these two configurations can be bounded by $0.504748 \times \mathcal{U}$, where the state with one domain wall is the lowest energy configuration. Thus, for any given segment connecting two special vertices, such as vertices 1314, 1324, it is energetically favorable to include at most one domain wall.

Therefore, in some embodiments, the configuration of spins in the ground state of the Rydberg Hamiltonian corresponds to a maximal independent set on the associated UD graph (edge between nearest neighbor) if, $C/D^6 \geq \Delta_v \geq 0.268031 \times C/d^6$.

Straight Segments

FIG. 13B shows an exemplary straight segment pseudo-spin, according to some embodiments. As explained below, such segments can be found in at most three states, shown in FIG. 12D.

The spins on each edge $\varepsilon$ of the graph $\mathcal{G}$ are in an ordered configuration, such as a configuration where spins are alternating in state $|0\rangle$ and $|1\rangle$, up to so called domain walls, where two (but not more) neighboring spins are in state $|0\rangle$. A MIS configuration on G has at most one such domain wall on any array of spins connecting two special vertices i and j such as 1314, 1324 in FIG. 13B, according to some embodiments. In order to ensure that the ground state of the Rydberg system respects this property, the detuning can be chosen to be large enough. For example, assuming such a straight segment is in an ordered state with n domain walls, when two such domain walls (1318, 1328) are combined an additional spin, v, can be flipped from state $|0\rangle$ to state $|1\rangle$, lowering the single-particle contribution to the total energy by $\Delta_v$. The corresponding difference in interaction energy grows with the distance of the domain walls, for example, it is maximal if the two domain walls are initially on opposite ends of a segment connecting two junctions as shown in FIG. 13B. It can be bounded by $E_2 + E_{dist}$, where $$\frac{E_2}{\mathcal{U}} \leq \sum_{i,j=1}^{\infty} \left[ \frac{4}{\left((2i-1)^2 + (2j-1)^2\right)^3} - \frac{4}{\left((2i-1)^2 + (2j)^2\right)^3} \right] + \sum_{i=1}^{\infty} \frac{1}{(2i)^6} \qquad \text{Equation 37}$$

This bound can be understood with reference to FIG. 13B, where the zero-domain-wall configuration can be obtained from one with two domain walls by shifting the ordered spins on the middle bar 1340 (i.e., between the domain walls) one atom to the left in, and then flipping a spin next to the right junction to the state $|1\rangle$, according to some embodiments. Thus, the first sum corresponds to the interactions between the middle bar of the H-shape with the sides, and the last sum is the extra interaction from a new flipped spin. Thus (for large enough k where $E_{dist}$ is negligible) it is favorable to merge two neighboring domain walls along a straight segment if $$\Delta_v \geq \Delta_{min} = 0.490084 \times \mathcal{U}. \qquad \text{Equation 38:}$$

Therefore, for $\Delta_{min} < \Delta_v < \Delta_{max}$, the ground state of the Rydberg Hamiltonian is ordered on all segments connecting two special vertices, with at most one domain wall per segment. This justifies the assumption made with reference to FIG. 12D, that it is possible to restrict the analysis of the low energy sector to only 3 configurations of the structures $B_{i,j}$. In the first configuration, all spins alternate with different states on either end of the structure $B_{i,j}$. In the second configuration, the spin states on either end of the structure $B_{i,j}$ are equal to 0, with one domain wall in between. In the third configuration, the spin states on either end of the structure $B_{i,j}$ are equal to 1, with one domain wall in between. The detuning for all those spins can be set to be equal and in the above range, which can be denoted by $\Delta B$.

Below, embodiments of special structures $A_i$ consisting of a vertex i and its 2q neighbors on each leg are described in more detail. The discussion can be restricted to states that are ordered in $A_i$ with at most one domain wall per leg. Detuning patterns can be selected for the spins in $A_i$ such that any such domain wall is energetically pushed away from spin, i, out of the structure $A_i$. Without being bound by theory, with such a detuning only the two ordered states on $A_i$ have to be considered for the ground state.

Corners

A corner vertex and the spins on the two legs, which can be collectively treated as a pseudo-spin, are considered first, such as those shown in embodiments of FIG. 12C. A detuning pattern consistent with $\Delta_{max} \geq \Delta_v \geq \Delta_{min}$ can be applied such that only two configurations are relevant in the low energy sector (e.g., for the ground state). These are the two ordered states across the corner which correspond to the state of the corner spin, $|0\rangle$ or $|1\rangle$, which can be denoted by s=0 and s=1 respectively.

In some embodiments, if the corner spin is in state $|0\rangle$, a domain wall can be formed where on one of the legs the two spins at distance 2p−2 and 2p−1 from the corner are in state $|0\rangle$. The domain wall can be moved by one unit (i.e. p→p+1) by flipping the state of the spins 2p−1 and 2p. The interaction energy increases in this process. Its amount can be bounded by $\mathcal{U} F_0(p) + \mathcal{O}(\mathcal{U}/k^5)$ with $$F_0(p) = \sum_{i=1}^{\infty}\left[\frac{4}{((2i-1)^2 + (2p-1)^2)^3} - \frac{4}{((2i-1)^2 + (2p)^2)^3}\right]. \quad \text{Equation 39}$$

Without being bound by theory, this bound can be understood as follows. Effectively, the one spin excitation is moved by one site towards the corner. While the interaction energy of this excitation with all spins on the same leg is reduced (such as where 2p<k), and thus is upper bounded by zero, the interaction energy with all spins on the other leg increases. Since any defect on this leg would decrease this interaction energy, the energy can be maximized if all spins on the other leg are in the perfectly ordered state, which gives the bound in equation 39.

While the interaction energy can increase in this process, the contribution from the single particle term to the total energy changes by $\Delta_{2p-1} - \Delta_{2p}$. Depending on the choice of the detuning, this can lead to an energy gain such that it is energetically favorable to move the domain wall by one unit away from the corner spin. Thus, the energy is minimized if the first 2q spins on each of the legs are in the perfectly ordered state if the corner spin is in state $|0\rangle$ and the detuning for spins satisfy for p=1, 2 . . . , q:

$$\Delta_{2p-1} - \Delta_{2p} \geq \mathcal{U} F_0(p), \quad \text{Equation 40:}$$

Similarly, if the corner spin is in state $|1\rangle$, the energy is minimized if the first 2q+1 spins on each of the leg are in the perfectly ordered state if detunings satisfy:

$$\Delta_{2p} - \Delta_{2p+1} \geq \mathcal{U} F_1(p), \quad \text{Equation 41}$$

with $$F_1(p) = \sum_{i=1}^{\infty}\left[\frac{1}{((2i)^2 + (2p)^2)^3} - \frac{1}{((2i)^2 + (2p+1)^2)^3}\right]. \quad \text{Equation 42}$$

The conditions in equations 40, 41 can be satisfied by the choice (for p=1, . . . , q):

$$\Delta_{2p} = \Delta_{\infty} + \mathcal{U} \sum_{i=1}^{\infty} [F_1(i) + F_0(i+1)], \quad \text{Equation 43}$$

$$\Delta_{2p-1} = \Delta_{\infty} + \mathcal{U} \sum_{i=p}^{\infty} [F_0(i) + F_1(i)]. \quad \text{Equation 44}$$

In some embodiments, these sums are convergent and can be efficiently evaluated numerically. $\Delta_x$ is monotonically decreasing with x and for large x approaches $\Delta_{\infty} + \mathcal{O}(\mathcal{U}/x^5)$. Moreover, the maximum value of $\Delta_x$ in this sequence can be evaluated to $\Delta_1 = \Delta_{\infty} + 0.134682 \times \mathcal{U}$. It is therefore possible to choose $\Delta_{\infty}$ such that the detuning along the legs of the corner are within the required range.

With the above detuning pattern and the choice $\Delta_{\infty} \geq \Delta_B$, the ground state configuration is necessarily such that the 4q+1 spins forming a corner structure are in one of the two ordered states. These states can be labeled as s=0 and s=1 according to the corresponding state of the corner spin ($|0\rangle$ and $|1\rangle$).

Note that the choice in equations 43, 44 fixes the detuning on all spins except the detuning of the corner spin, denoted $\Delta_C$. This makes it possible to tune the relative energy between the two relevant configurations, $E_{A_i}^1 - E_{A_i}^0$, for the ground state. Without being bound by theory, to calculate this difference, the quantity $I_C$ can be defined as the difference in interaction energies between the two spin configurations, $$\frac{I_C}{\mathcal{U}} = \sum_{i=1}^{q}\sum_{j=1}^{q}\left[\frac{1}{((2i+1)^2 + (2j-1)^2)^3} - \frac{1}{((2i)^2 + (2j)^2)^3}\right] - \quad \text{Equation 45}$$

$$2\sum_{i=1}^{q}\frac{1}{(2i)^6} = 0.0932973 + \mathcal{O}(\mathcal{U}/q^5).$$

Similarly, without being bound by theory, the difference in energy ($\mathcal{D}_C$) of the two configurations due to the single particle term can be calculated as:

$$\mathcal{D}_C = \Delta_C + 2\sum_{p=1}^{q}(-\Delta_{2p-1} + \Delta_{2p}) = \Delta_C - \mathcal{U} \times 0.237094 + \mathcal{O}(\mathcal{U}/q^5) \quad \text{Equation 46}$$

For the corner structures, $E_{A_i}^1 - E_{A_i}^0 = \mathcal{D}_C - I_C$, this can be evaluated to $$E_{A_i}^1 - E_{A_i}^0 = \Delta_C + 0.143797 \times \mathcal{U} + \mathcal{O}(\mathcal{U}/q^5) \quad \text{Equation 47:}$$

which can be fully tuned by the detuning of the corner spin. Thus, in some embodiments, corner structures can be treated as having only two configurations.

Junctions

In some embodiments, junctions, such as that shown in FIG. 13A can be treated in a similar way as corners. For example, the spin at the junction and adjacent spins can be treated as a pseudo-spin. A detuning pattern on the legs of a junction can be chosen such that it is energetically favorable to push domain walls away from the junction, such that in the ground state, a junction can only be in one of the two ordered configurations, according to some embodiments. In this way, junctions also can be described by at most two states defined by the state of the 3-way junction vertex.

First, with reference to central spin, such as the degree-3 vertex 1304 in FIG. 13A, which can be in state $|0\rangle$, the three legs can be referred to by X, Y and Z, where for concreteness X and Z are on the same gridline (e.g., corresponding to spins continuing from vertices 1302A, 1302B) with Y being perpendicular thereto (e.g., corresponding to spins continuing from vertex 1306), according to some embodiments. In a situation where two vertices on leg X at a distance 2p−2 and 2p−1 from the central vertex are in state $|0\rangle$ and thus form a domain wall, in order to push this domain wall one unit away from the vertex, the state of vertices 2p−1 and 2p has to be flipped. The interaction energy required to do so is bounded, in some embodiments, by $\mathcal{U} F_0(p)$. Note that this bound can hold true regardless of whether (or where) on legs Y and Z a domain wall is present. Similarly, the interaction energy required to push a domain wall on leg Y by one unit from the corner can be bounded by $2\mathcal{U} F_0(p)$.

In the other case, i.e. if the central vertex is in state $|1\rangle$, similar bounds can be found. If the two vertices on leg X at a distance 2p−1 and 2p from the central vertex are in state $|0\rangle$, the interaction energy will be increased when the states of vertices 2p and 2p+1 are flipped, i.e. when the domain wall is pushed away from the center by one unit. The interaction energy required to push the domain wall on leg X by one unit can therefore be bounded by $\mathcal{U} F_1(p)$. This bound can be valid independently of the configuration of the spins on legs Y and Z. The interaction energy required to push a domain wall on leg Y by one unit from the corner can be bounded by $2\mathcal{U} F_1(p)$.

Therefore, in some embodiments, the state that minimizes the energy may not contain any domain wall on the first 2q+1 spins on each leg if the detuning pattern satisfies $$\Delta^{(X)}_{2p-1} - \Delta^{(X)}_{2p} \geq \mathcal{U} F_0(p), \quad \text{Equation 48}$$

$$\Delta^{(Y)}_{2p-1} - \Delta^{(Y)}_{2p} \geq 2\mathcal{U} F_0(p), \quad \text{Equation 49}$$

$$\Delta^{(X)}_{2p} - \Delta^{(X)}_{2p+1} \geq \mathcal{U} F_1(p), \quad \text{Equation 50}$$

$$\Delta^{(Y)}_{2p} - \Delta^{Y}_{2p+1} \geq 2\mathcal{U} F_1(p), \quad \text{Equation 51}$$

for p=1, 2, ... q, and $\Delta^{(Z)}_v = \Delta^{(X)}_v$. Here $\Delta^{(\sigma)}_v$ denotes the detuning of the v-th spin on leg σ. Without being bound by theory, this can be achieved by the following:

$$\Delta^{(X)}_{2p} = \Delta_\infty + \mathcal{U} \sum_{i=p}^{\infty}(F_1(i) + F_0(i+1)), \quad \text{Equation 52}$$

$$\Delta^{(X)}_{2p-1} = \Delta_\infty + \mathcal{U} \sum_{i=p}^{\infty}(F_0(i) + F_1(i)), \quad \text{Equation 53}$$

$$\Delta^{(Y)}_{2p} = \Delta_\infty + 2\mathcal{U} \sum_{i=p}^{\infty}(F_1(i) + F_0(i+1)), \quad \text{Equation 54}$$

$$\Delta^{(Y)}_{2p-1} = \Delta_\infty + 2\mathcal{U} \sum_{i=p}^{\infty}(F_0(i) + F_1(i)), \quad \text{Equation 55}$$

Where $\Delta^{(Z)}_v = \Delta^{(X)}_v$. For the choice above, the maximum value of $\Delta^{(\sigma)}_v$ in this sequence can evaluate to $\Delta^{(Y)}_1 = \Delta_\infty + 0.269364 \times \mathcal{U}$. Thus, all the detunings on the legs of a junction $A_i$ are within the range $[\Delta_\infty, \Delta_\infty + 0.269364 \times \mathcal{U}]$. It is therefore possible to choose $\Delta_\infty$ such that all of them are in the allowed range, $\Delta_{min} < \Delta_v < \Delta_{max}$. With the additional choice $\Delta_\infty > \Delta_B$, it can be seen that, in some embodiments, only the two ordered configurations are relevant for the ground state.

Analogous to the situation of corner structures, the detuning of the junction spin, denoted $\Delta_J$ can be used to tune the relative energy between the two relevant configurations of the junction. Without being bound by theory, the difference in interaction energies of the two spin configurations in this structure can be given by $$\frac{I_J}{\mathcal{U}} = \sum_{i=1}^{q}\sum_{j=1}^{q}\left(\frac{1}{(2i-2+2j)^6} - \frac{1}{(2i+2j)^6}\right) - 3\sum_{i=1}^{q}\frac{1}{(2i)^6} + \quad \text{Equation 56}$$

$$2\sum_{i=1}^{q}\sum_{j=1}^{q}\left(\frac{1}{((2i-1)^2+(2j-1)^2)^3} - \frac{1}{((2i)^2+(2j)^2)^3}\right).$$

which can be evaluated to $I_J = 0.218387 \times \mathcal{U} + \mathcal{O}(\mathcal{U}/q^5)$. Similarly, the difference in energy of the two configurations due to the single particle terms can be calculated as $$\mathcal{D}_J = \Delta_J + 4\mathcal{U} \sum_{p=1}^{q}\sum_{i=p}^{\infty}(-F_0(i) + F_0(i+1)) \quad \text{Equation 57}$$

which can be evaluated to $\mathcal{D}_J = \Delta_J − 0.474188 \times \mathcal{U} + \mathcal{O}(\mathcal{U}/q^5)$. Without being bound by theory, the quantity $E_{A_i}^1 - E_{A_i}^0 = -\mathcal{D}_J - I_J$ can therefore be written as $$E_{A_i}^1 - E_{A_i}^0 = -\Delta_J + 0.255801 \times \mathcal{U} + \mathcal{O}(\mathcal{U}/q^5). \quad \text{Equation 58:}$$

Other Special Vertices

Without being bound by theory, some embodiments include other special vertices described above in addition to vertices at corners and junctions. These are vertices of degree 1 (open ends, such as $A_{12}$ in FIG. 12B), vertices on a grid point with two legs on the same grid line (straight structures, such as $A_{13}$ in FIG. 12B), and irregular vertices (such as $A_{14}$ in FIG. 12B). These special vertices can be treated as pseudo-spins, as described in more detail below. The analysis in the previous two sections can be repeated for all such vertices, thereby showing that these two can be described as being in one of two states.

Open ends. In some embodiments, energy can be lowered if a domain wall is moved away from a spin at the end of an open leg if the detuning is constant for the spins on that leg. Therefore, the pseudo-spin states can be restricted to the two ordered configurations on the 2q spins adjacent to the spin at the end of an open leg. Without being bound by theory, the energy difference between the two states of such an open leg can be denoted by:

$$E_{A_i}^1 - E_{A_i}^0 =$$
$$-\Delta_O + \mathcal{U}\sum_{i=1}^{q}\frac{1}{(2i)^6} = -\Delta_O + 0.015896 \times \mathcal{U} + O(\mathcal{U}/q^5)$$

Equation 59 where $\Delta_O$ is the detuning for the spin corresponding to the vertex of degree 1. The homogenous detuning on the 2q spins adjacent to the latter can be chosen to be equal to $\Delta_\infty$.

Straight structures. In some embodiments, for a regular special vertex, the relevant configurations for the ground state can be restricted to two ordered states by choosing a detuning for all 4q spins on the leg as $\Delta_\infty > \Delta_B$. With this choice it would be energetically favorable to move a potential domain wall into the adjacent neighboring regions. Without being bound by theory, the energy difference can be denoted by:

$$E_{A_i}^1 - E_{A_i}^0 =$$
$$-\Delta_S + \mathcal{U}\sum_{i=1}^{2q}\frac{1}{(2i)^6} = -\Delta_S + 0.015896 \times \mathcal{U} + O(\mathcal{U}/q^5)$$

Equation 60 where $\Delta_S$ denotes the detuning of the special vertex.

Irregular structures. In some embodiments, irregular vertices can be treated identically to straight structures. Since the spacing of the spins close to the irregular vertex is slightly larger than elsewhere (e.g., because irregular structures can be defined as structures where the spacing between vertices is larger than in ordinary structures to ensure that the number of ancillary vertices on each edge is even), any domain wall will be pushed away from the irregular structure naturally, if the detuning in the irregular structure is larger than $\Delta_B$. Thus, only the two ordered configurations are relevant for the ground state. The corresponding energy difference can be numerically evaluated for every choice of $\phi$ (which can indicate how ancillary vertices are positioned). In the large $\phi$ (and q) limit, it is possible to obtain the same analytic expression as in equation 60.

Effective Energy

In some embodiments, it is possible to determine the effective detuning $\Delta_{eff}$ of the pseudo-spins (such as the straight segments, corners, junctions, and other special vertices described above that can be described as having a limited set of states in the ground state) and their effective interaction energies $U_{i,j}^{eff}$. In some embodiments, knowing the effective detunings and effective interactions of pseudospins allows for encoding of the problem to be effectively solved.

Effective Interactions

In some embodiments and without being bound by theory, the discussion above with reference to straight segments, corners, junctions, and other special vertices can rely on the concept that only four spin configurations are relevant in each region $B_{i,j}$ to describe the ground state. These correspond to the four possible configurations of the spins in the adjacent regions $A_i$ and $A_j$. For example, if the detuning in $B_{i,j}$ is set to be homogeneous, $\Delta_B$, if $s_i=1$ and $s_j=0$ (or vice versa), the lowest energy configuration should correspond to the perfectly ordered state on $B_{i,j}$ (with $b_{i,j}$ spins in state $|1\rangle$, with b vertices in the set B), if $\Delta_{max} > \Delta_B > \Delta_{min}$. Any other configuration would require at least two domain walls. Second, if $s_i=s_j=0$ then energy can be lowered by arranging the spins in $B_{i,j}$ in an ordered configuration with $b_{i,j}$ spins in state $|1\rangle$, and one domain wall. The position of this domain wall does not change the energy up to $O(\mathcal{U}/k^5)$, such that there is no need to distinguish between the different domain wall configurations. Finally, if $s_i=s_j=1$ the lowest energy configuration is similarly achieved by an ordered configuration with one domain wall, if $\Delta_{max} > \Delta_B > \Delta_{min}$. While the position of the domain wall can be irrelevant, only $b_{i,j}-1$ spins are in state $|1\rangle$ in this state.

Without being bound by theory, in some embodiments, the relevant energy differences between these different relevant configurations can be readily calculated, as $$E_{B_{i,j}}^{1,0} - E_{B_{i,j}}^{0,0} = \mathcal{U}\sum_{r=1}^{\left\lceil\frac{b_{i,j}}{2}\right\rceil}\sum_{s=1}^{\left\lfloor\frac{b_{i,j}}{2}\right\rfloor}\left(\frac{1}{(2r+2s-2)^6} - \frac{1}{(2r+2s-1)^6}\right)$$

Equation 61

If $A_i$ and $A_j$ are not connected, this can be zero. Else, this term becomes independent of i and j in the large q and k limit, since $b_{i,j} = O(k)$, and evaluates to $$E_B^{1,1} - E_B^{1,0} = 0.0146637 \times \mathcal{U} + O(\mathcal{U}/k^5)$$

Equation 62:

Similarly, $E_B^{1,1} - E_B^{1,0}$ can be calculated as $$E_B^{0,0} - E_B^{1,0} =$$
$$E_B^{1,1} - E_B^{1,0} - \Delta_B + \mathcal{U}\sum_{r=1}^{\left\lceil\frac{b_{i,j}}{2}\right\rceil-1}\frac{1}{(2r)^6} + \mathcal{U}\sum_{r=1}^{\left\lfloor\frac{b_{i,j}}{2}\right\rfloor}\frac{1}{(b_{i,j}+2r)^6} =$$
$$E_B^{1,1} - E_B^{1,0} + \Delta_B + 0.015896 \times \mathcal{U} + O(\mathcal{U}/k^5)$$

Equation 63

Thus, in some embodiments the effective interaction between pseudo-spins $U_{i,j}^{eff} = U_{eff} = E_B^{1,1} + E_B^{0,0}$ can be written as $$U^{eff} = \Delta_B - 0.0134313 \times \mathcal{U} + O(\mathcal{U}/k^5).$$

Equation 64:

In such embodiments, the effective interaction depends only on the choice of the detuning in the connecting structures, $\Delta_B$, thereby allowing for control of the effective interactions for specifying problems.

Effective Detuning

In some embodiments, the effective detuning for a pseudo spin can be given by $\Delta_i^{eff} = E_{A_i}^0 - E_{A_i}^1 - m_i(E_B^{1,0} - E_B^{0,0})$, where $m_i$ is the degree of the special vertex, i (i.e. $m_i=2$ for corner vertices and straight structures, $m_i=3$ for junctions, and $m_i=1$ for open legs). The value of $E_{A_i}^0 - E_{A_i}^1$ can be fully tuned by the choice of the detuning of spin i. This can be chosen such that a homogeneous effective detuning, $\Delta_i^{eff} = \Delta_{eff}$, can be used for all four types of pseudo-spins. This can be achieved by $$\Delta_C = \Delta^{eff} + 0.173124 \times \mathcal{U},$$

Equation 65:

$$\Delta_J = \Delta^{eff} + 0.299792 \times \mathcal{U},$$

Equation 66:

$$\Delta_O = \Delta^{eff} + 0.0305597 \times \mathcal{U},$$

Equation 67:

$$\Delta_S = \Delta^{eff} + 0.0452234 \times \mathcal{U}.$$

Equation 68:

This is compatible with $\Delta_{max} \geq \Delta_v \geq \Delta_{min}$ and the realization of an effective spin model with $0 < \Delta^{eff} < U^{eff}$. In some embodiments, where this inequality is satisfied, the solution of the effective model can coincide with the solution of the hard problem to be solved.

Example QAOA Implementations

In some embodiments, additional considerations are relevant to implementing the QAOA techniques described in the present disclosure. The framework of QAOA is general, however, and can be applied to various technical platforms to solve combinatorial optimization problems.

Finite Measurement Samples

In some embodiments, quantum fluctuations (such as projection noise) can result in finite precision since the precision can be obtained via averaging over finitely many measurement outcomes that can only take on discrete values. Hence, there can be a trade-off between measurement cost and optimization quality: finding a good optimum can require good precision at the cost of a large number of measurements. Additionally, large variance in the objective function value can demand more measurements but may help improve the chances of finding near-optimal MaxCut configurations.

Without being bound by theory, as an example, the effect of measurement projection noise can be demonstrated with a full Monte-Carlo simulation of QAOA on some example graphs, where an objective function is evaluated by repeated projective measurements until its error is below a threshold. Exemplary implementation details of this numerical simulation are discussed in the section titled "Exemplary simulation with measurement projection noise."

Figure 18B:
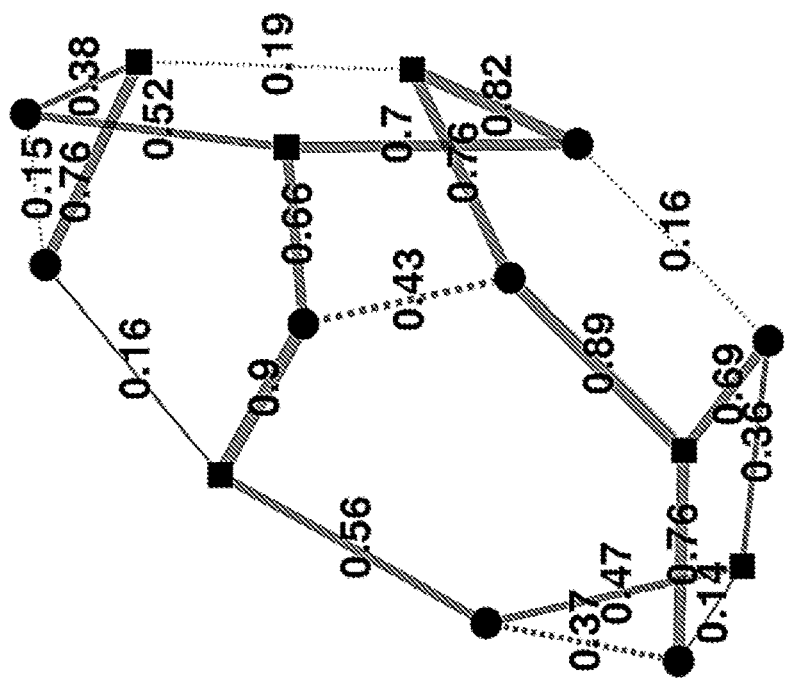
Figure 19:
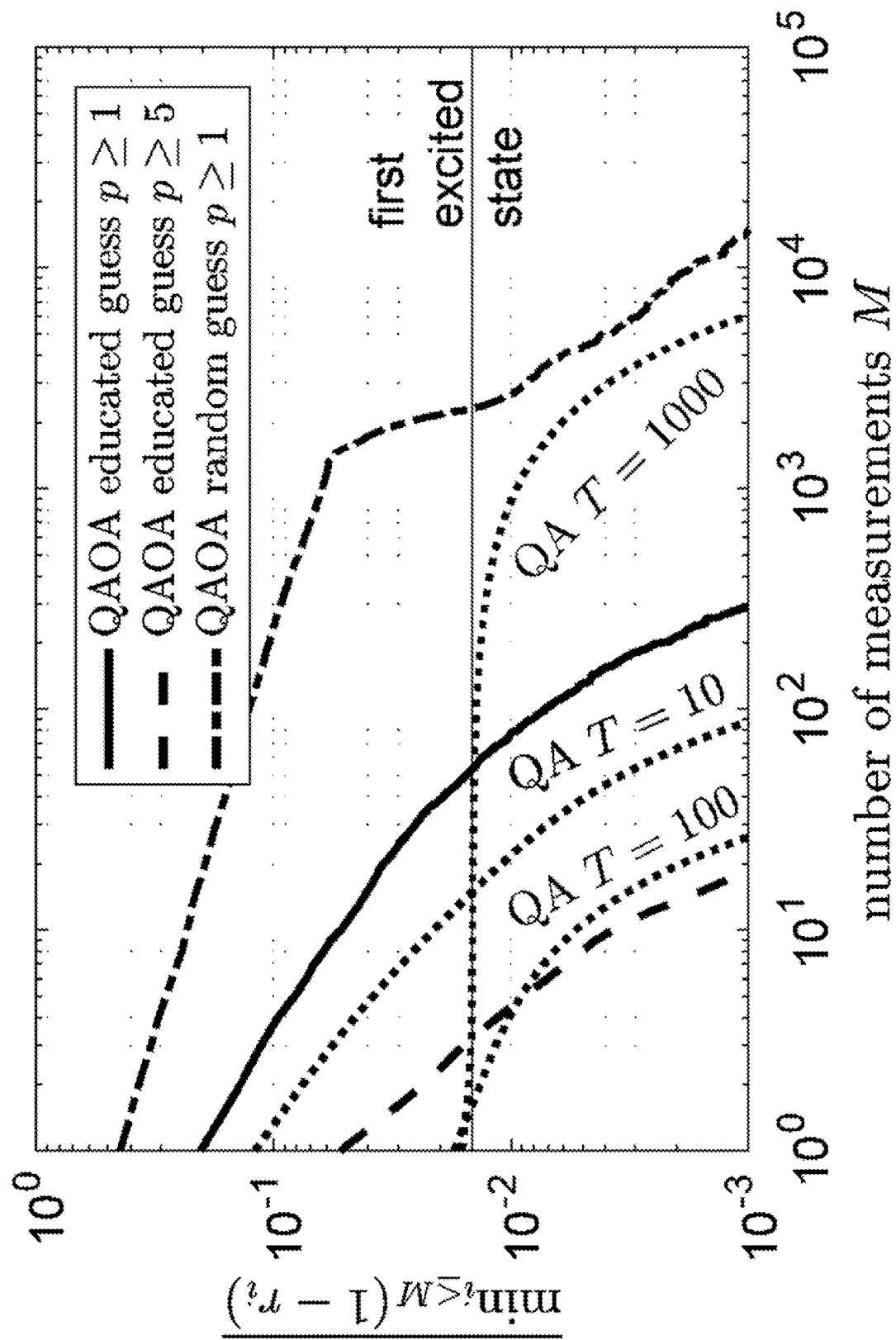
FIG. 19 is a graph showing the results of Monte-Carlo simulations of QAOA, according to some embodiments.

FIG. 19 shows Monte-Carlo simulation of QAOA accounting for measurement projection noise, on the example instance studied in FIG. 18B, according to some embodiments. Simulated QAOA is optimized with embodiments of the disclosed FOURIER heuristic starting at level either p=1 or p=5 using an educated choice of initial parameters based on known optima found for small size instances. The approximation ratio $r_i=|Cut_i|/|MaxCut|$ is tracked from the i-th measurement, and the minimum fractional error $1-r_i$ found after M measurements is plotted, averaged over many Monte-Carlo realizations. The solid and dashed lines correspond to QAOA optimized with the FOURIER strategy starting with an educated guess of ($\vec{\gamma}, \vec{\beta}$) at p=1 and p=5, respectively, and increasing p by 1 after a local optimum is found. A local optimum can be presumed to be found if the new candidate parameter vector norm changes by less than 0.01, or when the average $Cut_i$ changes by less than 0.1. The dash-dot line corresponds to QAOA optimized starting with randomly guessed ($\vec{\gamma}, \vec{\beta}$) at p=1, and increasing p by 1 after a local optimum is found. The three labelled dotted lines are results from repeatedly running QA with total time T=10, $10^2$, $10^3$, and performing measurements on the output state.

As shown in FIG. 19, QAOA can find the MaxCut solution in ~10-$10^2$ measurements, and starting embodiments of the disclosed optimization at intermediate level (p=5) is better than starting at the lowest level (p=1). In comparison, some embodiments with random choices of initial parameters starting at p=1 perform worse, which fail to find the MaxCut solution until $10^3$-$10^4$ measurements have been made. Moreover, if QAOA is compared to QA with various annealing time, it appears that the choice of annealing time T=100 can perform just as well as QAOA on this instance. Nevertheless, running QAOA at level p=5 is still more advantageous than QA at T=100, in some embodiments, when coherence time is limited.

While this exemplary simulation is limited to small-size instances, the good performance of QAOA and QA can be complicated by the small but significant ground state population from generic annealing schedules. Since it can take $10^2$ measurements to obtain a sufficiently precise estimate of the objective function, a ground state probability of $\gtrsim 10^{-2}$ would mean that one can find the ground state without much parameter optimization. In some embodiments, for larger problem sizes with $10^2$-$10^3$ qubits, the ground state probability from generic QAOA/QA protocol without optimization can decrease exponentially with system size, whereas the measurement cost of optimization grows merely polynomially with the problem size. The results here indicate that the parameter pattern and the disclosed heuristic strategies are practically useful guidelines in realistic implementation of QAOA that leverages optimization to significantly increase the probability of finding the ground state.

Implementation for Large Problem Sizes

Implementing a solution to the MaxCut problems with quantum machines can be limited by quantum coherence time and graph connectivity. In some embodiments, in terms of coherence time, QAOA is highly advantageous: the hybrid nature of QAOA as well as its short- and intermediate-depth circuit parametrization makes it useful for quantum devices. In addition, QAOA is not generally limited by the small spectral gaps, which demonstrates that interesting problems can be solved (or at least approximated) within the coherence time.

Performance of Heuristically Optimized QAOA

Comparison Between Heuristics Embodiments and Brute-Force

Figure 16A:
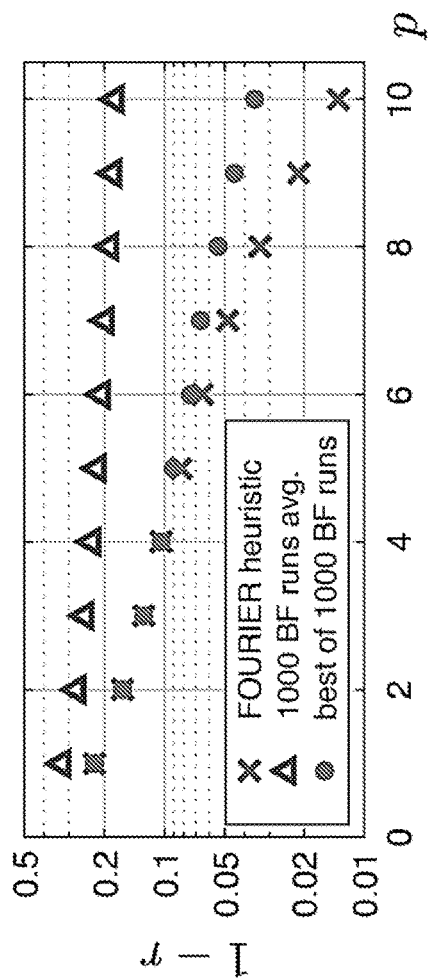
FIGS. 16A-16B are graphs showing comparisons of embodiments of disclosed heuristic strategies to brute force methods, according to some embodiments.

According to some embodiments, non-limiting comparisons of exemplary heuristic strategies to exemplary brute-force approaches can be evaluated. For example, FIG. 16A shows a comparison between an exemplary FOURIER heuristic and the brute-force (BF) approach for optimizing QAOA, on an example instance of 16-vertex w4R graph, according to some embodiments. The value of 1−r, where r is the approximation ratio, is plotted as a function of QAOA level p on a log-linear scale. The brute-force points are obtained by optimizing from 1000 randomly generated starting points, averaged over 10 such realizations. At low p, the exemplary FOURIER heuristic strategies perform just as well as the best out of 1000 brute-force runs-both are able to find the global optimum. The average performance of the brute-force strategy, on the other hand, is much worse than the disclosed heuristics. This indicates that the QAOA parameter landscape can be highly non-convex and filled with low-quality, non-degenerate local optima. When p≥5, the exemplary FOURIER heuristic outperforms the best brute-force run.

Figure 16B:
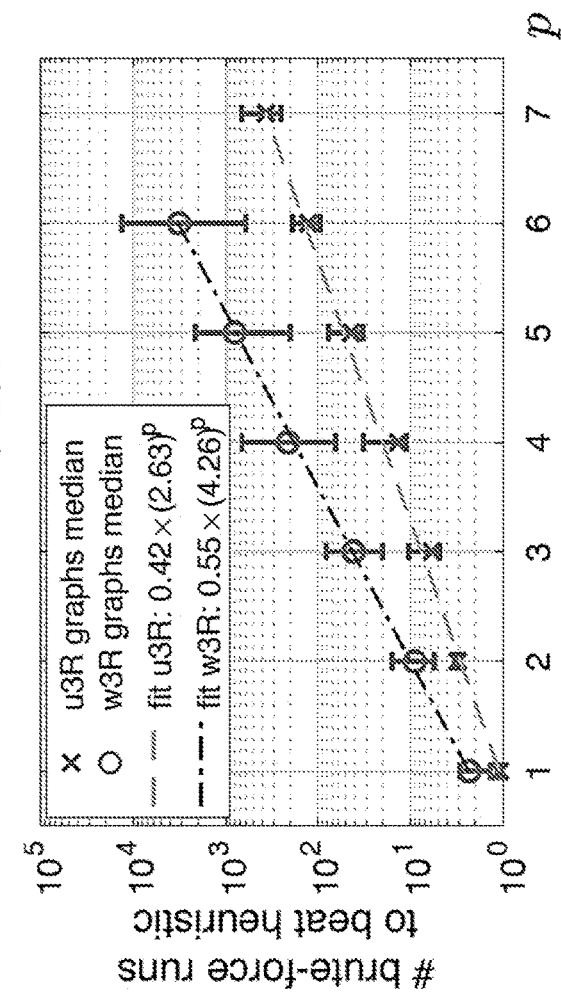

To estimate the number of brute-force runs needed to find an optimum with the same or better approximation ratio as the exemplary FOURIER heuristics, brute-force optimization was performed on 40 instances of 16-vertex u3R and w3R graphs with up to 40000 runs, as shown in FIG. 16B, according to some embodiments. In particular, FIG. 16B shows the median number of brute-force runs needed to obtain an approximation ratio as good as an exemplary FOURIER heuristic, for 40 instances of 16-vertex u3R and w3R graphs. A log-linear scale is used, and exponential curves are fitted to the results. Error bars are 5th and 95th percentiles. In FIG. 16B, the median number of brute-force runs needed to beat the exemplary FOURIER heuristic is shown to scale exponentially with p. Hence, the embodiments of the disclosed heuristics offer a dramatic improvement in the resource required to find good parameters for QAOA. As verified with an excessive number of brute-force runs, the heuristics often find the global optima.

Although most examples discussed in the present disclosure use gradient-based methods (BFGS) in numerical simulations, non-gradient based approaches, such as the Nelder-Mead method, can be used with the disclosed heuristic strategies. The choice to use gradient-based optimization can be motivated by the simulation speed, which in some implementations is faster with gradient-based optimization. In other embodiments, other procedures can be used.

Performance of QAOA on Typical Instances

Using embodiments of the disclosed heuristic optimization strategies in hand, the performance of intermediate p-level QAOA on many graph instances can be examined. For example, it is possible to consider many randomly generated instances u3R and w3R graphs with vertex number $8 \leq N \leq 22$ and use embodiments of the disclosed FOURIER strategy to find optimal QAOA parameters for level $p \leq 20$. In the following discussion, the fractional error $1-r$ is used to assess the performance of QAOA.

Figure 16D:
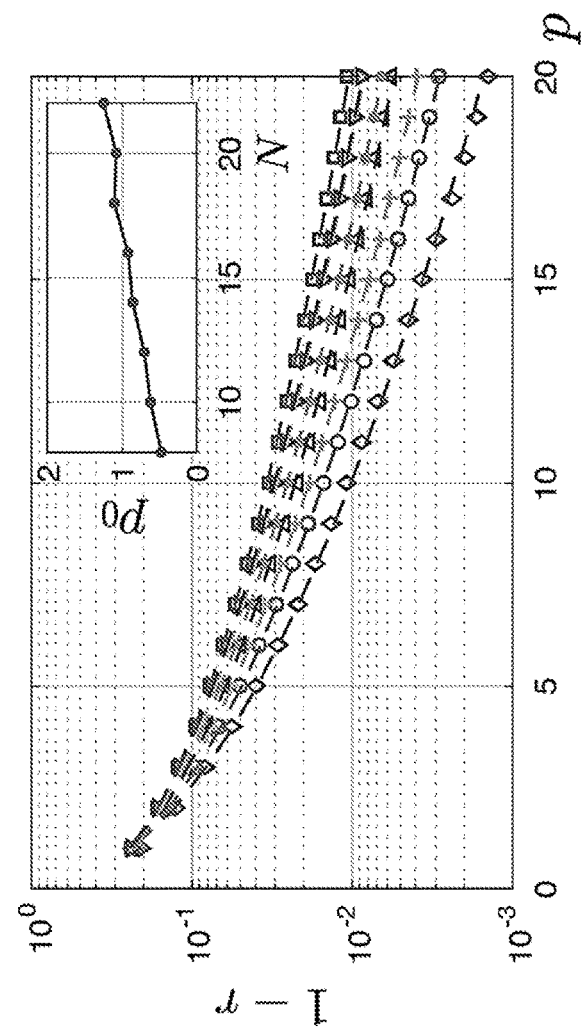
FIGS. 16C-16D are graphs showing the average performance of QAOA, according to some embodiments.
Figure 16C:
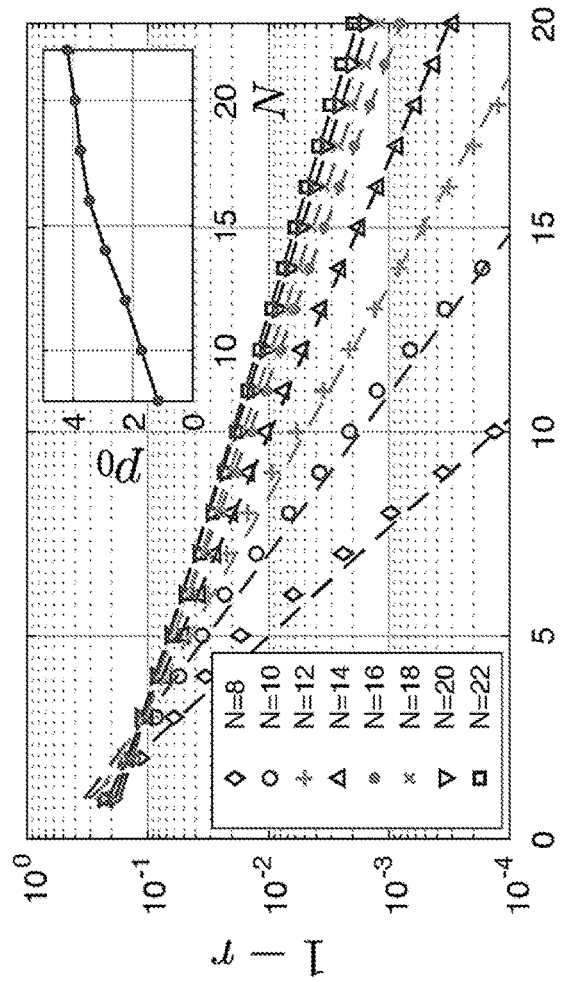

In one example, the case of unweighted graphs, specifically u3R graphs can be considered. For example, FIGS. 16C and 16D plot the fractional error $1-r$ as a function of QAOA's level p. The exemplary results shown in FIGS. 16C and 16D were obtained by applying embodiments of the disclosed heuristic FOURIER optimization strategies to up to 100 random instances of u3R graphs (FIG. 16C) and w3R graphs (FIG. 16D). Lines with different shapes correspond to fitted lines to the average for different system size N, where the model function is $1-r \propto e^{-p/p_0}$ for unweighted graphs and $$1 - r \propto e^{-\sqrt{p/p_0}}$$

for weighted graphs. Insets show the dependence of the fit parameters $p_0$ on the system size N.

As shown in FIG. 16C, on average, $1-r \propto e^{-p/p_0}$ appears to decay exponentially with p in some embodiments. Note that since the instances studied were u3R graphs with system size $N \leq 22$, where $C_{max} \leq |E| \leq 33$, such embodiments prepared the MaxCut state in virtually all scenarios where the fractional error goes below $\sim 10^{-2}$. Without being bound by theory, this good performance can be understood by interpreting QAOA as Trotterized quantum annealing, especially when the optimized parameters are of the pattern seen in FIGS. 15C-15H, where initialization is in the ground state of $-H_B$ and the system then evolves with $H_B$ (and $H_C$) with smoothly decreasing (and increasing) durations. The equivalent total annealing time T can be approximately proportional to the level p, since the individual parameters $\gamma_i$, $\beta_i = O(1)$ and can correspond to the evolution times under $H_C$ and $H_B$. If T is much longer than $1/\Delta_{min}^2$, where $\Delta_{min}$ is the minimum spectral gap (which can govern the application of quantum annealing algorithm (QAA), for example, by requiring a long time T to run where the spectral gap is small), quantum annealing can find the exact solution to MaxCut (ground state of $-H_C$) by the adiabatic theorem, and achieve exponentially small fractional error as predicted by the Landau-Zener formula. Numerically, the minimum gaps of these u3R instances when running quantum annealing can be determined to be on the order of $\Delta_{min} \gtrsim 0.2$ in some embodiments. It is thus not surprising that QAOA can achieve exponentially small fractional error on average of exemplary embodiments, since it can prepare the ground state of $-H_C$ through the adiabatic mechanism for these large-gap instances. Nevertheless, this exponential behavior can break down for some hard instances, where the gap is small.

As shown in FIG. 16D, in the case of w3R graphs, the fractional error appears to scale as $$1 - r \propto e^{-\sqrt{p/p_0}},$$

according to some embodiments. In some embodiments, the stretched-exponential scaling is true in the average sense, while individual instances have very different behavior. For easy instances whose corresponding minimum gaps $\Delta_{min}$ are large, exponential scaling of the fractional error can be found. For more difficult instances whose minimum gaps are small, fractional errors reach plateaus at intermediate p, before decreasing further when p is increased. These hard instances are discussed in more detail in the section below titled "Adiabatic Mechanisms, Quantum Annealing, and QAOA." Notably, when averaged over randomly generated instances, the fractional error is fitted remarkably well by a stretched-exponential function.

These results of average performance of embodiments of QAOA are notable despite considerations of finite-size effect. While the decay constant $p_0$ does appear to depend on the system size N as shown in the insets of FIG. 16C, 16D, the exemplary finite-size simulations shown in the present disclosure may not conclusively determine the exact scaling. In some embodiments, if the trend continues to system size of $N=100\sim1000$, then QAOA will be practically useful in solving interesting MaxCut instances, better or on par with other known algorithms, in a regime where finding the exact solution will be infeasible (i.e., it will be an effective quantum approximator). Even if QAOA fails for some worst-case graphs, it can still be practically useful, if it performs well on a randomly chosen graph of large system size.

Comparison Between Heuristics

Figure 23:
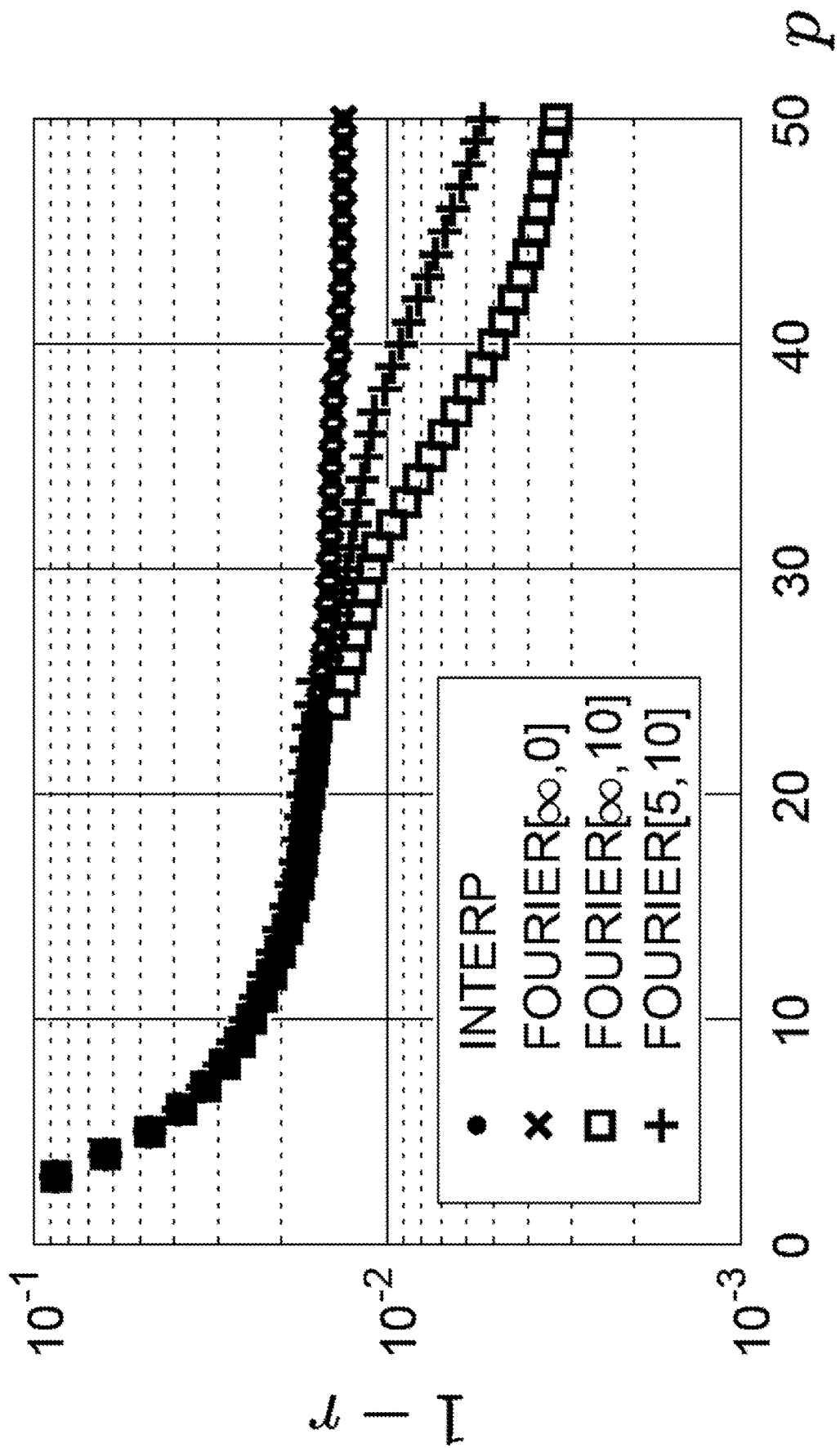
FIG. 23 is a graph showing a comparison between various heuristic strategies, according to some embodiments.

The difference in the performance among embodiments of the various heuristic strategies proposed in the present disclosure can be examined on an example instance of 14-vertex w3R graph. As shown in FIG. 23, exemplary embodiments of INTERP and FOURIER[∞, 0] strategies disclosed herein have essentially identical performance (except for small variations barely visible at large p), according to some embodiments. This can be explained by considering that both strategies generate starting points for optimizing level p+1 based on smooth deformation of the optimum at level p, in some embodiments. Furthermore, the FOURIER [∞, 10] strategy outperforms INTERP and FOURIER [∞, 0] beginning at level $p \gtrsim 20$. Notably, even when restricting the number of QAOA parameters to 2q=10, the FOURIER[q=5, R=10] strategy closely matches the performance of other heuristics at low p and beats the R=0 heuristic at large p. This suggests that the optimal QAOA parameters may in fact exist in a small-dimensional manifold. Therefore, optimization for intermediate p-level QAOA can be dramatically simplified by using the disclosed parameterization ($\vec{u}, \vec{v}$).

Adiabatic Mechanism, Quantum Annealing, and QAOA

The previous section discussed the performance of embodiments of QAOA for MaxCut on random graph instances in terms of the approximation ratio r. Although useful for approximate optimization, QAOA is often able to find the MaxCut configuration—the global optimum of the problem—with a high probability as level p increases. In this section, the efficiencies of example embodiments of the disclosed algorithms are shown to find the MaxCut configuration and compare it with quantum annealing. In some embodiments, QAOA is not necessarily limited by the minimum gap in the quantum annealing and explain a mechanism at work that allows it to overcome the adiabatic limitations.

Comparing QAOA with Quantum Annealing

A predecessor of QAOA, quantum annealing (QA) can be used for solving combinatorial optimization problems. Without being bound by theory, to find the MaxCut configuration that maximizes $\langle H_C \rangle$, the following simple QA protocol can be considered:

$$H_{QA}(s) = -[sH_C + (1-s)H_B], \quad s = t/T, \quad \text{Equation 69:}$$

where $t \in [0, T]$ and T is the total annealing time. The initial state can be prepared to be the ground state of $H_{QA}(S=0)$, i.e., $|\psi(0)\rangle = |+\rangle^{\otimes N}$. The ground state of the final Hamiltonian, $H_{QA}(s=1)$, can correspond to the solution of the MaxCut problem encoded in $H_C$. In adiabatic QA, the algorithm can rely on the adiabatic theorem to remain in the instantaneous ground state along the annealing path and solves the computational problem by finding the ground state at the end. To ensure a high probability of success, the run time of the algorithm typically scales as $T = O(1/\Delta_{min}^2)$, where $\Delta_{min}$ is the minimum spectral gap. Consequently, adiabatic QA becomes inefficient for instances where $\Delta_{min}$ is extremely small. These graph instances can be referred to as hard instances for adiabatic QA.

In some embodiments beyond the completely adiabatic regime, there is often a tradeoff between the success probability (ground state population $p_{GS}(T)$) and the run time (annealing time T): either algorithm can be run with a long annealing time to obtain a high success probability, or it can be run multiple times at a shorter time to find the solution at least once. One metric that can be used to determine the best balance can be referred to as the time-to-solution (TTS):

$$TTS_{QA}(T) = T \frac{\ln(1 - p_d)}{\ln[1 - p_{GS}(T)]} \quad \text{Equation 70}$$

$$TTS_{QA}^{opt} = \min_{T>0} TTS_{QA}(T). \quad \text{Equation 71}$$

$TTS_{QA}(T)$ can measure the time required to find the ground state at least once with the target probability $p_d$ (taken to be 99% in the present disclosure), neglecting non-algorithmic overheads such as state-preparation and measurement time. The adiabatic regime where $\ln[1-p_{GS}(T)] \propto T\Delta_{min}^2$ per Landau-Zener formula can yield $TTS_{QA} \propto 1/\Delta_{min}^2$ which is independent of T. In some cases, it can be better to run QA non-adiabatically to obtain a shorter TTS. By choosing the best annealing time T, regardless of adiabaticity, $TTS_{QA}^{opt}$ can be determined as the minimum algorithmic run time of QA. Without being bound by theory, a similar non-limiting metric can be defined for QAOA for purposes of benchmarking. The variational parameters $\gamma_i^*$ and $\beta_i^*$ can be regarded as the time evolved under the Hamiltonians $H_C$ and $H_B$, respectively. The sum of the variational parameters can be interpreted to be the total "annealing" time such that $$T_p = \sum_{i=1}^{p} (|\gamma_i^*| + |\beta_i^*|),$$

and $TTS_{QAOA}(p)$ and $TTS_{QAOA}^{opt}$ can be defined as:

$$TTS_{QAOA}(p) = T_p \frac{\ln(1 - p_d)}{\ln[1 - p_{GS}(p)]} \quad \text{Equation 72}$$

$$TTS_{QAOA}^{opt} = \min_{p>0} TTS_{QAOA}(p). \quad \text{Equation 73}$$

where $p_{GS}(p)$ is the ground state population after the optimal p-level QAOA protocol, in some embodiments. This quantity need not take into account the overhead in finding the optimal parameters. $TTS_{QAOA}(p)$ can be used to benchmark the algorithm but should not be taken directly to be the actual experimental run time.

To compare examples of the algorithms, $TTS_{QA}^{opt}$ and $TTS_{QAOA}^{opt}$ can be computed for many random graph instances. For each even vertex number from N=10 to N=18, 1000 instances of w3R graphs are generated. FIGS. 17A-17E are plots of the relationship between $TTS_{QAOA}^{opt}$ and the minimum gap $\Delta_{min}$ and vertex size N in quantum annealing for each exemplary instance, according to some embodiments. The maximum cutoff p is taken to be $p_{max}$=50, 50, 40, 35, 30 for N=10, 12, 14, 16, 18, respectively, for FIGS. 17A-17E. The dashed line corresponds to adiabatic QA run time of $1/\Delta_{min}^2$ predicted by Landau-Zener. Most of the exemplary random graphs have large gaps ($\Delta_{min} \gtrsim 10^{-2}$). The optimal TTS can be observed to follow the Landau-Zener prediction of $1/\Delta_{min}^2$ min for these graphs. This indicates that a quasi-adiabatic parametrization of QAOA can be the best when $\Delta_{min}$ is reasonably large, in some embodiments. Many exemplary graphs, however, exhibit very small gaps ($\Delta_{min} \lesssim 10^{-3}$), and thus require exceedingly long run time for adiabatic evolution. For some graphs, $\Delta_{min}$ is as small as $10^{-8}$, which can imply that an adiabatic evolution requires a run time $T \gtrsim 10^{16}$. Nevertheless, QAOA can find the solution for these hard instances faster than adiabatic QA. Notably, $TTS_{QAOA}^{opt}$ appears to be independent of the gap for many graphs that have extremely small gaps and beats the adiabatic TTS (Landau-Zener line) by many orders of magnitude, in some embodiments. Thus, an exponential improvement of TTS is possible with non-adiabatic mechanisms when adiabatic QA is limited by exponentially small gaps.

Similarly, for QA, the optimal annealing time T need not be in the adiabatic limit for small-gap graphs. FIGS. 17F-17J show $TTS_{QAOA}^{opt}$ versus $TTS_{QA}^{opt}$ for each random graph instance, according to some embodiments. Embodiments of QAOA outperform QA for instances below the dashed line. The (Pearson's) correlation coefficient between QAOA TTS and QA TTS is $\rho$ ($\ln(TTS_{QAOA}^{opt})$, $\ln(TTS_{QA}^{opt})$)≈0.91. As shown in FIGS. 17F-17J, there can be a strong correlation between $TTS_{QAOA}^{opt}$ and $TTS_{QA}^{opt}$ for each graph instance. Without being bound by theory, this suggests that QAOA is making use of the optimal annealing schedule, regardless of whether a slow adiabatic evolution or a fast diabatic evolution is better. Without being bound by theory, the following section titled "Beyond the adiabatic mechanism: a case study" explores a non-limiting example to explain aspects of the results observed in FIGS. 17A-17H and a mechanism of QAOA that go beyond the adiabatic paradigm.

Beyond the Adiabatic Mechanism: A Case Study

Figure 18A:
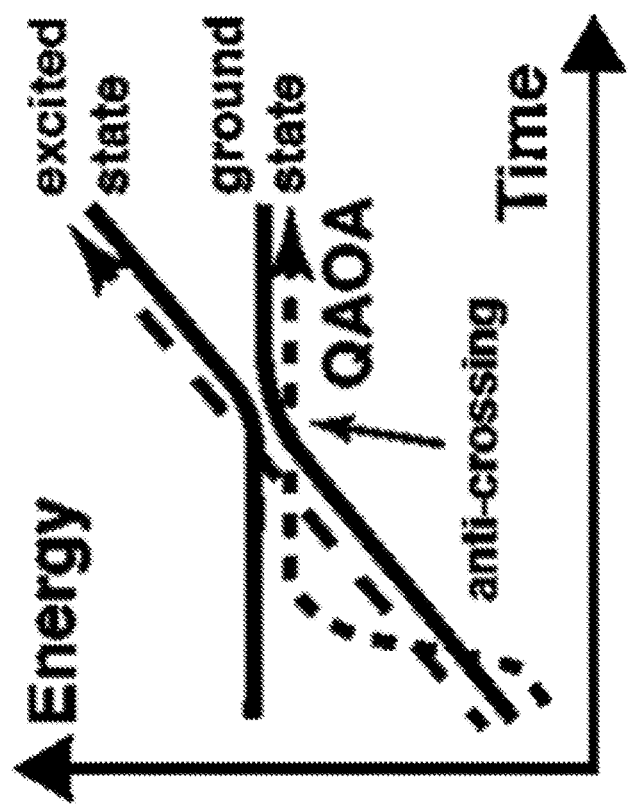

To understand the behavior of QAOA, graph instances that are hard for adiabatic QA can be addressed in more detail. For example, a representative instance is used to explain how embodiments of QAOA as well as diabatic QA can overcome the adiabatic limitations. As illustrated in 18A, QAOA can learn to utilize diabatic transitions at anti-crossings to circumvent difficulties caused by very small gaps in QA. FIG. 18A shows a schematic of how QAOA and the interpolated annealing path can overcome the small minimum gap limitations via diabatic transitions (small dashed line). Naive adiabatic quantum annealing path leads to excited states passing through the anti-crossing point (large dashed line).

FIG. 18B shows a representative instance of weighted 3-regular graph with N=14, which has a small minimum spectral gap $\Delta_{min} < 10^{-3}$, according to some embodiments. For example, FIG. 18B shows an instance of weighted 3-regular graph that has a small minimum spectral gap along the quantum annealing path given by equation 69. As an example, the optimal MaxCut configuration is shown with two vertex types (circles and squares), and the solid (dashed) lines are the cut (uncut) edges. For this example, hard instance, the quantum annealing process can be simulated. Without being bound by theory, FIG. 18C shows populations in the ground state and low excited states at the end of the process for different annealing time T, according to some embodiments. The solid line follows the Landau-Zener formula for the ground state population, $p_{GS}=1-\exp(-cT\Delta_{min}^2)$, where c is a fitting parameter. Since the minimum gap can be very small, the adiabatic condition requires $T \gtrsim 1/\Delta_{min}^2 \approx 10^6$. The Landau-Zener formula for the ground state population $p_{GS}=1-\exp(-cT\Delta_{min}^2)$ fits well with the exact numerical simulation discussed herein, where c is a fitting parameter. However, there is a "bump" in the ground state population at annealing time $T \approx 40$. At such a time scale, the dynamics can be considered non-adiabatic; which can be referred to as a "diabatic bump." This phenomenon has been observed in quantum annealing of other optimization problems as well.

In some embodiments, it is also possible to simulate QAOA on this hard instance. As mentioned above, although QAOA can optimizes energy instead of ground state overlap, substantial ground state population can still be obtained even for many hard graphs. Using an exemplary embodiment of the disclosed FOURIER heuristic strategy, various low-energy state populations of the output state are shown for different levels p shown in FIG. 18D, according to some embodiments. More particularly, FIG. 18D shows populations in low excited states using QAOA at different level p. The exemplary FOURIER heuristic strategy is used in the optimization shown in FIG. 18D. In such embodiments, QAOA can achieve similar ground state population as the diabatic bump at small p, with substantial enhancements occurring after $p \gtrsim 24$.

Without being bound by theory, to better understand the mechanism of embodiments of QAOA and make a comparison with QA, the QAOA parameters can be interpreted as a smooth annealing path. The sum of the variational parameters can be interpreted to be the total annealing time, i.e., $$T_p = \sum_{i=1}^{p}(|\gamma_i| + |\beta_i|),$$

as discussed above. A smooth annealing path can be constructed from QAOA optimal parameters as $$H_{QAOA}(t) = -[f(t)H_C + (1-f(t))H_{B_x}],\quad \text{Equation 74}$$

$$f\left(t_i = \sum_{j=1}^{i}\left((|\gamma_j^*| + |\beta_j^*|) - \frac{1}{2}(|\gamma_i^*| + |\beta_i^*|)\right)\right) = \frac{\gamma_i^*}{|\gamma_i^*| + |\beta_i^*|},\quad \text{Equation 75}$$

where $t_i$ can be chosen to be the mid-point of each time interval $(\gamma_i^* + \beta_i^*)$. With the boundary conditions f(t=0)=0, f(t=$T_p$)=1 and linear interpolation at other intermediate time t, QAOA parameters can be converted to a well-defined annealing path. This conversion can be applied to the QAOA optimal parameters at p=40, as shown in FIG. 18E, according to some embodiments. The annealing time parameter can be written as $s=t/T_p$, where $$T_p = \sum_{i=1}^{p}(|\gamma_i^*| + |\beta_i^*|).$$

The flat upper dotted line labels the location of anti-crossing where the gap is at its minimum, at which point f(s)≈0.92. The inset shows the original QAOA optimal parameters $\gamma_i^*$ and $\beta_i^*$ for p=40. With this annealing path, it is possible to follow the instantaneous eigenstate population throughout the quantum annealing process, as shown in FIG. 18F, according to some embodiments. In particular, FIG. 18F shows instantaneous eigenstate populations under the annealing path given in FIG. 18E. Note that the instantaneous ground state and first excited state swap at the anti-crossing point. In contrast to adiabatic QA, the state population leaks out of the ground state and accumulates in the first excited state before the anticrossing point, where the gap is at its minimum. Using a diabatic transition at the anti-crossing, the two states can swap populations, and a large ground state population is obtained in the end. The final state population from the constructed annealing path can differ slightly from those of QAOA, due to, for example, Trotterization and interpolation, but without being bound by theory, the underlying mechanism can be interpreted as the same, which can also be considered responsible for the diabatic bump seen in FIG. 18C. In addition to the conversion used in the equation above, other prescriptions can be used to construct an annealing path from QAOA parameters, and qualitative features do not seem to change.

Figure 17A:
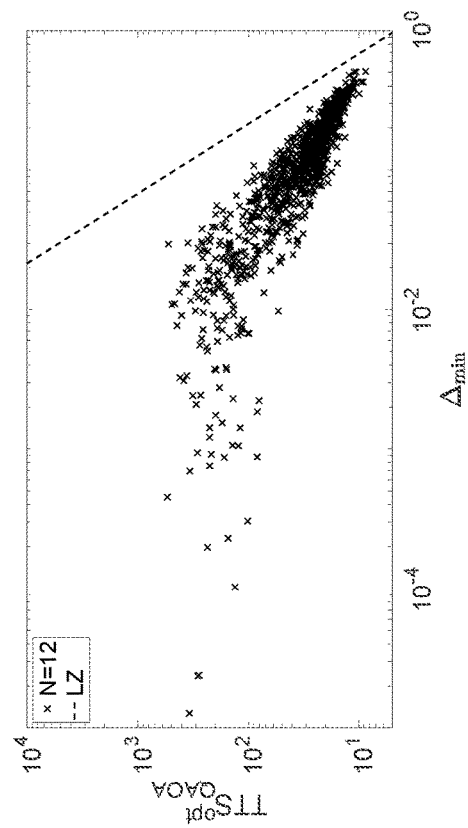
FIGS. 17A-17J are plots showing the performance of QAOA as compared to QA, according to some embodiments.
Figure 17B:
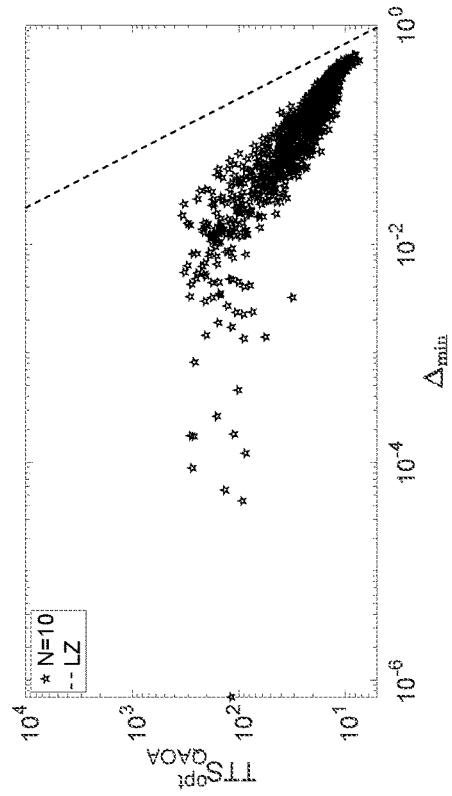
Figure 17C:
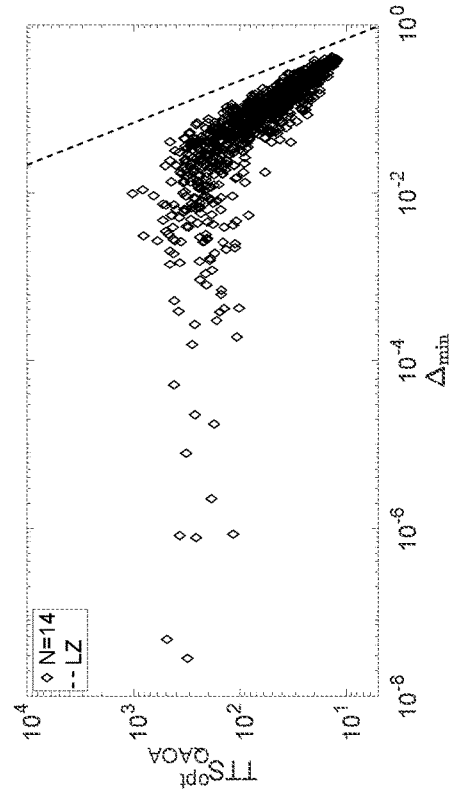
Figure 17E:
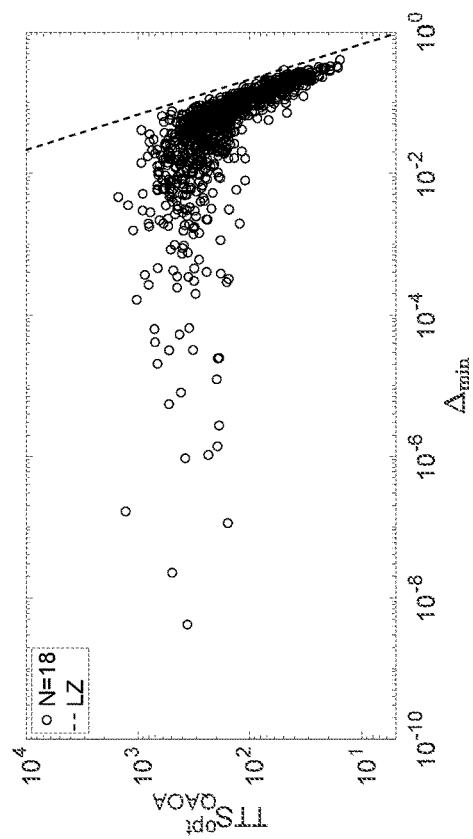
Figure 17D:
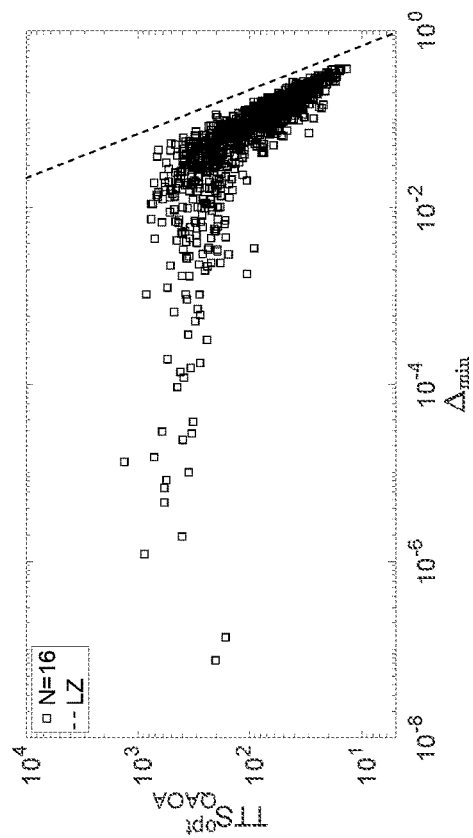
Figure 17F:
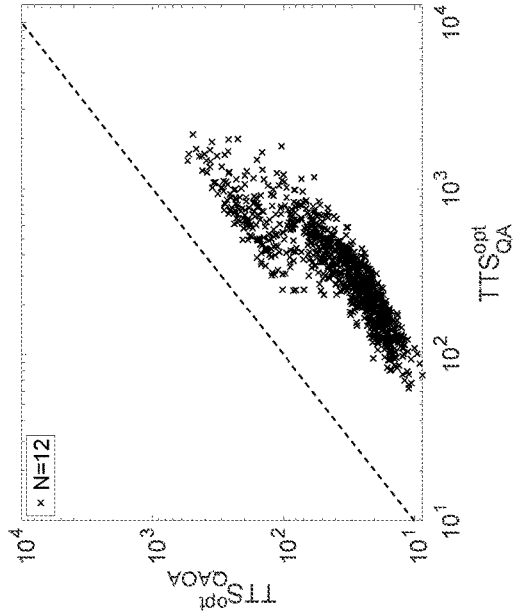
Figure 17G:
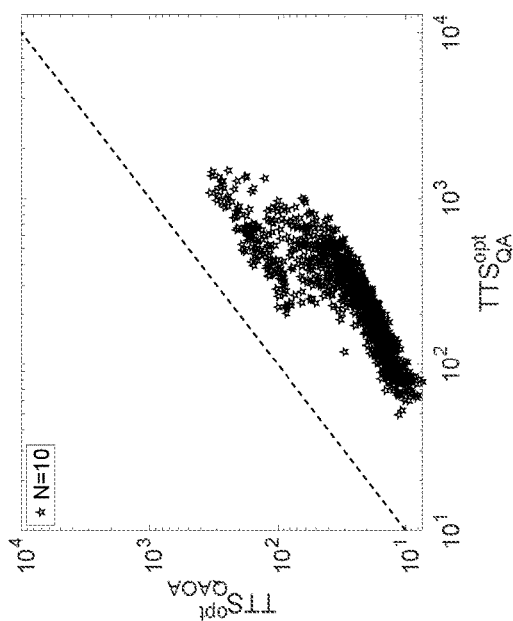
Figure 17H:
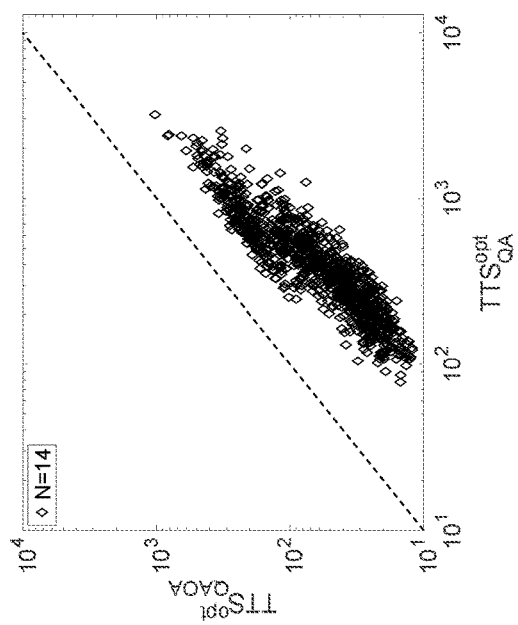
Figure 17J:
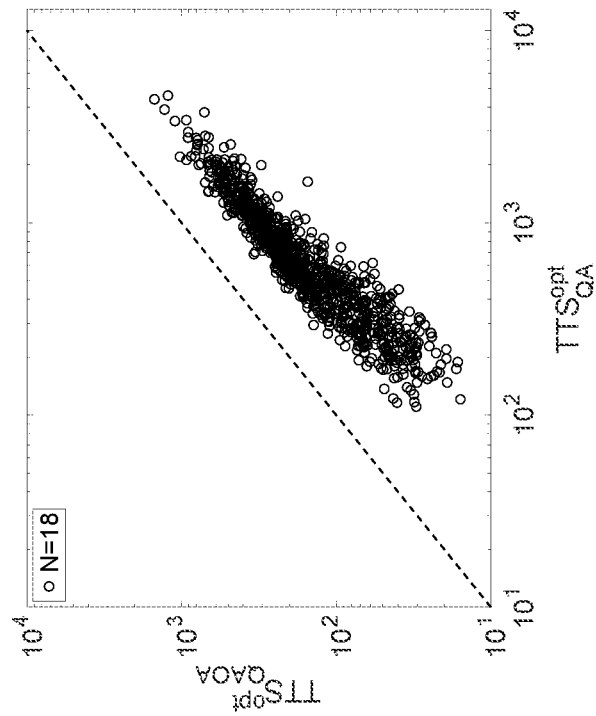
Figure 17I:
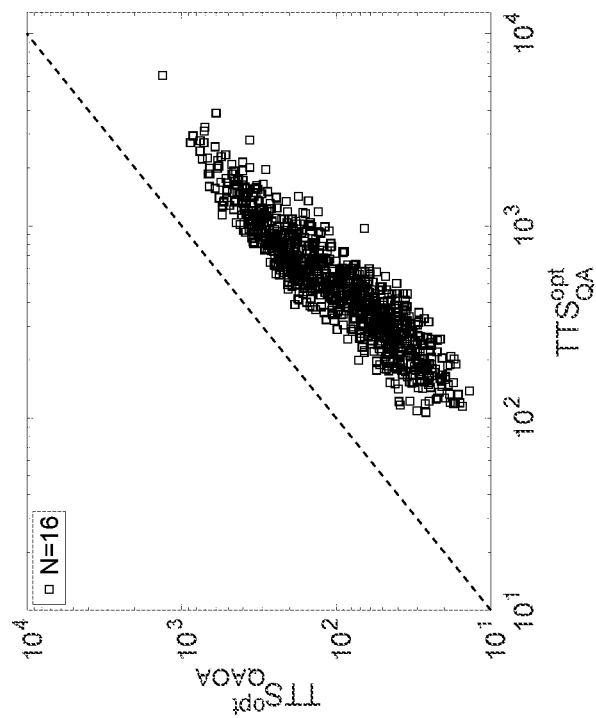

Without being bound by theory, these results indicate that QAOA is closely related to a cleverly optimized diabatic QA path that can overcome limitations set by the adiabatic theorem. Through optimization, QAOA can find a good annealing path and exploit diabatic transitions to enhance ground state population. This explains the observation in FIGS. 17A-17E that $TTS_{QAOA}^{opt}$ can be significantly shorter than the time required by the adiabatic algorithm. On the other hand, as seen in FIGS. 17H-17J, $TTS_{QAOA}^{opt}$ can be strongly correlated with $TTS_{QA}^{opt}$: QAOA can find a good annealing path, which could be adiabatic or not, depending on what is the best route for the specific problem instance.

The effective dynamics of QAOA for these exemplary specific instances, as shown in FIG. 18F, can be understood, without limitation, by an effective two-level system discussed in more detail in the following section. In general, the energy spectrum can be more complex, and the dynamics may involve many excited states, which may not be explainable by the simple schematic in FIG. 18A. Nonetheless, QAOA can find a suitable path via the disclosed heuristic optimization strategies even in more complicated cases.

Effective Few-Level Understanding of the Diabatic Bump

Without being bound by theory, this section elucidates the mechanism of the diabatic bump discussed above with reference to FIG. 18C via effective few-level dynamics. The intermediate dynamics during quantum annealing can be understood using the basis of instantaneous eigenstates $|\epsilon_l(t)\rangle$, where $$H_{QA}(t)|\epsilon_l(t)\rangle = \epsilon_l(t)|\epsilon_l(t)\rangle,\quad \text{Equation 76:}$$

Expanding the time-evolved state in this basis as $|\psi(t)\rangle =\Sigma_l a_l(t)|E_l(t)\rangle$, the Schrodinger equation can be written as $$i\sum_l (\dot{a}_l|\in_l\rangle + a_l|\dot{\in}_l\rangle) = \sum_l \in_l a_l|\in_l\rangle, \quad \text{Equation 77}$$

where $\hbar=1$ and the time dependence in the notations is dropped for convenience. Multiplying the equation by $\langle \in_k|$, the Schrodinger equation becomes $$i\dot{a}_k = \in_k a_k - i\sum_{l\neq k} a_l \langle \in_k | \dot{\in}_l\rangle, \quad \text{Equation 78}$$

where $\langle \in_k | \dot{\in}_k\rangle = 0$ is taken by absorbing the phase into the eigenvector $|\in_k\rangle$. Written in a matrix form, it can be seen that $$i = \begin{pmatrix}\dot{a}_0 \\ \dot{a}_1 \\ \dot{a}_2 \\ \vdots\end{pmatrix} = \begin{pmatrix} 0 & & -i\langle\in_0|\dot{\in}_1\rangle - i\langle\in_0|\dot{\in}_2\rangle & \cdots \\ -i\langle\in_1|\dot{\in}_0\rangle & \Delta_{10} & -i\langle\in_1|\dot{\in}_2\rangle & \cdots \\ -i\langle\in_2|\dot{\in}_0\rangle - i\langle\in_2|\dot{\in}_1\rangle & & \Delta_{20} & \cdots \\ \vdots & \vdots & \vdots & \ddots\end{pmatrix}\begin{pmatrix}a_0 \\ a_1 \\ a_2 \\ \vdots\end{pmatrix}, \quad \text{Equation 79}$$

where the ground state energy is $\in_0=0$ (by absorbing it into the phase of the coefficients) and $\Delta_{i0}=\in_i-\in_0$ is the instantaneous energy gap from the ith excited state to the ground state. The time evolution starts from the initial ground state with $a_0=1$ and $a_i=0$ for $i\neq 0$, and the adiabatic condition to prevent coupling to excited states is $$\frac{|\langle\in_0|\dot{\in}_1\rangle|}{\Delta_{i0}} = \frac{\left|\langle\in_0\left|\frac{dH_{QA}}{dt}\right|\in_i\rangle\right|}{\Delta_{i0}^2} = \frac{\left|\langle\in_0\left|\frac{dH_{QA}}{ds}\right|\in_i\rangle\right|}{\Delta_{i0}^2 T} \ll 1 \quad \text{Equation 80}$$

The first equality can be derived from equation 76. This can produce the standard adiabatic condition $T=O(1/\Delta_{min}^2)$. As discussed above, the minimum gap for some graphs can be exceedingly small, so the adiabatic limit may not be practical. However, it is possible to choose an appropriate run time T, which breaks adiabaticity, but is long enough such that only few excited states are effectively involved in the dynamics. This is the regime where the diabatic bump operates and one can understand the dynamics by truncating equation 79 to the first few basis states.

Figure 25A:
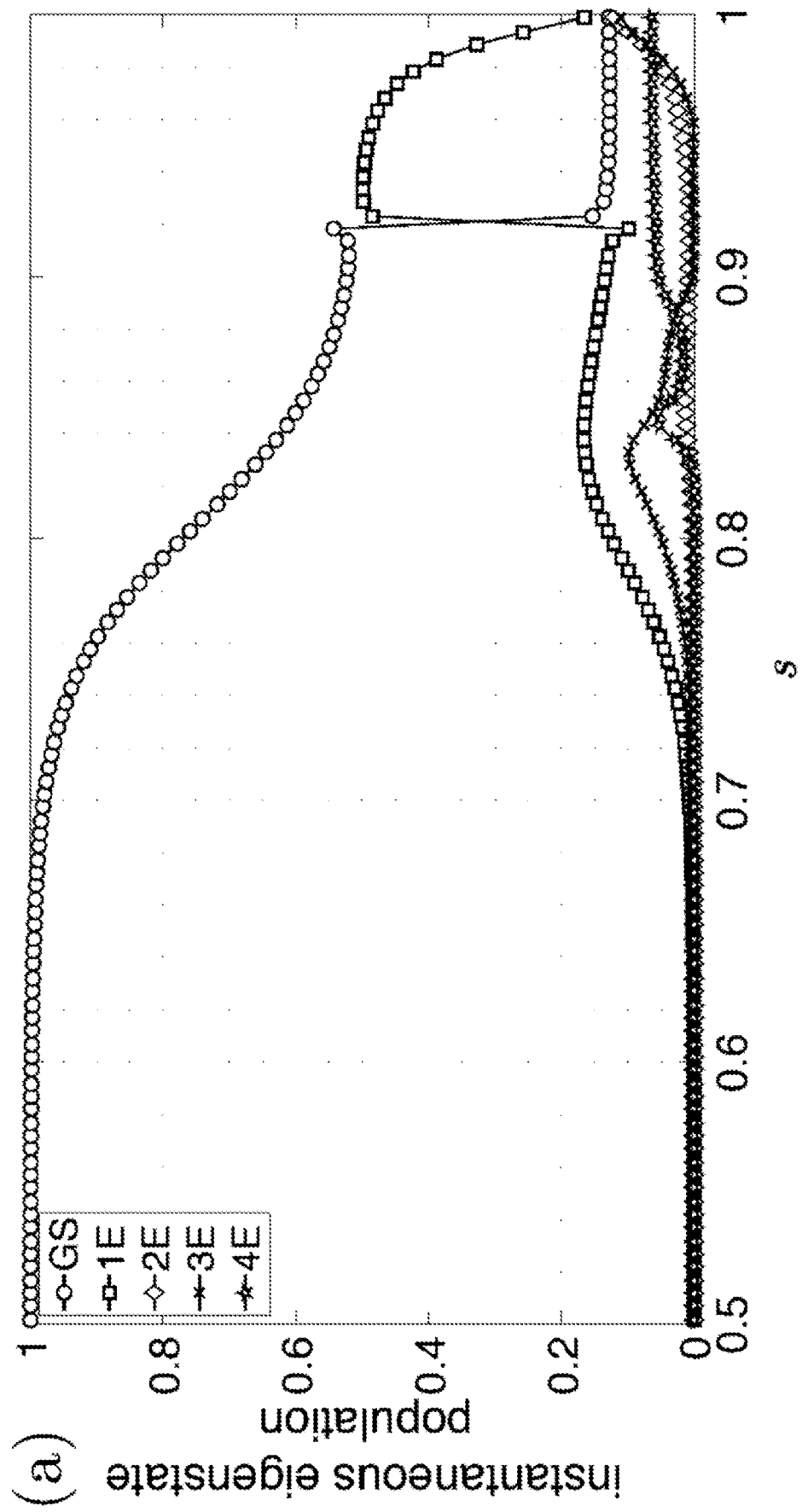
FIGS. 25A-25B are graphs showing exemplary instantaneous eigenstate populations and couplings, according to some embodiments.

As an example, FIG. 25A plots the instantaneous eigenstate populations of the first few states, according to some embodiments. In particular, FIG. 25A plots instantaneous eigenstate populations along the linear-ramp quantum annealing path given by equation 69 for the example graph in FIG. 18B. The annealing time can be chosen to be T=T*=40, which can correspond to the time where the diabatic bump occurs in FIG. 18C. FIG. 25A is simulated with the full Hilbert space, but effectively the same dynamics will be generated if the simulation is restricted to the first few basis states in equation 79.

Figure 25B:
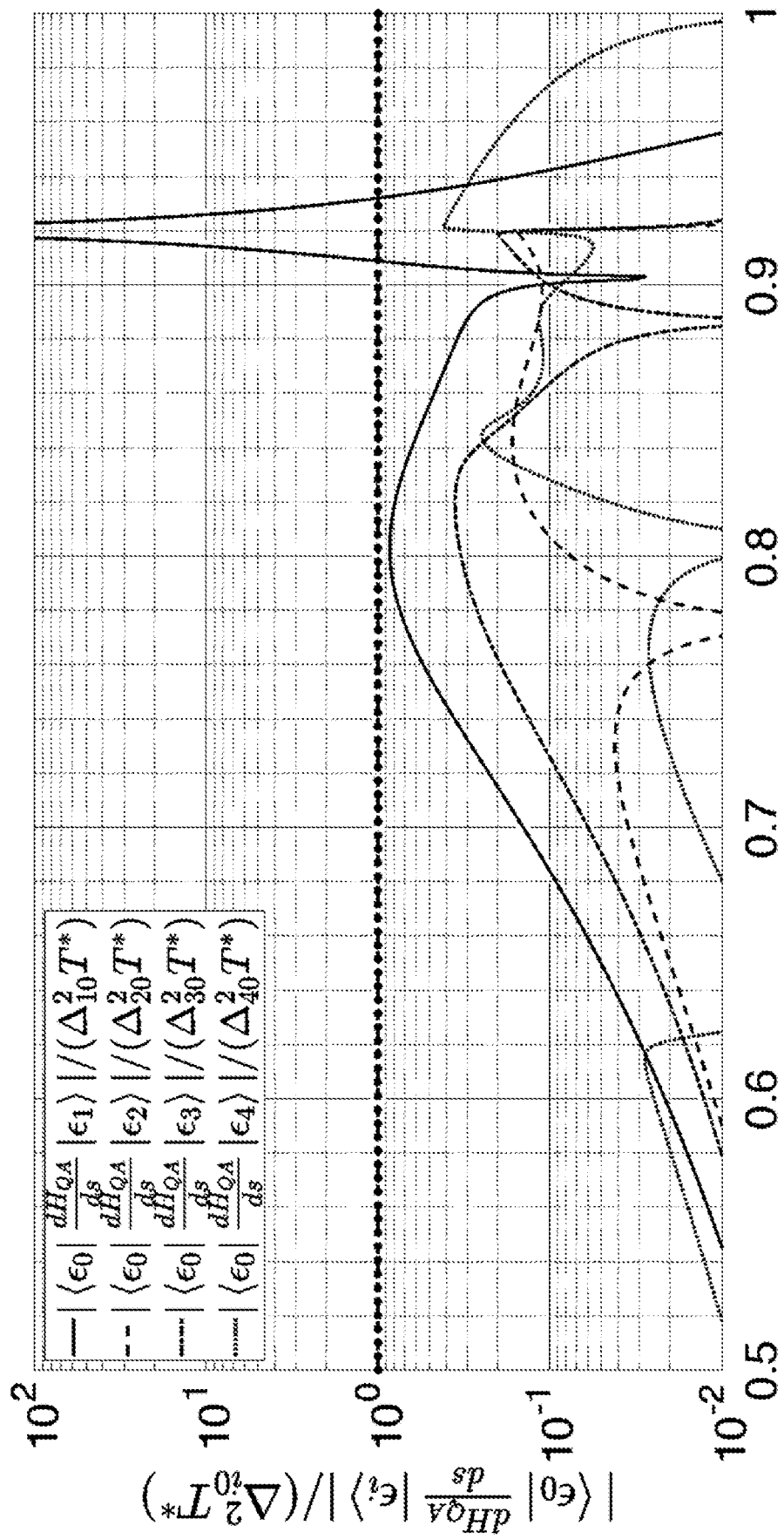

FIG. 25B shows the strength of the couplings between the instantaneous ground state and the low excited states, according to some embodiments. The plotted quantities measure the degree of adiabaticity (as explained in equation 80). By comparing FIGS. 25A and 25B it is possible to see that T=T*=40 allows the time evolution to break the adiabatic condition before the anticrossing: population leaks to the first excited state, which becomes the ground state after the anticrossing. Thus, the time scale of T* for the diabatic bump represents a delicate balance between allowing population to leak out of the ground state and suppressing excessive population leakage, which without being bound by theory explains why it happens at a certain range of time scale.

Example Graph Instance and Time-to-Solution

Figure 24A:
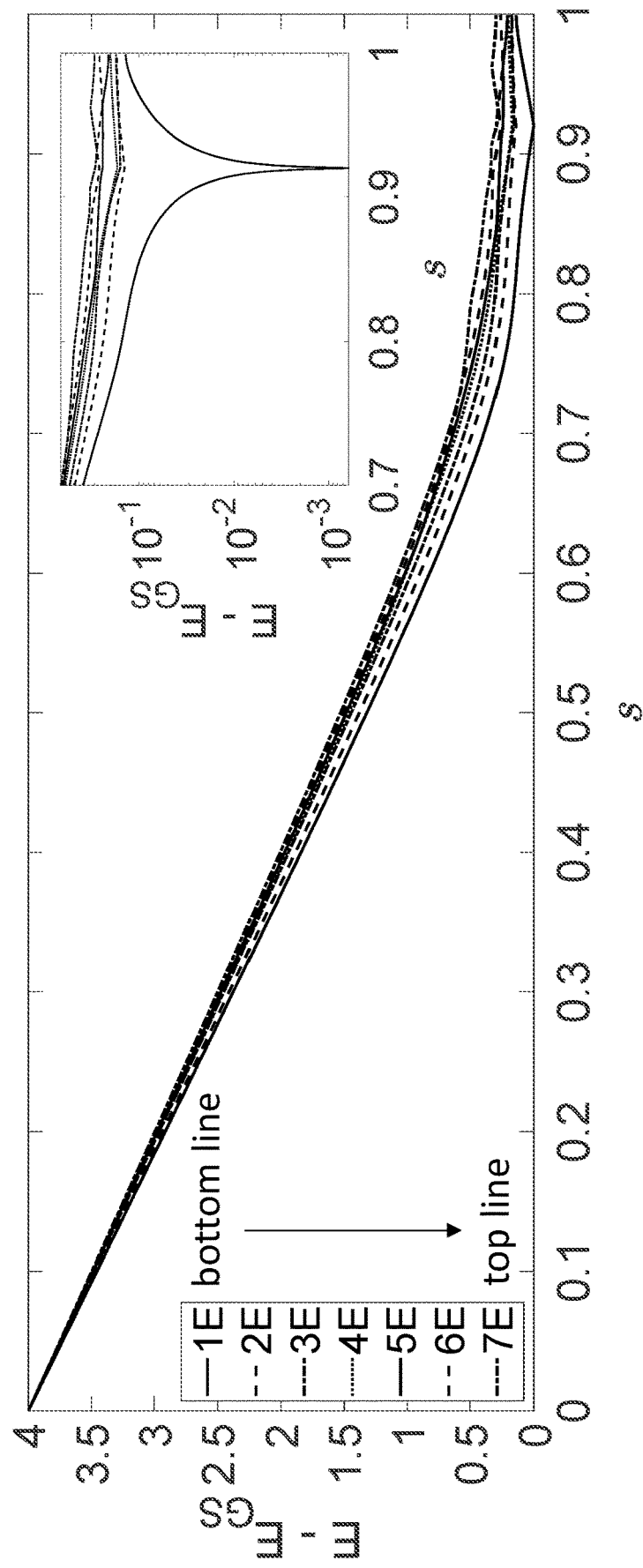
FIGS. 24A-24C are graphs showing energy spectra and time to solution for QAOA and QA, according to some embodiments.

In the previous sections, an example representative graph instance where the adiabatic minimum gap is small was considered with reference to FIG. 18B. The low energy spectrum for the graph along the QA path can be seen in FIG. 24A, according to some embodiments. More particularly, FIG. 24A shows an exemplary energy spectrum of low excited states (measured from the ground state energy $E_{GS}$) along the annealing path for the graph instance given in FIG. 18B. Only states that can, in this example, couple to the ground state are shown, such as states that are invariant under the parity operator $$P = \prod_{i=1}^{N} \sigma_i^x.$$

inset shows the energy gap from the ground state in logarithmic scale. As shown in the embodiment of FIG. 24A, only eigenstates that are invariant under the parity operator $$P = \prod_{i=1}^{N} \sigma_i^x$$

are shown, since the Hamiltonian $H_{QA}(s)$ commutes with P and the initial state is P-invariant: $P|\psi(0)\rangle = |\psi(0)\rangle$.

Figure 24B:
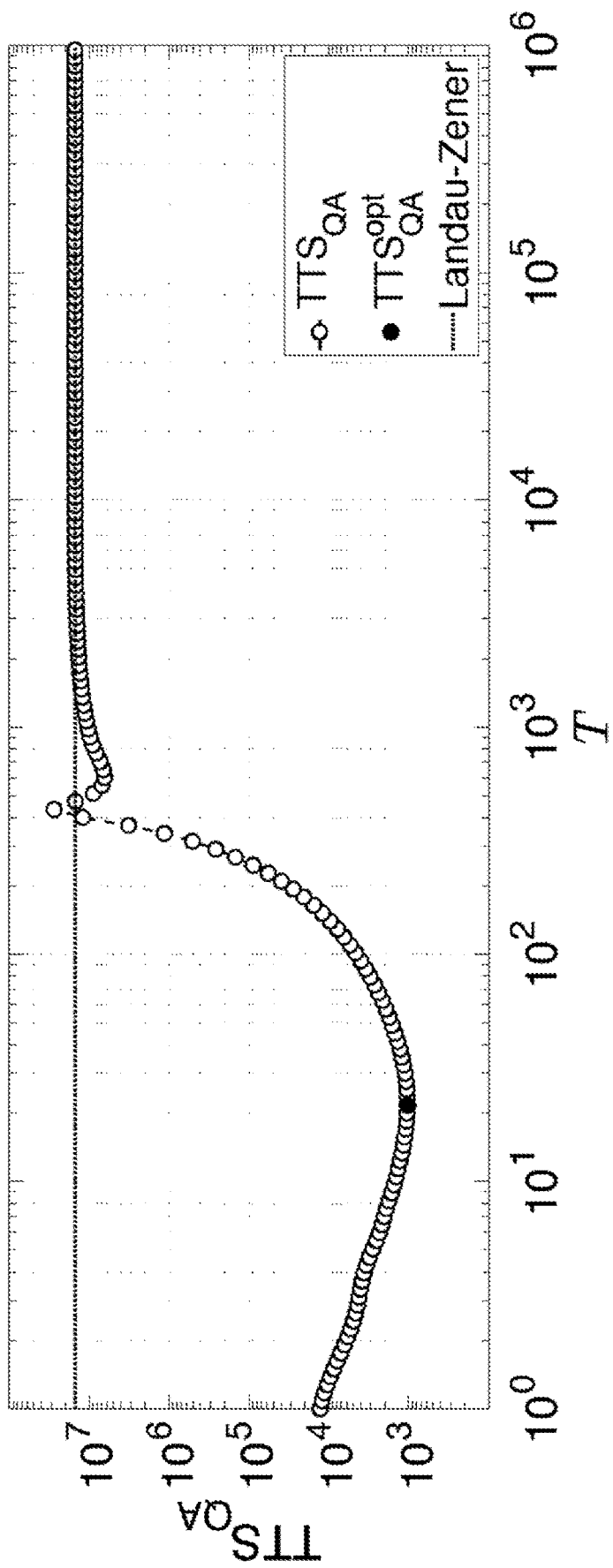
Figure 24C:
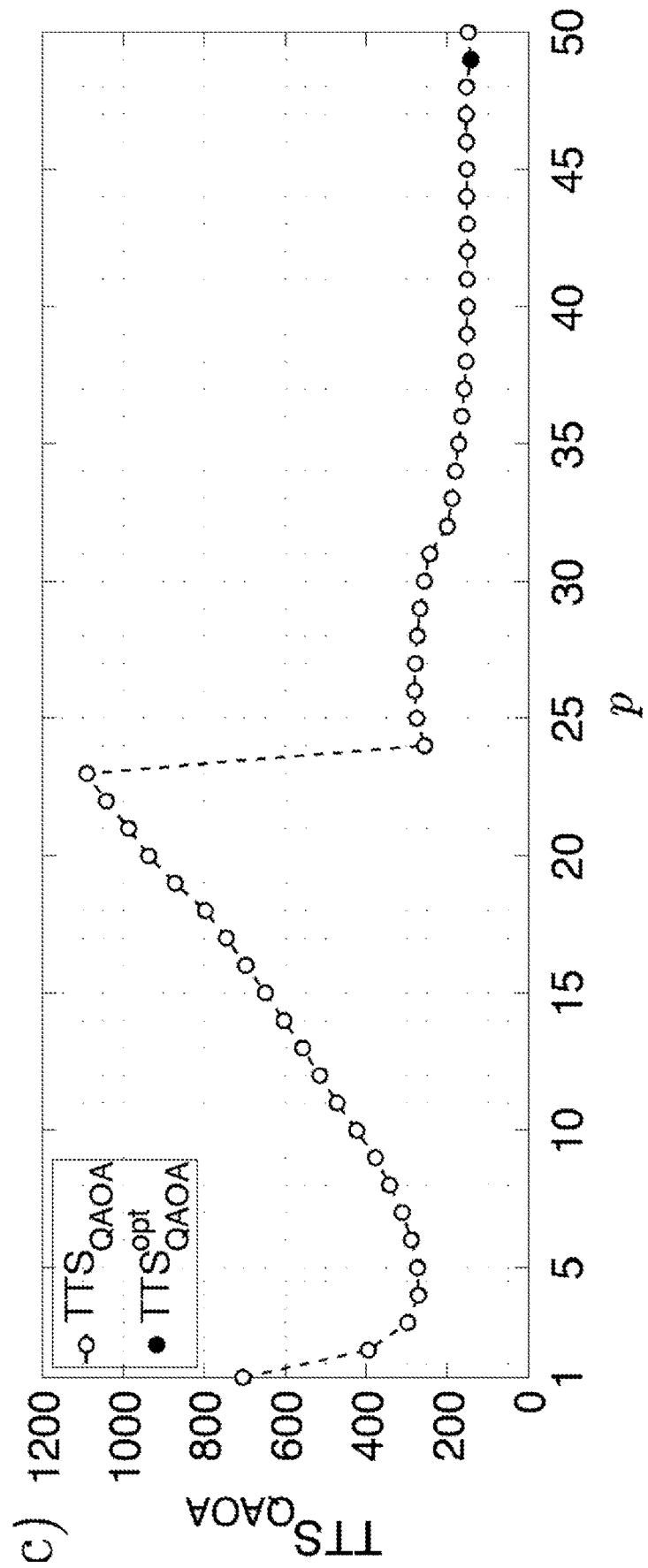

FIGS. 24B and 24C illustrate $TTS_{QA}$ and $TTS_{QAOA}$ for the same graph. In particular, FIG. 24B shows the time-to-solution for the linear-ramp quantum annealing protocol, $TTS_{QA}$, for the same graph instance. In this embodiment, TTS in the long-time limit follows a line predicted by the Landau-Zener formula, which is independent of the annealing time T. FIG. 24C shows TTS for QAOA at each iteration depth p. For QA, it can be seen that non-adiabatic evolution with T≈20 yields orders of magnitude shorter TTS than the adiabatic evolution. In addition, TTS in the adiabatic limit is independent of the annealing time T, following the Landau-Zener formula $p_{GS}=1-\exp(-cT\Delta_{min}^2)$. For QAOA, an exemplary embodiment of the FOURIER[∞, 10] heuristic strategy is used to perform the numerical simulation up to $p_{max}=50$, and compute $TTS_{QAOA}(p)$ and $TTS_{QAOA}^{opt}$ (up to $p\leq p_{max}$). For this particular figure, although $TTS_{QAOA}^{opt}$ occurs at p=49, in some embodiments it may be better to run QAOA at p=4 or p=5 due to optimization overhead and error accumulation at deeper circuit depths. The apparent discontinuous jump in $TTS_{QAOA}$ shown in FIG. 24C is due to the corresponding jump in $p_{GS}(p)$, which can be explained by two reasons: first, embodiments of the disclosed heuristic strategy is not guaranteed to find the global optimum, and random perturbations may help the algorithm escape a local optimum, resulting in a jump in ground state population;

second, even when the global optimum is found for all level p, there can still be discontinuities in $p_{GS}$, since the objective function of QAOA is energy instead of ground state population.

Simulation Techniques
Details of Simulation with Measurement Projection Noise

When running QAOA on actual quantum devices, the objective function can be evaluated by averaging over many measurement outcomes, and consequently its precision can be limited by the so-called measurement projection noise from quantum fluctuations, in some embodiments. This effect can be accounted for by performing full Monte-Carlo simulations of actual measurements, where the simulated quantum processor only outputs approximate values of the objective function obtained by averaging M measurements:

$$\bar{F}_{p,M} = \frac{1}{M}\sum_{i=1}^{m} C(z_{p,i})$$

Equation 81 where $z_{p,i}$ is a random variable corresponding to the ith measurement outcome obtained by measuring $|\psi_p(\vec{\gamma}, \vec{\beta})\rangle$ in the computational basis, and $C(z)$ is the classical objective function. Note when $M \to \infty$, $\bar{F}_{p,M} \to F_p = \langle \psi_p(\vec{\gamma}, \vec{\beta})|H_C|\psi_p(\vec{\gamma}, \vec{\beta})\rangle$. In the exemplary simulation, finite precision $|\bar{F}_{p,M} - F_p| \lesssim \xi$ can be achieved by sampling measurements until the cumulative standard error of the mean falls below the target precision level $\xi$. In other words, for each evaluation of $F_p$ requested by the classical optimizer, the number of measurements M performed is set by the following criterion:

$$\sqrt{\frac{1}{M(M-1)}\sum_{i=1}^{M}[C(z_{p,i}) - \bar{F}_{p,M}]^2} \leq \xi$$

Equation 82

In some embodiments, it can be expected that $M \approx \text{Var}(F_p)/\xi^2$. To address issues that can appear with finite sample sizes, at least 10 measurements are performed ($M \geq 10$) for each objective function evaluation.

Regarding the classical optimization algorithm used to optimize QAOA parameters, generally, classical optimization algorithms iteratively use information from some given parameter point ($\vec{\gamma}, \vec{\beta}$) to find a new parameter point ($\vec{\gamma}', \vec{\beta}'$) that produces a larger value of the objective function $F_p$ ($\vec{\gamma}', \vec{\beta}'$) $\geq F_p(\vec{\gamma}, \vec{\beta})$. In order for the algorithm to terminate, some stopping criteria can be set. In some embodiments, up to two can be used: First, an objective function tolerance E can be set, such that if the change in objective function $|\bar{F}_{p,M}(\vec{\gamma}, \vec{\beta}) - \bar{F}_{p,M}(\vec{\gamma}', \vec{\beta}')| \leq \epsilon$, the algorithm terminates. Second, a step-tolerance $\delta$ can also be set so that the algorithm terminates if the new parameter point is very close to the previous one $|\vec{\gamma}' - \vec{\gamma}|^2 + |\vec{\beta}' - \vec{\beta}|^2 \leq \delta^2$. For gradient-based optimization algorithms such as BFGS, $\delta$ can also be used as the increment size for estimating gradients via the finite-difference method: $\partial F_p/\partial \gamma_i \approx [\bar{F}_{p,M}(\gamma_i + \delta) - \bar{F}_{p,M}(\gamma_i)]/\delta$. In the simulations discussed herein, the BFGS algorithm is implemented as fminunc in the standard library of MATLAB R2017b.

Using the approach described above, it is possible to simulate experiments of optimizing QAOA with measurement projection noise for a few example instances, with various choices of precision parameters ($\epsilon, \xi, \delta$) and starting points. For the example representative instance studied in FIG. 19, $\epsilon = 0.1$, $\xi = 0.05$, and $\delta = 0.01$. Each run of the simulated experiment begins with QAOA of level either p=1 or p=5 and continues with optimizing increasing levels of QAOA using embodiments of the disclosed FOURIER [∞, 0] heuristic strategy. The starting point of QAOA optimization can either be randomly selected (when starting at p=1) or chosen based on an educated guess using optimal parameters from small-sized instances (at p=1 and p=5). Specifically, the starting points obtained from educated guesses for the example studied in FIG. 19 are ($\vec{u}^0$, $\vec{v}^0$)=(1.4849,0.5409) at level p=1, and $$\vec{u}^0 = (1.9212, 0.2891, 0.1601, 0.0564, 0.0292)$$

Equation 83:

$$\vec{v}^0 = (0.6055, -0.0178, 0.0431, -0.0061, 0.0141)$$

Equation 84:

at level p=5. For each such run, the history of all the measurements can be tracked so that the largest cut $\text{Cut}_i$ found after the i-th measurement can be calculated. Each experiment is repeated 500 times with different pseudo-random number generation seeds, and an average over their histories is taken.

Techniques to Speed Up Numerical Simulation

In some embodiments, a number of techniques can be exploited to speed up the numerical simulation for both QAOA and QA.

For example, first, the symmetries present in the Hamiltonian can be used. For MaxCut on general graphs, the only symmetry operator that commutes with both $H_C$ and $H_B$ is the parity operator $$P = \prod_{i=1}^{N} \sigma_i^x; [H_C, P] = [H_B, P] = 0,$$

and so does $[H_{QA}(s), P]=0$, where $H_{QA}(s)$ is the quantum annealing Hamiltonian equation 69. The parity operator can have two eigenvalues, +1 and −1, each with half of the entire Hilbert space. The initial state for both QAOA and QA are in the positive sector, i.e., $P|+\rangle^{\otimes N} = |+\rangle^{\otimes N}$. Thus, any dynamics must remain in the positive parity sector. $H_C$ and $H_B$ can be rewritten in the basis of the eigenvectors of P, and the Hilbert space reduced from $2^N$ to $2^{N-1}$ by working in the positive parity sector.

For QA, dynamics involving the time-dependent Hamiltonian can be simulated by dividing the total simulation time T into sufficiently small discrete time T and implementing each time step sequentially. At each small step, it is possible to evolve the state without forming the full evolution operator, either using the Krylov subspace projection method or a truncated Taylor series approximation. In the simulations discussed herein, a scaling and squaring method is used with a truncated Taylor series approximation as it appears to run slightly faster than the Krylov subspace method for small time steps.

For QAOA, the dynamics can be implemented in a more efficient way due to the special form of the operators $H_C$ and $H_B$, in some embodiments. Work can be performed in the standard $\sigma_z$ basis. Thus, $$H_C = \sum_{(i,j)} \frac{w_{ij}}{2}(1 - \sigma_i^z \sigma_j^z)$$

can be written as a diagonal matrix and the action of $e^{-i\gamma H_C}$ can be implemented as vector operations. For $H_B$, the time evolution operator can be simplified as $$e^{-i\beta H_B} = \prod_{j=1}^{N} e^{-i\beta \sigma_j^x} = \prod_{j=1}^{N}(1\cos\beta - i\sigma_j^x \sin\beta) \quad \text{Equation 85}$$

Therefore, the action of $e^{-i\beta H_B}$ can also be implemented as N sequential vector operations without explicitly forming the sparse matrix $H_B$, which both improves simulation speed and saves memory. In addition, in the optimization of variational parameters, the gradient can be calculated analytically, instead of using finite-difference methods. Techniques similar to the gradient ascent pulse engineering (GRAPE) method are also used, which reduces the cost of computing the gradient from $O(p^2)$ to $O(p)$, for a p-level QAOA. Lastly, in example simulations of embodiments of the disclosed FOURIER strategy, the gradient of the objective function can be calculated with respect to the new parameters $(\vec{u}, \vec{v})$. Since $\vec{\gamma} = A_S \vec{u}$ and $\vec{\beta} = A_C \vec{v}$ and for some matrices $A_S$ and $A_C$, their gradients can also be related via $\nabla_{\vec{u}} = A_S \nabla_{\vec{\gamma}}$ and $\nabla_{\vec{v}} = A_S \nabla_{\vec{\beta}}$.

QAOA for MIS

This section discusses exemplary techniques to simulate the Quantum Approximate Optimization Algorithm to solve Maximum Independent Set Problems, according to some embodiments.

Quantum Approximate Optimization Algorithm

Without being bound by theory, in some embodiments, given a problem to find MIS on a given a graph G=(V, E), the p-level QAOA for MIS can be a variational algorithm consisting of the following steps:

(i) Initialization of the quantum state in $|\psi_0\rangle = |0\rangle^{\otimes N}$.
(ii) Preparation of variational wavefunction:

$$|\psi_p(\vec{\gamma}, \vec{\beta})\rangle = \exp(-i\beta_p H_Q) \prod_{k=1}^{p-1} \exp(-i\gamma_k H_P)\exp(-i\beta_k H_Q)|\psi_0\rangle, \quad \text{Equation 86}$$

where $H_P = \sum_{v \in V} -\Delta n_v + \sum_{(v,w) \in E} U n_v n_w$, and $H_Q = \sum_{v \in V} \Omega \sigma_v^x + \sum_{(v,w) \in E} U n_v n_w$. The parameters $\vec{\gamma} \in \mathbb{R}^{p-1}$ and $\vec{\beta} \in \mathbb{R}^p$ specify the variational state.

(iii) Measurement of $H_P$.

The three steps (i)-(iii) can be iterated and combined with a classical optimization of the variational parameters in order to minimize $\langle \psi_p(\vec{\gamma}, \vec{\beta})|H_P|\psi_p(\vec{\gamma}, \vec{\beta})\rangle$.

Alternative Formulation

In some embodiments, where $U \gg |\Omega|, |\Delta|$, the variational search can be restricted to the subspace $\mathcal{H}_{IS}$ spanned by independent sets, such that the algorithm does not need to explore states that can be directly excluded as MIS candidates. In this limit, it is possible to write:

$$H_Q = \sum_v P_{IS} \Omega \sigma_x P_{IS}, \quad \text{Equation 87}$$

$$H_P = \sum_{v \in V} -\Delta n_v, \quad \text{Equation 88}$$

where $P_{IS}$ is a projector onto the independent set subspace $\mathcal{H}_{IS}$. Evolution with $H_P$ can reduce to simple rotation of individual spins around the z axis. Since $$\exp(-i\gamma H_P)\exp(-i\beta H_Q) = \exp\left(-i\beta\Omega\sum_v P_{IS}|0\rangle_v\langle 1|e^{-i\gamma\Delta} + h.c.\right) P_{IS} \exp(-i\gamma H_P), \quad \text{Equation 89}$$

it is possible to commute all the unitaries generated by $H_P$ in Equation 86 to the rightmost side until they act (trivially) on the initial state. Thus, it is possible to rewrite the state $|\psi_p(\vec{\gamma}, \vec{\beta})\rangle$ as $$|\psi_p(\vec{\gamma}, \vec{\beta})\rangle = \prod_{k=1}^{p} \exp\left(-it_k \Omega \sum_v P_{IS}|0\rangle_v\langle 1|e^{-i\phi_k} + h.c.\right) P_{IS}|\psi_0\rangle, \quad \text{Equation 90}$$

where the following can be identified $$\phi_k = \sum_{j \geq k} \gamma_j \Delta, \quad \text{Equation 91}$$

$$t_k = \beta_k \quad \text{Equation 92}$$

Thus, some embodiments of the formulation of QAOA given above can be equivalent to equation 90 for $U \gg 2$.

Aspects of the present disclosure show that quantum algorithms can be implemented for solving computationally hard problems with coherent quantum optimizers with minimal resources and implementation overhead, which can include, but is not limited to the number of ancillary qubits needed, additional depth of the quantum circuits needed, etc.

Aspects of the present disclosure show that NP-complete combinatorial optimization problems can be encoded exactly in quantum systems even considering the unwanted interactions between the qubits.

Aspects of the present disclosure show that quantum algorithms can be implemented by applying light pulses with a variable duration and a variable optical phase to at least some of the plurality of qubits.

Aspects of the present disclosure show that heuristic optimization strategies can find quasi-optimal variational parameters in variational quantum algorithms in $O(\text{poly}(p))$ time without the $2^{O(p)}$ resources required by brute force approaches using many initial guesses of the parameters.

Aspects of the present disclosure show that quantum approximate optimization algorithms utilize non-adiabatic mechanisms to overcome the challenges associated with vanishing spectral gaps.

Aspects of the present disclosure show that vertex renumbering of the combinatorial optimization problem permits quantum systems to implement a broader class of problem instances.

The invention claimed is:

1. A method comprising:
selectively arranging a plurality of qubits into a spatial structure to encode a quantum computing problem, wherein each qubit corresponds to a vertex in the quantum computing problem, and wherein spatial proximity of the qubits represents edges in the quantum computing problem;
initializing the plurality of qubits into an initial state;
driving the plurality of qubits into a final state by applying a sequence of resonant light pulses with a variable duration and a variable optical phase to at least some of the plurality of qubits, wherein the final state comprises a solution to the quantum computing problem; and
measuring at least some of the plurality of qubits in the final state.

2. The method of claim 1, wherein the spatial structure comprises a one-dimensional, two-dimensional or three-dimensional array of qubits.

3. The method of claim 1, wherein the encoded quantum computing problem comprises one or more of an unweighted maximum independent set problem, a maximum-weight independent set problem, a maximum clique problem, and a minimum vertex cover problem.

4. The method of claim 3, wherein weights in the maximum-weight independent set problem are encoded by applying light shifts to at least some of the plurality of qubits.

5. The method of claim 3, wherein the final state of the plurality of qubits comprises one or more of a solution to the encoded unweighted maximum independent set problem, a solution to the encoded maximum-weight independent set problem, a solution to the encoded maximum clique problem, and a solution to the encoded minimum vertex cover problem.

6. The method of claim 1, wherein the solution to the quantum computing problem comprises an approximate solution to the quantum computing problem.

7. A method comprising:
selectively arranging a plurality of qubits into a spatial structure comprising a plurality of vertex qubits and a plurality of ancillary qubits to encode a quantum computing problem using spatial proximity of the plurality of qubits, wherein each vertex qubit corresponds to a vertex in the quantum computing problem and wherein subsets of the ancillary qubits correspond to edges in the quantum computing problem;
initializing the plurality of qubits into an initial state;
driving the plurality of qubits into a final state by applying light pulses with a constant or variable Rabi frequency $\Omega$ and a constant or variable detuning $\Delta$ to at least some of the plurality of qubits, wherein the final state comprises a solution to the quantum computing problem; and
measuring at least some of the plurality of qubits in the final state.

8. The method of claim 7, wherein the applying light pulses to the at least some of the plurality of qubits further comprises:
applying at least one light pulse with a detuning $\Delta_0$ to a vertex qubit comprising a corner vertex or a junction vertex; and
applying at least one light pulse with a detuning $\Delta_i$ to each of i ancillary qubits adjacent to the vertex qubit on an edge connected to the vertex qubit.

9. The method of claim 8, wherein the applying the light pulses to the at least some of the plurality of qubits further comprises applying light shifts to selected qubits of the at least some of the plurality of qubits.

10. The quantum computing method of claim 7, wherein the driving the plurality of qubits into the final state comprises applying a sequence of resonant light pulses with a variable duration and a variable optical phase to at least some of the plurality of qubits.

11. The method of claim 7, wherein the arranging the plurality of qubits into the plurality of vertex qubits and the plurality of ancillary qubits comprises arranging the plurality of qubits onto a grid.

12. The method of claim 7, wherein the encoded quantum computing problem comprises one or more of an unweighted maximum independent set problem, a maximum-weight independent set problem, a maximum clique problem, and a minimum vertex cover problem.

13. The method of claim 12, wherein weights in the maximum-weight independent set problem are encoded by applying light shifts to the plurality of qubits.

14. The method of claim 12, wherein the final state of the plurality of qubits comprises one or more of a solution to the encoded unweighted maximum independent set problem, a solution to the encoded maximum-weight independent set problem, a solution to the encoded maximum clique problem, and a solution to the encoded minimum vertex cover problem.

15. The method of claim 7, further comprising renumbering at least two vertices in the quantum computing problem prior to the encoding the quantum computing problem.

16. The method of claim 7, wherein the solution to the quantum computing problem comprises an approximate solution to the quantum computing problem.

17. A method comprising:
selectively arranging a plurality of qubits into a spatial structure to encode a quantum computing problem, wherein each qubit corresponds to a vertex in the quantum computing problem;
initializing the plurality of qubits into an initial state;
stroboscopically driving the plurality of qubits into a final state by applying light pulses sequentially and selectively in an order to subsets of the plurality of qubits, the order of light pulses corresponding to the graph structure of the quantum computing problem, wherein the final state comprises a solution to the quantum computing problem; and
measuring at least some of the plurality of qubits in the final state.

18. The method of claim 17, wherein the stroboscopically driving the plurality of qubits into the final state comprises applying light pulses with a constant or variable Rabi frequency $\Omega$ and a constant or variable detuning $\Delta$ to at least some of the plurality of qubits.

19. The method of claim 17, wherein the stroboscopically driving the plurality of qubits into the final state comprises applying a sequence of resonant light pulses with a variable duration and a variable optical phase to at least some of the plurality of qubits.

20. The method of claim 17, wherein the encoded quantum computing problem comprises one or more of an unweighted maximum independent set problem, a maximum-weight independent set problem, a maximum clique problem, and a minimum vertex cover problem.

21. The method of claim 20, wherein weights in the maximum-weight independent set problem are encoded by applying light shifts to the plurality of qubits.

22. The method of claim 20, wherein the final state of the plurality of qubits comprises one or more of a solution to the encoded unweighted maximum independent set problem, a solution to the encoded maximum-weight independent set problem, a solution to the encoded maximum clique problem, and a solution to the encoded minimum vertex cover.

23. The method of claim 17, further comprising renumbering at least two vertices in the quantum computing problem prior to the encoding the quantum computing problem.

24. The method of claim 17, wherein the solution to the quantum computing problem comprises an approximate solution to the quantum computing problem.

* * * * *